United States Patent
Lee et al.

(10) Patent No.: US 11,545,980 B1
(45) Date of Patent: Jan. 3, 2023

(54) CLOCK AND DATA RECOVERY FOR MULTI-PHASE, MULTI-LEVEL ENCODING

(71) Applicant: QUALCOMM Incorporated, San Diego, CA (US)

(72) Inventors: Chulkyu Lee, San Diego, CA (US); Jeffrey Charles Lee, Cary, NC (US); George Alan Wiley, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/469,811

(22) Filed: Sep. 8, 2021

(51) Int. Cl.
*H03L 7/00* (2006.01)
*H03L 7/08* (2006.01)
*H03K 3/037* (2006.01)
*H03L 7/081* (2006.01)

(52) U.S. Cl.
CPC ........... *H03L 7/0807* (2013.01); *H03K 3/037* (2013.01); *H03L 7/0814* (2013.01); *H03L 7/0818* (2013.01)

(58) Field of Classification Search
CPC ... H04L 25/14; H04L 25/4923; H04L 25/493; H04L 69/28; H04L 7/0004; H04L 7/0012; H04L 7/0037; H04L 7/0337; H03L 7/0807; H03L 7/0814; H03L 7/0818; H03K 3/037
See application file for complete search history.

(56) References Cited

U.S. PATENT DOCUMENTS

| | | | |
|---|---|---|---|
| 9,496,879 B1 | 11/2016 | Duan et al. | |
| 9,553,635 B1* | 1/2017 | Sejpal | H04B 3/54 |
| 9,735,950 B1* | 8/2017 | Liu | G06F 13/40 |
| 10,033,519 B2 | 7/2018 | Duan et al. | |
| 10,270,454 B2 | 4/2019 | Shih | |
| 10,425,219 B2 | 9/2019 | Lim | |
| 2021/0058280 A1 | 2/2021 | Lee et al. | |

\* cited by examiner

Primary Examiner — David S Huang
(74) Attorney, Agent, or Firm — Loza & Loza, LLP

(57) ABSTRACT

An apparatus has a plurality of multi-level comparison circuits, each coupled to a pair of wires in a three-wire communication link, a plurality of first-level clock recovery circuits and a second-level clock recovery circuit. Each multi-level comparison circuit provides a multibit signal as an output. Each first-level clock recovery circuit includes a plurality of first-level flipflops clocked by transitions in a multibit signal received from one multi-level comparison circuit of the plurality of multi-level comparison circuits, and a first delay circuit that delays an output of the each first-level clock recovery circuit to provide a first reset signal that resets the each first-level clock recovery circuit. The second-level clock recovery circuit includes a second-level flipflop clocked by transitions in the outputs of the plurality of first-level clock recovery circuits, and a second delay circuit that delays an output of the second-level clock recovery circuit to provide a second reset signal to the second-level flipflop.

30 Claims, 32 Drawing Sheets

| 3-Phase + PAM-4 Symbols | | | |
|---|---|---|---|
| Wire / Symbol | A (802a) | B (802b) | C (802c) |
| S1 | 3I | 0 | -3I |
| S2 | -3I | 0 | 3I |
| S3 | 0 | 3I | -3I |
| S4 | 0 | -3I | 3I |
| S5 | 3I | -3I | 0 |
| S6 | -3I | 3I | 0 |
| S7 | 3I | -I | -2I |
| S8 | -I | -2I | 3I |
| S9 | -2I | 3I | -I |
| S10 | -I | -2I | 3I |
| S11 | -2I | -I | 3I |
| S12 | 3I | -2I | -I |
| S13 | -3I | I | 2I |
| S14 | 2I | -3I | I |
| S15 | I | 2I | -3I |
| S16 | 2I | I | -3I |
| S17 | I | 2I | -3I |
| S18 | 2I | I | -3I |

FIG. 13

3-Phase + PAM-4 Symbols

| Wire / Symbol | A (802a) | B (802b) | C (802c) | Sum A+B+C |
|---|---|---|---|---|
| S1 | 3I | 0 | -3I | 0 |
| S2 | -3I | 0 | 3I | 0 |
| S3 | 0 | 3I | -3I | 0 |
| S4 | 0 | -3I | 3I | 0 |
| S5 | 3I | -3I | 0 | 0 |
| S6 | -3I | 3I | 0 | 0 |
| S7 | 3I | -I | -2I | 0 |
| S8 | 3I | -2I | -I | 0 |
| S9 | -I | 3I | -2I | 0 |
| S10 | -I | -2I | 3I | 0 |
| S11 | -2I | -I | 3I | 0 |
| S12 | -2I | 3I | -I | 0 |
| S13 | -3I | I | 2I | 0 |
| S14 | -3I | 2I | I | 0 |
| S15 | I | -3I | 2I | 0 |
| S16 | 2I | -3I | I | 0 |
| S17 | I | 2I | -3I | 0 |
| S18 | 2I | I | -3I | 0 |

Group I (1302): S1–S6
Group II (1304): S7–S18

1300

3000

```
Configuring a Multiphase and
PAM Clock Recovery Circuit
```

— 3002
Couple each of a plurality of multi-level comparison circuits to a pair of wires in a three-wire communication link — 3004
Configure a plurality of first-level flipflops in each of a plurality of first-level clock recovery circuits to be clocked by transitions in a multibit signal received from one of the plurality of multi-level comparison circuits — 3006
Configure a first delay circuit in each first-level clock recovery circuit to provide a first reset signal that resets the each first-level clock recovery circuit — 3008
Configure a second-level flipflop in a second-level clock recovery circuit to be clocked by transitions in outputs of the plurality of first-level clock recovery circuits — 3010
Configure a second delay circuit in the second-level clock recovery to delay an output of the second-level clock recovery circuit that provides a second reset signal to the second-level flipflop

*FIG. 30*

CLOCK AND DATA RECOVERY FOR MULTI-PHASE, MULTI-LEVEL ENCODING

TECHNICAL FIELD

The present disclosure relates generally to high-speed data communication interfaces, and more particularly, to improving data throughput over a multi-wire, multi-phase data communication link.

BACKGROUND

Manufacturers of mobile devices, such as cellular phones, may obtain components of the mobile devices from various sources, including different manufacturers. For example, an application processor in a cellular phone may be obtained from a first manufacturer, while an imaging device or camera may be obtained from a second manufacturer and a display controller may be obtained from a third manufacturer. The application processor, the imaging device, the display controller, or other types of device may be interconnected using a standards-based or proprietary physical interface. In one example, an imaging device may be connected using the Camera Serial Interface (CSI) defined by the Mobile Industry Processor Interface (MIPI) Alliance. In another example, a display controller may include an interface that conforms to the Display Serial Interface (DSI) standard specified by the Mobile Industry Processor Interface (MIPI) Alliance.

A multiphase three-wire (C-PHY) interface defined by the MIPI Alliance uses a trio of conductors to transmit information between devices. Each of the three wires may be in one of three signaling states during transmission of a symbol over the C-PHY interface. Clock information is encoded in a sequence of symbols transmitted on the C-PHY interface and a receiver generates a clock signal from transitions between consecutive symbols. The maximum speed of the C-PHY interface and the ability of a clock and data recovery (CDR) circuit to recover clock information may be limited by the maximum time variation related to transitions of signals transmitted on the different wires of the communication link, which can limit the data throughput provided by the C-PHY interface as demand for increased data throughput continue to increase.

SUMMARY

Certain aspects of this disclosure relate to systems, methods and apparatus that enable improved communication on a multi-wire and/or multiphase communication link through improved clock recovery and generation techniques. In some aspects, data throughput is improved by minimizing the masking delays used to prevent adverse effects from multiple transitions at a single boundary between two symbols transmitted over a three-wire link that carries symbols encoded using a combination of 3-phase encoding and pulse amplitude modulation (PAM). The communication link may be deployed in apparatus such as a mobile terminal having multiple Integrated Circuit (IC) devices.

In one aspect of the disclosure, a data communication apparatus has a plurality of multi-level comparison circuits, each multi-level comparison circuit being coupled to a pair of wires in a three-wire communication link, a plurality of first-level clock recovery circuits, each first-level clock recovery circuit including a plurality of first-level flipflops that are clocked by transitions in a multibit signal received from one multi-level comparison circuit of the plurality of multi-level comparison circuits and a first delay circuit that delays an output of the each first-level clock recovery circuit to provide a first reset signal that resets the each first-level clock recovery circuit, and a second-level clock recovery circuit that includes a second-level flipflop clocked by transitions in the outputs of the plurality of first-level clock recovery circuits and a second delay circuit that delays an output of the second-level clock recovery circuit to provide a second reset signal to the second-level flipflop.

In one aspect of the disclosure, a data communication apparatus includes means for comparing signaling state of pairs of wires in a three-wire communication link including a plurality of multi-level comparison circuits configured to provide multibit signals as outputs, means for recovering a first level clock signal from the three-wire communication link, including a plurality of first-level flipflops, each first-level flipflop being clocked by transitions in a multibit signal received from one multi-level comparison circuit of the plurality of multi-level comparison circuits, and further including a first delay circuit in each of a plurality of first-level clock recovery circuits configured to provide a first reset signal that resets the each first-level clock recovery circuit, and means for recovering a second-level level clock signal including a second-level clock recovery circuit that includes a second-level flipflop clocked by transitions in outputs provided by the plurality of first-level clock recovery circuits, and that further includes a second delay circuit configured to delay an output of the second-level clock recovery circuit that is provided as a second reset signal to the second-level flipflop.

In one aspect of the disclosure, a method for configuring a clock recovery circuit includes coupling each multi-level comparison circuit in a plurality of multi-level comparison circuits to a pair of wires in a three-wire communication link, configuring a plurality of first-level flipflops in each of a plurality of first-level clock recovery circuits to be clocked by transitions in a multibit signal received from one multi-level comparison circuit of the plurality of multi-level comparison circuits, configuring a first delay circuit in each first-level clock recovery circuit to provide a first reset signal that resets the each first-level clock recovery circuit, configuring a second-level flipflop in a second-level clock recovery circuit to be clocked by transitions in outputs of the plurality of first-level clock recovery circuits, and configuring a second delay circuit in the second-level clock recovery to delay an output of the second-level clock recovery circuit that provides a second reset signal to the second-level flipflop.

In one aspect of the disclosure, a non-transitory processor-readable medium storing computer-executable code is disclosed. The processor-readable medium maintains data and instructions configured to cause a computer to couple each multi-level comparison circuit in a plurality of multi-level comparison circuits to a pair of wires in a three-wire communication link, configure a plurality of first-level flipflops in each of a plurality of first-level clock recovery circuits to be clocked by transitions in a multibit signal received from one multi-level comparison circuit of the plurality of multi-level comparison circuits, configure a first delay circuit in each first-level clock recovery circuit to provide a first reset signal that resets the each first-level clock recovery circuit, configure a second-level flipflop in a second-level clock recovery circuit to be clocked by transitions in outputs of the plurality of first-level clock recovery circuits, and configure a second delay circuit in the second-level clock recovery to delay an output of the second-level clock recovery circuit that provides a second reset signal to the second-level flipflop In some aspects, the data communication apparatus includes a data recovery circuit that has a first plurality of multibit registers. Each multibit register in the first plurality of multibit registers may receive an associated multibit signal output by one of the plurality of multi-level comparison circuits and may be clocked by an output of a corresponding first-level clock recovery circuit that also receives the associated multibit signal. Each of the plurality of multibit registers may have three flipflops that are clocked by the output of the corresponding first-level clock recovery circuit. The data recovery circuit may further include a plurality of first delay elements, each first delay element configured to couple outputs of the first-level clock recovery circuit to the first plurality of multibit registers. The data recovery circuit may further include a second plurality of multibit registers. Each multibit register in the second plurality of multibit registers may receive, as an input, an output of one of the first plurality of multibit registers. The data recovery circuit may further include a second delay element configured to couple the output of the second-level clock recovery circuit to each of the second plurality of multibit registers. Each multibit register in the first plurality of multibit registers may be clocked by an output of one of the plurality of first-level flipflops in the corresponding first-level clock recovery circuit.

In some aspects, the first reset signal is coupled to a reset input of each of the plurality of first-level flipflops.

In some aspects, each first-level clock recovery circuit further includes an output flipflop that is clocked by transitions in one or more outputs of the plurality of first-level flipflops in the each first-level clock recovery circuit. The first reset signal may be coupled to a reset input of the output flipflop. Each of the plurality of first-level flipflops in the each first-level clock recovery circuit may be reset by its own output.

In some aspects, the first delay circuit is configured with a delay duration that corresponds to a maximum expected time difference between a first-occurring transition and a last-occurring transition in the multibit signal.

In some aspects, the second delay circuit is configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

BRIEF DESCRIPTION OF THE DRAWINGS

FIGS. 11-13 illustrate an example of an encoding scheme in which 3-phase encoding is combined with PAM-4 modulation in accordance with certain aspects of this disclosure.

FIG. 30 is a flow chart of a method for configuring a clock recovery circuit according to certain aspects disclosed herein.

DETAILED DESCRIPTION

Figure 1:
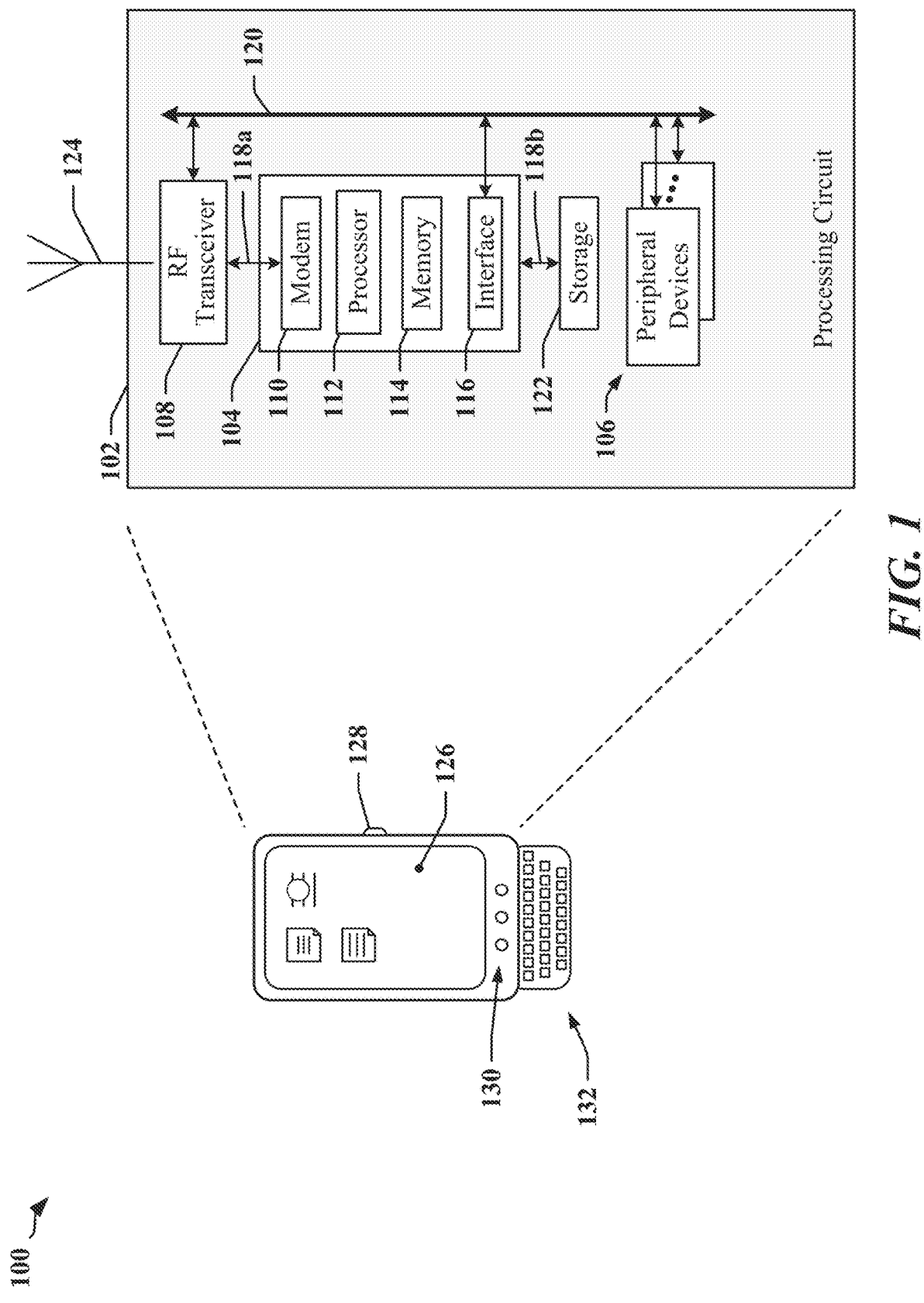
FIG. 1 depicts an apparatus employing a data link between IC devices.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various processor-readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Overview

Certain aspects of the invention may be applicable to improving a C-PHY interface specified by the MIPI Alliance, which is often deployed to connect electronic devices that are subcomponents of a mobile apparatus such as a telephone, a mobile computing device, an appliance, automobile electronics, avionics systems, etc. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, a wearable computing device (e.g., a smartwatch, a health or fitness tracker, etc.), a drone, a sensor, a vending machine, or any other similarly functioning device.

Certain aspects disclosed herein enable devices to communicate at higher data rates over a three-wire communication link than possible using conventional C-PHY symbol rates. In various aspects of the disclosure, a data communication apparatus has a plurality of line drivers configured to couple the apparatus to a 3-wire link, and a data encoder configured to encode at least 3 bits of binary data in each transition between two symbols that are consecutively transmitted by the plurality of line drivers over the 3-wire link such that each pair of consecutively-transmitted symbols includes two different symbols. Each symbol defines signaling states of the 3-wire link during an associated symbol transmission interval such that each wire of the 3-wire link is in a different signaling state from the other wires of the 3-wire link during the associated symbol transmission interval. Data may be encoded using a combination of 3-phase and PAM. The apparatus may include a wire state encoder configured to receive a sequence of symbols from the data encoder, and provide control signals to the plurality of line drivers. The control signals cause each of the plurality of line drivers to drive one wire of the 3-wire link to a signaling state defined by each symbol during a symbol transmission interval provided for each symbol in the sequence of symbols. The wire state encoder may be configured or configurable for PAM-2, PAM-3, PAM-4, PAM-8 and other PAM implementations.

The C-PHY interface is a high-speed serial interface that can provide high data throughput over bandwidth-limited channels. The C-PHY interface may be deployed to connect application processors to peripherals, including display controllers and cameras. The C-PHY interface encodes data into symbols that are transmitted in a three-phase signal over a set of three wires, which may be referred to as a trio of wires, or simply as a trio. The three-phase signal is transmitted in a different phase on each wire of the trio. Each trio provides a lane on a communication link. A symbol interval may be defined as the interval of time in which a single symbol controls the signaling state of a trio. During each symbol interval in a conventional C-PHY interface, one wire is "undriven" or driven to a mid-level voltage state while the remaining two of the three wires are differentially driven such that one of the two differentially driven wires assumes a first voltage level and the other differentially driven wire assumes to a second voltage level different from the first voltage level. In some implementations, the third wire is undriven or floating such that it assumes a third voltage level that is at or near the mid-level voltage between the first and second voltage levels due to the action of terminations. In some implementations, the third wire is driven toward the mid-level voltage. In one example, the driven voltage levels may be +V and −V with the undriven voltage being 0. In another example, the driven voltage levels may be +V and 0 with the undriven voltage being +V/2. Different symbols are transmitted in each consecutively transmitted pair of symbols, and different pairs of wires may be differentially driven in different symbol intervals. In C-PHY interfaces, clock information is encoded in the transitions of signaling state at symbol boundaries between consecutive symbol intervals.

In order to increase throughput of the C-PHY interface, enhanced encoding schemes combine pulse amplitude modulation (PAM) with 3-phase polarity encoding to increase the number of signaling states, increase the number of available symbols, and the number of bits that can be encoded in each transition between symbol intervals. Conventional C-PHY effectively uses PAM-2 modulation on the differentially driven wires to provide a total of 3 voltage levels or current levels and 6 signaling states. PAM-3 modulation provides 5 voltage levels or current levels and 12 signaling states, PAM-4 modulation provides 7 voltage levels or current levels and 18 signaling states, and PAM-8 modulation provides 15 voltage levels or current levels and 42 signaling states. The transition period during which a 3-wire interface changes state at a symbol boundary may have a significantly longer duration in a PAM modulated C-PHY interface than in a conventional C-PHY interface. The increase in duration of the transition period is caused by the increased number of signaling states and the use of signaling states defined at more than three voltage levels. Conventional clock and data recovery (CDR) circuits may be unusable for C-PHY encoding schemes with PAM-4 or greater modulation due to the increase in transition periods and consequent decrease in available time for sampling and capturing symbols from the 3-wire bus.

FIG. 1 depicts an example of apparatus 100 that may employ C-PHY 3-phase protocols to implement one or more communication links. The apparatus 100 may include a system on Chip (SoC), or a processing circuit 102 that has multiple circuits or devices 104, 106 and/or 108, which may be implemented in one or more ASICs. In one example, the apparatus 100 may operate as a communication device and the processing circuit 102 may include a processing device provided in an ASIC 104, one or more peripheral devices 106, and a transceiver 108 that enables the apparatus to communicate through an antenna 124 with a radio access network, a core access network, the Internet and/or another network.

The ASIC 104 may have one or more processors 112, one or more modems 110, on-board memory 114, a bus interface circuit 116 and/or other logic circuits or functions. The processing circuit 102 may be controlled by an operating system that may provide an application programming interface (API) layer that enables the one or more processors 112 to execute software modules residing in the on-board memory 114 or other processor-readable storage 122 provided on the processing circuit 102. The software modules may include instructions and data stored in the on-board memory 114 or processor-readable storage 122. The ASIC 104 may access its on-board memory 114, the processor-readable storage 122, and/or storage external to the processing circuit 102. The on-board memory 114, the processor-readable storage 122 may include read-only memory (ROM) or random-access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as the antenna 124, a display 126, operator controls, such as switches or buttons 128, 130 or external keypad 132, among other components. A user interface module may be configured to operate with the display 126, external keypad 132, etc. through a dedicated communication link or through one or more serial data interconnects.

The processing circuit 102 may provide one or more buses 118a, 118b, 120 that enable certain devices 104, 106, and/or 108 to communicate. In one example, the ASIC 104 may include a bus interface circuit 116 that includes a combination of circuits, counters, timers, control logic and other configurable circuits or modules. In one example, the bus interface circuit 116 may be configured to operate in accordance with communication specifications or protocols. The processing circuit 102 may include or control a power management function that configures and manages the operation of the apparatus 100.

Figure 2:
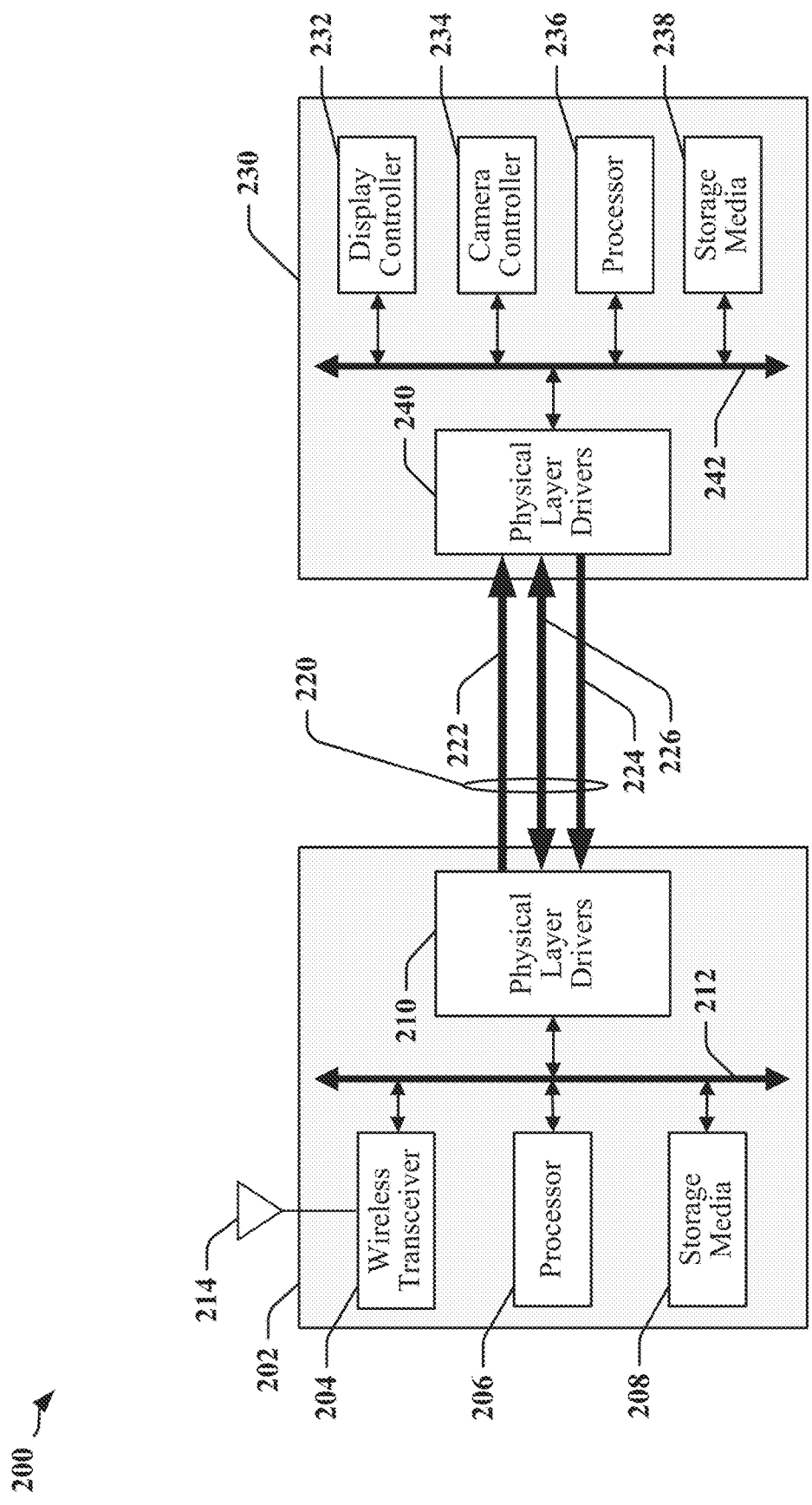
FIG. 2 illustrates a system architecture for an apparatus employing a data link between IC devices that selectively operates according to one of a plurality of available standards.

FIG. 2 illustrates certain aspects of an apparatus 200 that includes IC devices 202 and 230 that can exchange data and control information through a communication link 220. The communication link 220 may be used to connect a pair of IC devices 202 and 230 that are located in close proximity to one another, or that are physically located in different parts of the apparatus 200. In one example, the communication link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. In another example, a portion of the communication link 220 may include a cable or optical connection.

The communication link 220 may include multiple channels 222, 224 and 226. One or more channel 226 may be bidirectional, and may operate in half-duplex and/or full-duplex modes. One or more channel 222 and 224 may be unidirectional. The communication link 220 may be asymmetrical, providing higher bandwidth in one direction. In one example described herein, a first channel 222 may be referred to as a forward channel 222 while a second channel 224 may be referred to as a reverse channel 224. The first IC device 202 may be designated as a host system or transmitter, while the second IC device 230 may be designated as a client system or receiver, even if both IC devices 202 and 230 are configured to transmit and receive on the channel 222. In one example, the forward channel 222 may operate at a higher data rate when communicating data from a first IC device 202 to a second IC device 230, while the reverse channel 224 may operate at a lower data rate when communicating data from the second IC device 230 to the first IC device 202.

Each of the IC devices 202 and 230 may each include a processor 206, 236 or other processing circuit, computing circuit or device. In one example, the first IC device 202 may perform core functions of the apparatus 200, including establishing and maintaining wireless communication through a wireless transceiver 204 and an antenna 214, while the second IC device 230 may support a user interface that manages or operates a display controller 232, and may control operations of a camera or video input device using a camera controller 234. Other features supported by one or more of the IC devices 202 and 230 may include a keyboard controller, a voice-recognition component, and other input or output devices. The display controller 232 may include circuits and software drivers that support displays such as a liquid crystal display (LCD) panel, touch-screen display, indicators and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more internal bus 212 and 242 and/or a channel 222, 224 and/or 226 of the communication link 220.

The reverse channel 224 may be operated in the same manner as the forward channel 222. The forward channel 222 and the reverse channel 224 may be capable of transmitting at comparable speeds or at different speeds, where speed may be expressed as data transfer rate and/or clocking rates. The forward and reverse data rates may be substantially the same or may differ by orders of magnitude, depending on the application. In some applications, a single bidirectional channel 226 may support communication between the first IC device 202 and the second IC device 230. The forward channel 222 and/or the reverse channel 224 may be configurable to operate in a bidirectional mode when, for example, the forward and reverse channels 222 and 224 share the same physical connections and operate in a half-duplex manner. In one example, the communication link 220 may be operated to communicate control, command and other information between the first IC device 202 and the second IC device 230 in accordance with an industry or other standard.

The communication link 220 of FIG. 2 may be implemented according to MIPI Alliance specifications for C-PHY and may provide a wired bus that includes a plurality of signal wires, where the number of the signal wires may be denoted as M wires. The M wires may be configured to carry N-phase encoded data in a high-speed digital interface, such as a mobile display digital interface (MDDI). The M wires may facilitate N-phase polarity encoding on one or more of the channels 222, 224 and 226. The physical layer drivers 210 and 240 may be configured or adapted to generate N-phase polarity encoded data for transmission on the communication link 220. The use of N-phase polarity encoding provides high speed data transfer and may consume half or less of the power of other interfaces because fewer drivers are active in N-phase polarity encoded data links.

The physical layer drivers 210 and 240 can typically encode multiple bits per transition on the communication link 220 when configured for N-phase polarity encoding. In one example, a combination of PAM modulation with 3-phase, polarity encoding may be used to support a wide video graphics array (WVGA) 80 frames per second LCD driver IC without a frame buffer, delivering pixel data at 810 Mbps for display refresh.

Figure 3:
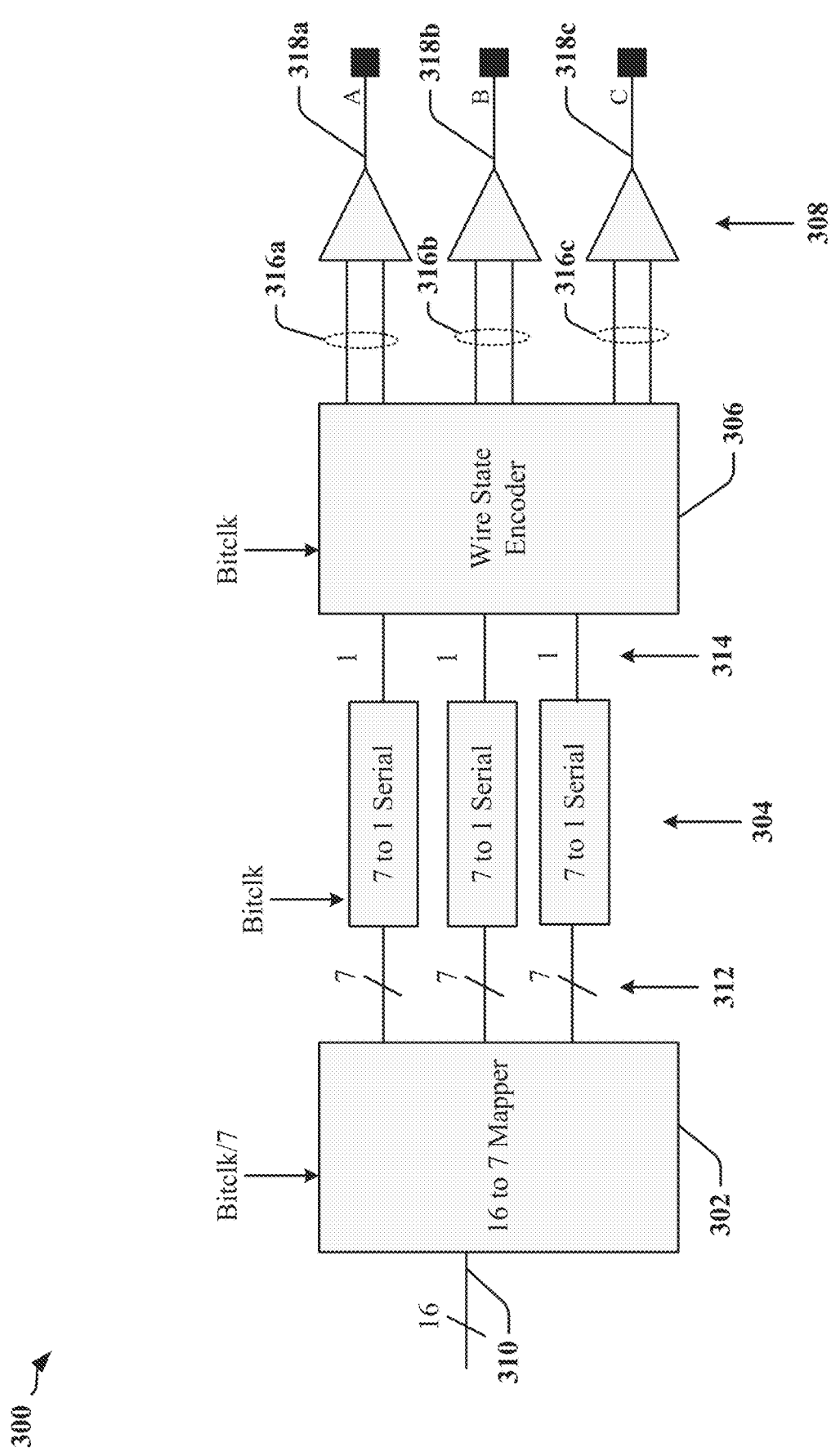
FIG. 3 illustrates a C-PHY 3-phase transmitter.

FIG. 3 is a diagram illustrating a C-PHY transmitter 300 that may be used to implement certain aspects of the communication link 220 depicted in FIG. 2. For the purposes of this description, the C-PHY transmitter 300 may be assumed to support 3-wire, 3-phase encoding. The example of 3-wire, 3-phase encoding is selected solely for the purpose of simplifying descriptions of certain aspects of the invention. The principles and techniques disclosed for 3-wire, 3-phase encoding may be applicable to other configurations of M-wire, N-phase polarity encoding.

Signaling states defined for each of the 3 wires in a 3-wire, 3-phase polarity encoding serial bus may include an undriven or mid-level state, a positively driven state and a negatively driven state. The positively driven state and the negatively driven state may be obtained by providing a voltage differential between two of the signal wires 318a, 318b and/or 318c, and/or by driving a current through two of the signal wires 318a, 318b and/or 318c connected in series such that the current flows in different directions in the two signal wires 318a, 318b and/or 318c. The undriven state may be realized by placing an output of a driver of a signal wire 318a, 318b or 318c in a high-impedance mode. In some instances, a mid-level state may be obtained on a signal wire 318a, 318b or 318c by passively or actively causing a signal wire 318a, 318b or 318c to attain a voltage level that lies substantially halfway between positive and negative voltage levels provided on driven signal wires 318a, 318b and/or 318c. Typically, there is no significant current flow through an undriven or mid-level signal wire 318a, 318b or 318c. Signaling states defined for a 3-wire, 3-phase polarity encoding scheme may be denoted using the three voltage or current states (+1, −1, and 0).

A C-PHY transmitter 300 may employ line drivers 308 to control the signaling state of signal wires 318a, 318b and 318c. The line drivers 308 may be implemented as unit-level current-mode or voltage-mode drivers. In one example, each line driver 308 may receive sets of two or more of signals 316a, 316b and 316c that determine the output state of corresponding signal wires 318a, 318b and 318c. In one example, the sets of two signals 316a, 316b and 316c may include a pull-up signal (PU signal) and a pull-down signal (PD signal) that, when high, activate pull-up and pull-down circuits that drive the signal wires 318a, 318b and 318c toward a higher level or lower level voltage, respectively. In this example, when both the PU signal and the PD signal are low, the signal wires 318a, 318b and 318c may be terminated to a mid-level voltage.

For each transmitted symbol interval in an M-wire, N-phase polarity encoding scheme, at least one signal wire 318a, 318b or 318c is in the midlevel/undriven (0) voltage or current state, while the number of positively driven (+1 voltage or current state) signal wires 318a, 318b or 318c is equal to the number of negatively driven (−1 voltage or current state) signal wires 318a, 318b or 318c, such that the sum of current flowing to the receiver is always zero. For each symbol, the signaling state of at least one signal wire 318a, 318b or 318c is changed from the wire state transmitted in the preceding transmission interval.

In operation, a mapper 302 may receive and map 16-bit data 310 to 7 symbols 312. In the 3-wire example, each of the 7 symbols 312 defines the states of the signal wires 318a, 318b and 318c for one symbol interval. The 7 symbols 312 may be serialized using parallel-to-serial converters 304 that provide a timed sequence of symbols 314 for each signal wire 318a, 318b and 318c. The sequence of symbols 314 is typically timed using a transmission clock. A 3-wire, 3-phase encoder 306 receives the sequence of 7 symbols 314 produced by the mapper one symbol at a time and computes the state of each signal wire 318a, 318b and 318c for each symbol interval. The 3-wire, 3-phase encoder 306 selects the states of the signal wires 318a, 318b and 318c based on the current input symbol 314 and the previous states of signal wires 318a, 318b and 318c.

The use of M-wire, N-phase encoding permits a number of bits to be encoded in a plurality of symbols where the bits per symbol is not an integer. In the example of a 3-wire communication link, there are 3 available combinations of 2 wires, which may be driven simultaneously, and 2 possible combinations of polarity on the pair of wires that is driven, yielding 6 possible states. Since each transition occurs from a current state, 5 of the 6 states are available at every transition. The state of at least one wire is required to change at each transition. With 5 states, $\log_2(5) \approx 2.32$ bits may be encoded per symbol. Accordingly, a mapper may accept a 16-bit word and convert it to 7 symbols because 7 symbols carrying 2.32 bits per symbol can encode 16.24 bits. In other words, a combination of seven symbols that encode five states has $5^7$ (78,125) permutations. Accordingly, the 7 symbols may be used to encode the $2^{16}$ (65,536) permutations of 16 bits.

Figure 4:
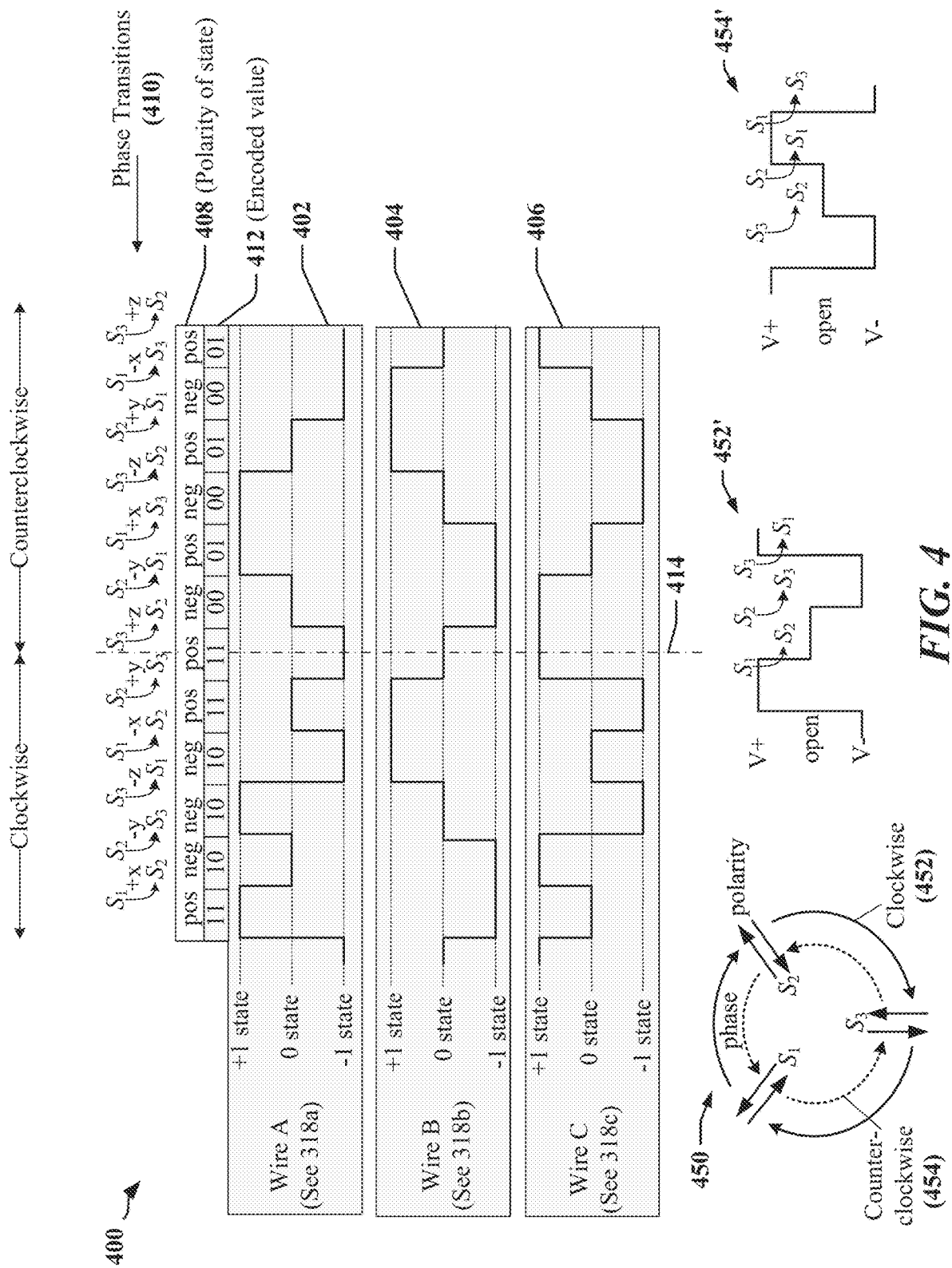
FIG. 4 illustrates signaling in a C-PHY 3-phase encoded interface.

FIG. 4 includes an example of a timing diagram 400 for signals encoded using a three-phase modulation data-encoding scheme, which is based on the circular state diagram 450. Information may be encoded in a sequence of signaling states where, for example, a wire or connector is in one of three phase states $S_1$, $S_2$ and $S_3$ defined by the circular state diagram 450. Each state may be separated from the other states by a 120° phase shift. In one example, data may be encoded in the direction of rotation of phase states on the wire or connector. The phase states in a signal may rotate in clockwise direction 452 and 452' or counterclockwise direction 454 and 454'. In the clockwise direction 452 and 452' for example, the phase states may advance in a sequence that includes one or more of the transitions from $S_1$ to $S_2$, from $S_2$ to $S_3$ and from $S_3$ to $S_1$. In the counterclockwise direction 454 and 454', the phase states may advance in a sequence that includes one or more of the transitions from $S_1$ to $S_3$, from $S_3$ to $S_2$ and from $S_2$ to $S_1$. The three signal wires 318a, 318b and 318c carry different versions of the same signal, where the versions may be phase shifted by 120° with respect to one another. Each signaling state may be represented as a different voltage level on a wire or connector and/or a direction of current flow through the wire or connector. During each of the sequence of signaling states in a 3-wire system, each signal wire 318a, 318b and 318c is in a different signaling state than the other wires. When more than 3 signal wires 318a, 318b and 318c are used in a 3-phase encoding system, two or more signal wires 318a, 318b and/or 318c can be in the same signaling state at each signaling interval, although each state is present on at least one signal wire 318a, 318b and/or 318c in every signaling interval.

Information may be encoded in the direction of rotation at each phase transition 410, and the 3-phase signal may change direction for each signaling state. Direction of rotation may be determined by considering which signal wires 318a, 318b and/or 318c are in the '0' state before and after a phase transition, because the undriven signal wire 318a, 318b and/or 318c changes at every signaling state in a rotating three-phase signal, regardless of the direction of rotation.

The encoding scheme may also encode information in the polarity 408 of the two signal wires 318a, 318b and/or 318c that are actively driven. At any time in a 3-wire implementation, exactly two of the signal wires 318a, 318b, 318c are driven with currents in opposite directions and/or with a voltage differential. In one implementation, data may be encoded using two bit values 412, where one bit is encoded in the direction of phase transitions 410 and the second bit is encoded in the polarity 408 for the current state.

The timing diagram 400 illustrates an example of data encoding using both phase rotation direction and polarity. The curves 402, 404 and 406 relate to signals carried on three signal wires 318a, 318b and 318c, respectively for multiple phase states. Initially, the phase transitions 410 are in a clockwise direction and the most significant bit is set to binary '1,' until the rotation of phase transitions 410 switches at a time 414 to a counterclockwise direction, as represented by a binary '0' of the most significant bit. The least significant bit reflects the polarity 408 of the signal in each state.

According to certain aspects disclosed herein, one bit of data may be encoded in the rotation, or phase change in a 3-wire, 3-phase encoding system, and an additional bit may be encoded in the polarity of the two driven wires. Additional information may be encoded in each transition of a 3-wire, 3-phase encoding system by allowing transition to any of the possible states from a current state. Given 3 rotational phases and two polarities for each phase, 6 states are available in a 3-wire, 3-phase encoding system. Accordingly, 5 states are available from any current state, and there may be $log_2(5) \cong 2.32$ bits encoded per symbol (transition), which allows the mapper 302 to accept a 16-bit word and encode it in 7 symbols.

Figure 5:
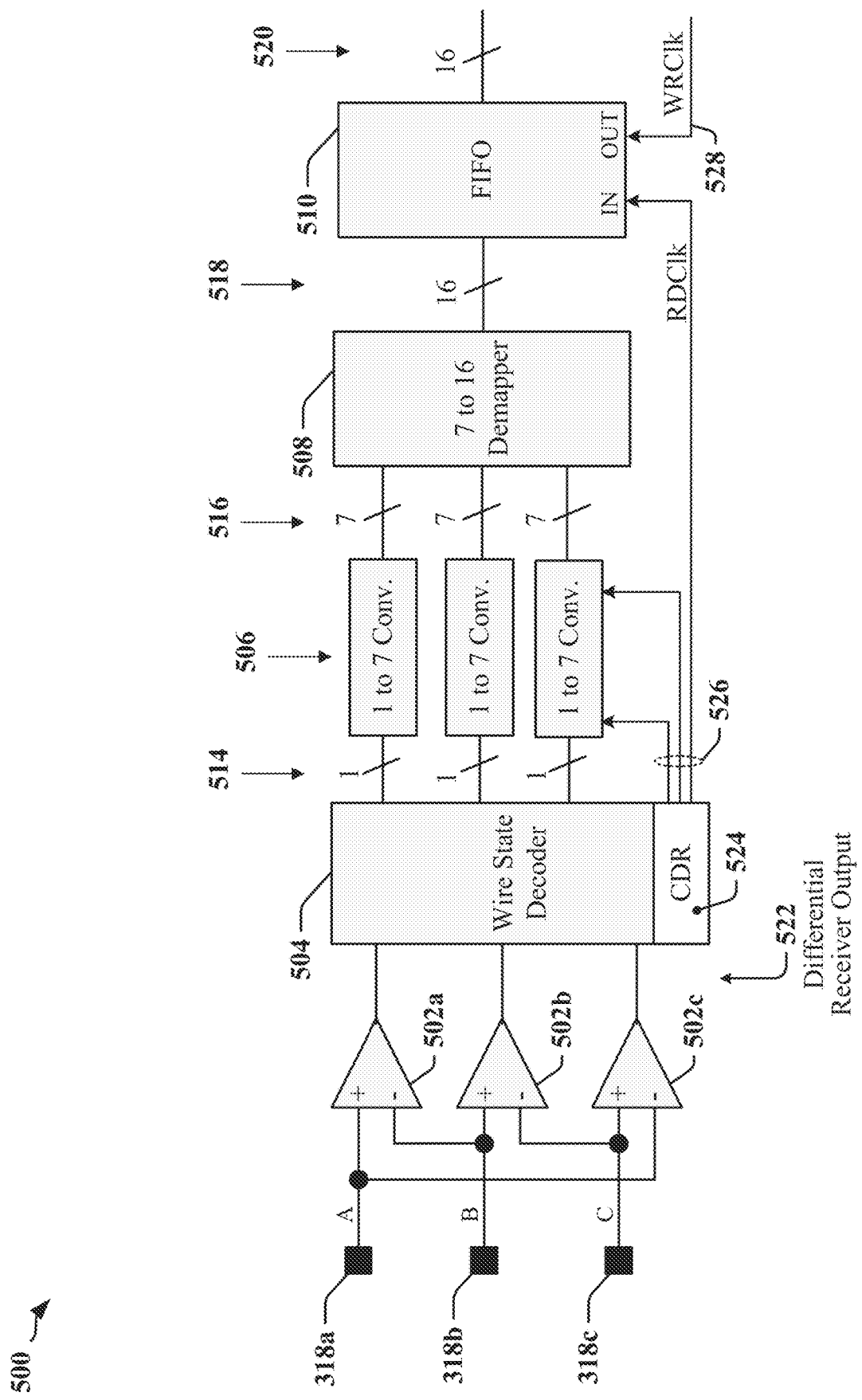
FIG. 5 illustrates a C-PHY 3-phase receiver.

FIG. 5 is a diagram illustrating certain aspects of a C-PHY receiver 500. For the purposes of this description, the C-PHY receiver 500 may be assumed to support 3-wire, 3-phase decoding. Differential receivers 502a, 502b, 502c and a wire state decoder 504 are configured to provide a digital representation of the state of the three transmission lines (e.g., the signal wires 318a, 318b and 318c illustrated in FIG. 3), with respect to one another, and to detect changes in the state of the three transmission lines compared to the state transmitted in the previous symbol period. Seven consecutive states are assembled by the serial-to-parallel convertors 506 to obtain a set of 7 symbols 516 to be processed by the demapper 508. The demapper 508 produces 16 bits of data 518 that may be buffered in a first-in-first-out (FIFO) register 510 that provides an output 520 of the C-PHY receiver 500.

The wire state decoder 504 may extract a sequence of symbols 514 from difference signals 522 derived from phase encoded signals received by the differential receivers 502a, 502b, 502c from the signal wires 318a, 318b and 318c. The symbols 514 are encoded as a combination of phase rotation and polarity as disclosed herein. The wire state decoder may include a CDR circuit 524 that extracts timing information from transitions on the signal wires 318a, 318b and 318c and, from the timing information, generates clock signals 526 that can be used to reliably capture wire states from the signal wires 318a, 318b and 318c. A transition occurs on least one of the signal wires 318a, 318b and 318c at each symbol boundary and the CDR circuit 524 may be configured to generate the clock signals 526 based on the occurrence of a transition or multiple transitions. Edges in one or more of the clock signals 526 may be delayed to allow time for all signal wires 318a, 318b and 318c to have stabilized and to thereby ensure that the current wire state is captured for decoding purposes. In one example, the one or more of the clock signals 526 may include a RDClk signal used to cause the FIFO 510 to read or capture data output by the demapper 508. In some examples, other clock signals may be used by the C-PHY receiver 500. For example, a write clock signal 528 (WRClk) may be received from a processing circuit to enable the FIFO 510 to asynchronously write out its contents to external processing devices or storage devices.

Figure 6:
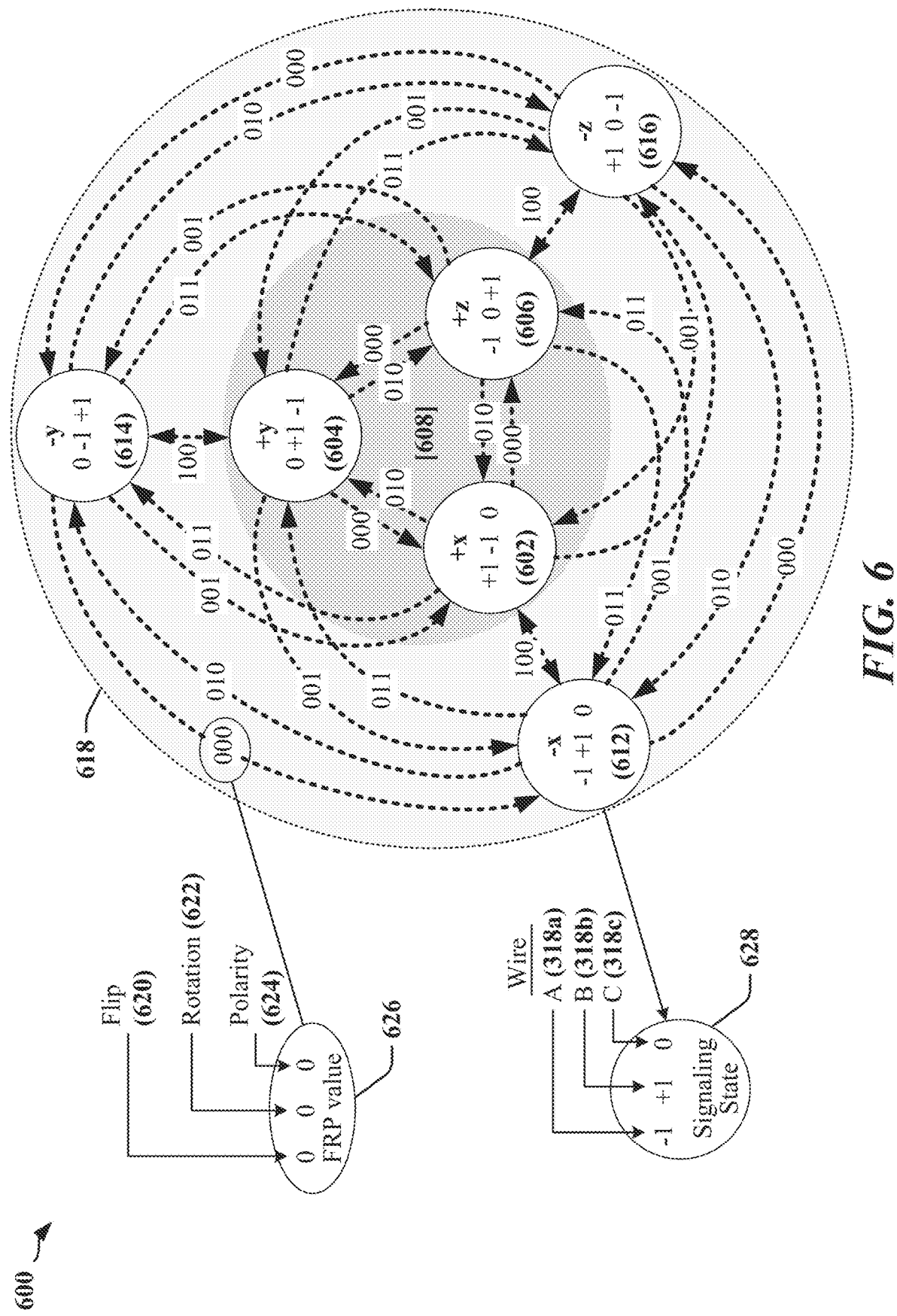
FIG. 6 is a state diagram illustrating potential state transitions in a C-PHY 3-phase encoded interface.

FIG. 6 is state diagram 600 illustrating the possible signaling states 602, 604, 606, 612, 614, 616 of the three wires of a C-PHY bus, with the possible transitions illustrated from each state. In the example of a C-PHY interface configured for 3-wire, 3-phase encoding, 6 states and 30 state transitions are available. The possible states 602, 604, 606, 612, 614 and 616 in the state diagram 600 include and expand on the states shown in the circular state diagram 450 of FIG. 4. As shown in the exemplar of a state element 628, each state 602, 604, 606, 612, 614 and 616 in the state diagram 600 defines voltage signaling state for the signal wires 318a, 318b, 318c in each state, which are labeled A, B and C respectively. For example, in state 602 (+x) wire A=+1, wire B=−1 and wire C=0, yielding output of differential receiver 502a (A−B)=+2, differential receiver 502b (B−C)=−1 and differential receiver 502c (C−A)=−1. Transition decisions taken by phase change detect circuits in a receiver are based on 5 possible levels produced by the differential receivers 502a, 502b, 502c, which include −2, −1, 0, +1 and +2 voltage states.

The transitions in the state diagram 600 can be represented by a Flip, Rotate, Polarity symbol (e.g., the FRP symbol 626) that has one of the three-bit binary values in the set: {000, 001, 010, 011, 100}. The Rotation bit 622 of the FRP symbol 626 indicates the direction of phase rotation associated with a transition to a next state. The Polarity bit 624 of the FRP symbol 626 is set to binary 1 when a transition to a next state involves a change in polarity. When the Flip bit 620 of the FRP symbol 626 is set to binary 1, the Rotate and Polarity values may be ignored and/or zeroed. A flip represents a state transition that involves only a change in polarity. Accordingly, the phase of a 3-phase signal is not considered to be rotating when a flip occurs and the polarity bit is redundant when a flip occurs. The FRP symbol 626 corresponds to wire state changes for each transition. The state diagram 600 may be separated into an inner circle 608 that includes the positive polarity states 602, 604, 606 and an outer circle 618 that encompasses the negative polarity states 612, 614, 616.

Figure 7:
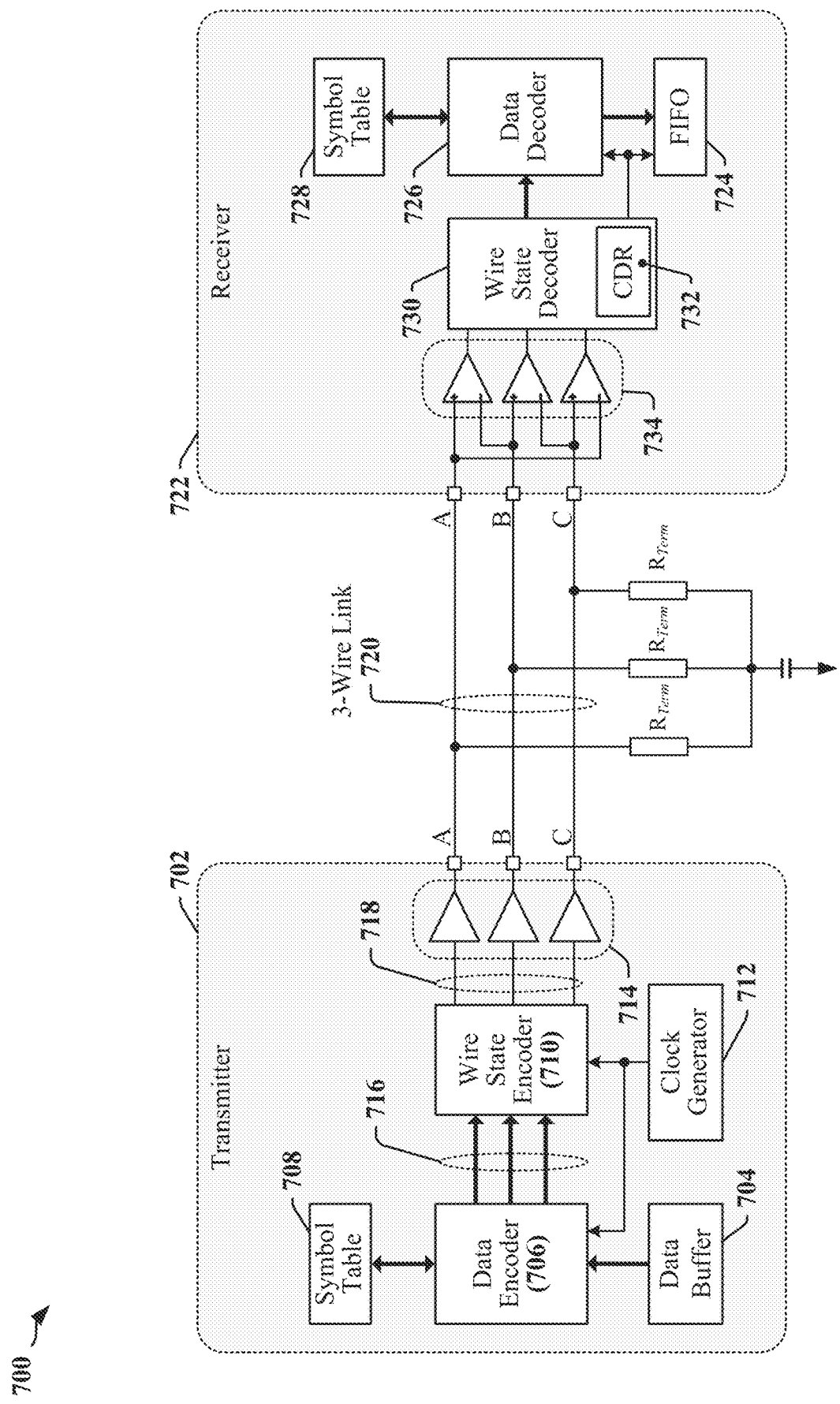
FIG. 7 illustrates a C-PHY interface circuit that may be adapted in accordance with certain aspects disclosed herein.

FIG. 7 illustrates an example of a system 700 that has been adapted in accordance with certain aspects of this disclosure to support various encoding schemes that include 3-phase encoding. A transmitter 702 is coupled to a receiver 722 by a 3-wire link 720. The transmitter 702 includes a data buffer 704 that receives and holds data to be communicated to the receiver 722. The data may be received by the data buffer 704 from an application processor, peripheral, sensor, storage device, imaging device, display, or another source of data. In some examples, the data is stored as 8-bit bytes, 16-bit, 32-bit or 64-bit words, or words of another size. In some examples, each unit of data is stored with parity bits, and/or error-checking bits; for example, a parity bit may be provided for each byte, and/or parity bits or cyclic redundancy bits may be calculated for a block of data bytes or words and transmitted as additional bytes or words. In some instances, the data may be encapsulated with control information in packets or other data structures generated in accordance with one or more layers of a communication protocol. The data buffer 704 may be provided to a data encoder 706 in a size defined by the application. The data encoder 706 may include components configured to reformat data received from the data buffer 704, map the reformatted data to one or more symbols, and serialize or otherwise sequence the symbols for transmission in accordance with a transmission clock.

In certain implementations, the data encoder 706 receives data from the data buffer 704 in unit sizes that are sized according to the encoding rate associated with the encoding scheme. In some examples, the data encoder 706 is configured to process data in 8-bit bytes, 16-bit words or 32-bit words. In some examples, the data encoder 706 may include circuits that reorganize data supplied by the data buffer 704 to a set of 8-bit bytes or 16-bit words such that the unit size of data is constant regardless of the encoding scheme configured for the data encoder 706. In one example, the data encoder 706 generates three multibit codes 716 representing the signaling state of each wire of the 3-wire link 720 during each symbol transmission interval. The data encoder 706 provides the three multibit codes 716 to the wire state encoder 710. The wire state encoder 710 generates control signals 718 that are provided to the line drivers 714. Each of the line drivers 714 receives one or more of the control signals 718, which it uses to define the signaling state of a corresponding wire of the 3-wire link 720.

In certain implementations, each of the three multibit codes 716 may cause the wire state encoder 710 to generate a set of control signals 718 that configure switches in the line drivers 714, where the state of the switches (e.g., closed or open) may select current or voltage levels to be provided to the wires of the 3-wire link 720. The state of the control signals 718 generated by the wire state encoder 710 responsive to the three multibit codes 716 may be configured based on the active encoding scheme or on the type of line driving circuit used to implement the line drivers 714. Different types of line driving circuits may have different numbers of switches to be controlled to select a desired signaling state. Operations of the data encoder 706 and wire state encoder 710 may be performed in accordance with timing information indicated in a clock signal provided by a clock generator circuit.

The data encoder 706 operates to cause a stream of symbols to be transmitted on the 3-wire link 720, where each symbol is transmitted as a combination of signaling states of the 3 wires of the 3-wire link 720. The data encoder 706 may be configured for one or more modes of operation and for one or more encoding schemes.

In a first example, the transmitter 702 may be actively transmitting a stream of symbols over the 3-wire link 720, where the data encoder 706 has generated an $N^{th}$ symbol ($S_N$) and has added $S_N$ to the stream of symbols. The data encoder 706 may be configured for a first mode of operation in which each unit of data is encoded independently. In this first mode, the data encoder 706 uses the next unit of data to be encoded to select a next symbol for transmission. In one example, the data encoder 706 may generate an index used to select a next symbol ($S_{N+1}$), where the index to $S_{N+1}$ is generated using the next four bits as an offset from the index to $S_N$. The index is generated in a manner that prevents the selection of the same symbol as $S_N$ and $S_{N+1}$. In one example, the index to $S_{N+1}$ may be calculated by addition or subtraction of the next four bits to the index to $S_N$. In another example, the index to $S_{N+1}$ may be calculated using an algorithm that receives the next four bits and the index to $S_N$ as variables.

In a second example, the transmitter 702 may be actively transmitting a stream of symbols over the 3-wire link 720, where the data encoder 706 has generated an $N^{th}$ symbol ($S_N$) and has added $S_N$ to the stream of symbols. The data encoder 706 may be configured for a second mode of operation in which one or more bytes of data are encoded in a sequence of symbols $\{S_{N+1}, S_{N+2}, \ldots\}$. In one example, the data encoder 706 uses the value of $S_N$ and one or more data bytes to index a table that maintains sequences of symbols. In another example, the data encoder 706 uses the one or more data bytes to index a table that maintains sets of offsets used to select a sequence of symbols based on the value of $S_N$. The data encoder 706 produces the sequence of symbols by using the combined offsets to generate an index to a next symbol from the index used to generate the previously generated symbol. For example, the data encoder 706 may generate an index to the symbol table 708 for selecting $S_{N+1}$ based on the value of the first offset in the set of offsets and the index used to select $S_N$. In some instances, the set of offsets may be obtained by indexing a table using the content of the one or more bytes as an index. In some instances, the set of offsets may be generated by breaking the units of data into one or more bytes or words.

In some implementations, the data encoder 706 may include or be coupled to parallel-to-serial convertors that convert symbols expressed as a block of multibit codes representative of the signaling states of the 3-wire link 720 into a time-ordered sequence of symbols. A sequence of symbols $\{S_1, S_2, \ldots S_N, S_{N+1}, \ldots\}$ may be transmitted in corresponding symbol transmission intervals {$t_1, t_2, \ldots t_N, t_{N+1}, \ldots$}, where the symbol transmission intervals are defined based on a clock signal provided by the clock generator 712. The sequence of multibit codes 716 provided to the wire state encoder 710 include an Nth symbol ($S_N$) that is used to generate signaling state of the 3-wire link 720 during a corresponding Nth symbol transmission interval ($t_N$) symbol, followed by an (N+1)th symbol ($S_{N+1}$) that is used to generate signaling state of the 3-wire link 720 during a corresponding (N+1)th symbol transmission interval ($t_{N+1}$).

The receiver 722 includes differential receivers 734 that receive signals from the 3-wire link 720. The differential receivers 734 may be operable to discriminate between the N signaling states defined in an encoding scheme in accordance with certain aspects disclosed herein. The differential receivers 734 provide differential output signals to a wire state decoder 730 that is configured to extract a symbol from the differential output signals. The symbol is then provided to a data decoder 726 that may be configured to operate on individual symbols or on groups of symbols. The data decoder 726 may include components configured to deserialize received symbols and demap one or more symbols to obtain decoded data. The data decoder 726 may include components configured to reassemble and reformat the decoded data.

In one mode operation, the data decoder 726 may use a difference between received symbol ($S_{N+1}$) and a preceding symbol ($S_N$) to index a symbol table 728 to obtain 4 bits of decoded data. In another mode operation, the data decoder 726 may use a received sequence of symbols and a preceding symbol ($S_N$) to index the symbol table 728 to obtain multiple bits of decoded data. Decoded data may be provided to a first-in, first-out register (FIFO 724) or another buffer.

The wire state decoder 730 may include a clock and data recovery circuit (CDR 732) that detects transitions in signaling state on one or more wires of the 3-wire link 720 and generates a clock signal based on the timing of the transition. The clock signal may be used by the data decoder 726, FIFO 724 and other components of the receiver 722 may operate in accordance with the clock signal.

Figure 8:
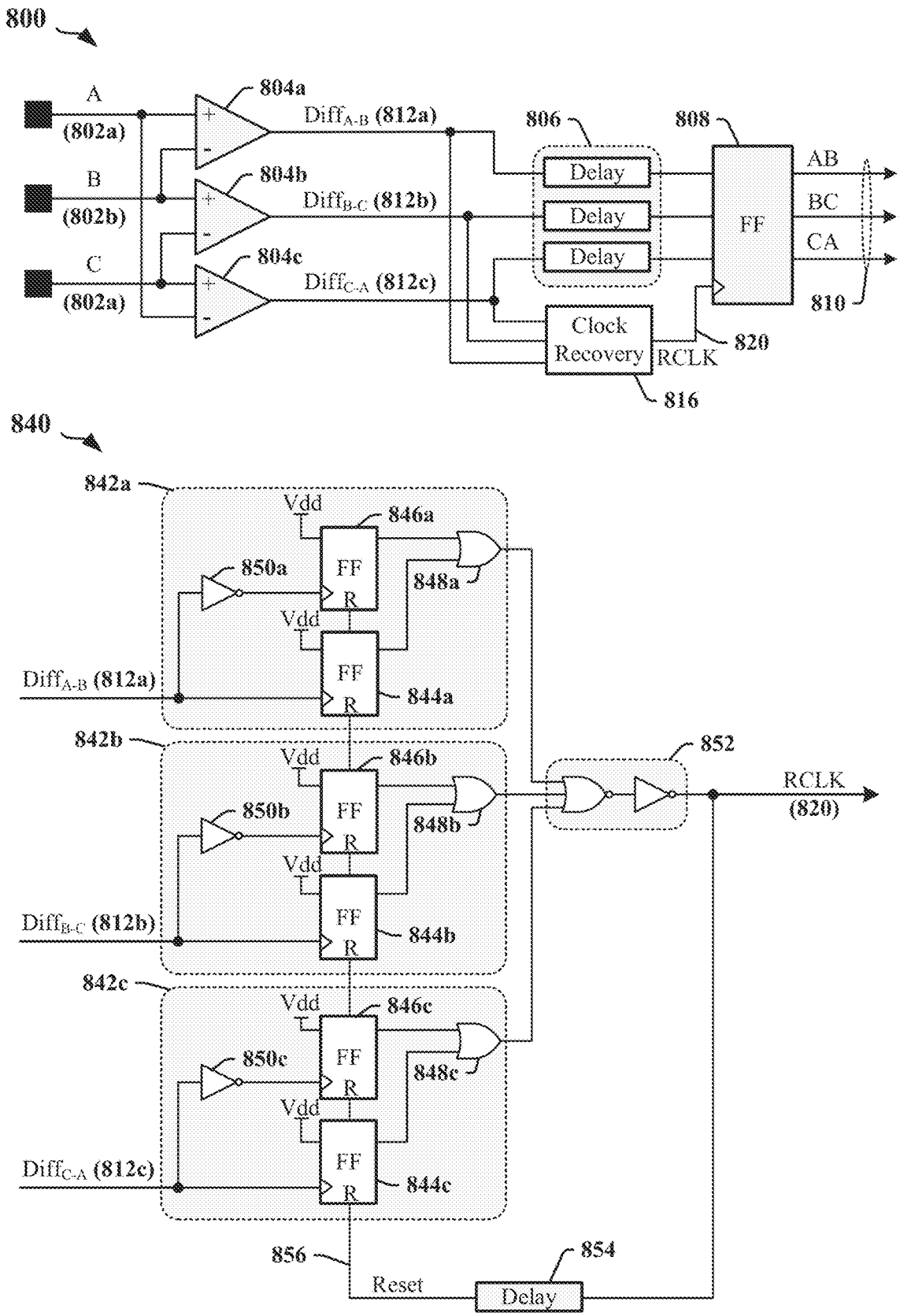
FIG. 8 illustrates certain aspects of a clock recovery circuit provided in a receiving device that may be adapted in accordance with certain aspects disclosed herein.

FIG. 8 illustrates certain aspects of a C-PHY bus interface 800 provided in a receiving device. The C-PHY interface 800 includes differential receivers 804*a*, 804*b*, 804*c* coupled to different pairs of the wires 802*a*, 802*b*, 802*c* of a C-PHY bus. Each of the differential receivers 804*a*, 804*b*, 804*c* outputs a difference signal 812*a*, 812*b*, 812*c* as its output, the difference signal representing the difference between two wires 802*a*, 802*b*, 802*c* provided as input to the differential receiver 804*a*, 804*b*, 804*c*. The difference signals 812*a*-812*c* may be delayed and captured to provide a recovered symbol 810. A clock recovery circuit 816 of the C-PHY interface 800 can be configured to detect transitions in the difference signals 812*a*-812*c* and to generate a receive clock signal (i.e., RCLK 820). The recovered symbol 810 may be provided to a decoder that, for example, may be configured to operate in accordance with the state diagram 600 of FIG. 6. In some examples, binary difference signals 812*a*-812*c* are provided by differential receivers 804*a*, 804*b*, 804*c* that compare difference in voltage levels of two wires 802*a*, 802*b* and/or 802*c* to a single threshold level. In some instances, the single threshold level may be zero volts. In some examples, each difference signal 812*a*-812*c* is a multibit digital signal that represents the difference in voltage levels of two wires 802*a*, 802*b* and/or 802*c* as a numerical value that represents actual voltage or a number representing the difference voltage. In some examples, each difference signal 812*a*-812*c* is a multibit digital signal that indicates transitions across one or more of a plurality of threshold levels. In some examples, analog difference signals 812*a*-812*c* are provided by the differential receivers 804*a*, 804*b*, 804*c*.

In the illustrated example, the difference signals 812*a*-812*c* are captured using an edge in RCLK 820. The edge is generated from a transition in the difference signals 812*a*-812*c* that correspond to a current symbol (Symbol N) and the edge is used to capture or sample the state of the difference signals 812*a*-812*c* representing the preceding symbol (Symbol N−1). The difference signals 812*a*-812*c* are delayed by set of delay circuits 806 and are captured by flipflops 808 that are clocked by RCLK 820. The delay circuits 806 may be configured with delays to provide sufficient timing for the edge to be generated in RCLK 820.

In this disclosure the term "flipflop" is used to facilitate description, and a flipflop may refer to any suitable bi-stable device, including D-flipflops, latches, keeper circuits or other such logic devices. A flipflop, as used herein, may have multiple inputs and at least one output and be arranged, configured or operated to respond to certain input states or state transitions by setting an output, to further respond to certain other input states or state transitions by clearing the output. In some instances, multiple flipflops may be configured to operate as a multibit register in which each flipflop responds to a common clock signal, and may respond to other common control signals such as a reset signal. For example, a register may include one or more flipflops used to capture one or more bits of information in accordance with common timing information such as is provided by a clock signal. In the latter example, the register may be operable to capture signaling state expressed by a multibit signal. A flipflop, as used herein, may be operable to hold the output state between occurrences of certain types of change in input state.

The C-PHY interface 800 includes a clock recovery circuit 840 that is configured to generate RCLK 820 by detecting transitions in the difference signals 812*a*-812*c* and to generate one edge for each boundary between symbols. For example, the clock recovery circuit 840 may be configured to detect the earliest transition in any of the difference signals 812*a*, 812*b* or 812*c* between transmission of Symbol N−1 and Symbol N and may provide a clock pulse with a rising edge approximately aligned with the detected first transition.

Each of the delay circuits 806 is configured to delay a respective one of the difference signals 812*a*-812*c*. Delayed versions of the difference signals 812*a*-812*c* are provided to a corresponding data input of the flipflops 808. The flipflops 808 are configured to capture delayed receiver output bits on each rising edge in RCLK 820, and to provide the bits of the recovered symbol 810 to a decoder (not shown).

In one example, the delay circuits 806 are configured to delay the difference signals 812*a*-812*c* by a time delay approximately equal to the sum of the hold time of the flipflops 808 and a time interval $t_1$, where $t_1$ is approximately equal to the time required for the clock recovery circuit 840 to provide a rising edge in RCLK 820 after detecting a transition in one of the difference signals 812*a*-812*c*.

FIG. 8 also illustrates an example of a clock recovery circuit 840 provided in accordance with certain aspects of the present disclosure. The clock recovery circuit 840 has a first edge-detection circuit 842*a* coupled to the output of the first receiver 804*a*, a second edge-detection circuit 842*b* coupled to the output of the second receiver 804*b*, and a third edge-detection circuit 842*c* coupled to the output of the third receiver 804c. The clock recovery circuit 840 also has an OR gate 852 and a delay circuit 854. In the illustrated example, the OR gate 852 is implemented using a NOR gate coupled in series with an inverter.

Each edge-detection circuit 842a-842c has a first flipflop 844a-844c, a second flipflop 846a-846c, an inverter 850a-850c, and an OR gate 848a-848c. The first flipflop 844a-844c has a clock input coupled to the output of the respective receiver 804a, 804b, 804c and a data input coupled to the power supply voltage Vdd. The first flipflop 844a-844c is configured to output logic 1 to one of the inputs of the OR gate 848a-848c when a rising edge is detected at the clock input of the first flipflop 844a-844c. The second flipflop 846a-846c has a clock input coupled to the output of the respective receiver 804a, 804b, 804c through the inverter 850a-850c and a data input coupled to the power supply voltage Vdd. The second flipflop 846a-846c is configured to output logic 1 to the other input of the OR gate 848a-848c when a rising edge is detected at the clock input. Because the inverter 850a-850c inverts the receiver output, the second flipflop 846a-846c detects a falling transition in the receiver output, and outputs logic 1 to the other input of the OR gate 848a-848c when a falling edge is detected. The OR gate 848a-848c outputs a 1 when a rising or falling edge occurs in the respective receiver output.

The OR gate 852 has a first input coupled to the output of the first edge-detection circuit 842a, a second input coupled to the output of the second edge-detection circuit 842b, and a third input coupled to the output of the third edge-detection circuit 842c. As a result, the OR gate 852 outputs logic 1 when any one of the edge-detection circuits 842a-842c outputs logic 1, and therefore outputs logic 1 when any one of the edge-detection circuits 842a-842c detects a transition in the respective receiver output.

Assuming that the flipflops 844a-844c, 846a-846c in the edge-detection circuits 842a-842c are reset before each symbol transition, the OR gate 852 initially outputs logic 0 at the start of each symbol. When a first one of the edge-detection circuits 842a-842c detects a transition in the respective receiver output and outputs logic 1 to the OR gate 852, the OR gate 852 outputs logic 1, generating a clock pulse in RCLK 820 output by the clock recovery circuit 840. The transition of the output of the OR gate 852 from logic 0 to logic 1 corresponds to the rising edge of the clock pulse. There is a short time delay $t_1$ between detection of the earliest transition in the receiver outputs and the rising edge of the clock pulse due to propagation delays in the flipflops 846a-846c, 844a-844c and OR gates 848a-848c, 852.

The output of the clock recovery circuit 840 is fed back to the reset inputs of the flipflops 846a-846c and 844a-844c through the delay circuit 854. When the output of the OR gate 852 transition from logic 0 to logic 1 (rising clock edge), the delay circuit 854 outputs a reset signal 856 to the reset inputs of the flipflops after a time delay of $t_{delay}$. The reset signal 856 causes all of the flipflops to output logic 0. As a result, after a short delay $t_2$, the output of the OR gate 852 transitions from logic 1 to logic 0. The transition from logic 1 to logic 0 corresponds to the falling edge of the current clock pulse in RCLK 820. Thus, the width of the clock pulse is approximately equal to the sum of $t_{delay}$ and $t_2$. The delay $t_{delay}$ provided by the delay circuit 854 defines a masking interval during which further transitions in the difference signals 812a-812c have no effect on RCLK 820. The first occurring transition sets the output of the OR gate 852 to logic 1 and subsequent transitions have no effect during the delay $t_{delay}$ provided by the delay circuit 854.

When the output of the OR gate 852 transitions from logic 1 to logic 0, the delay circuit 854 terminates the reset signal 856 to the reset inputs of the flipflops after the time delay $t_{delay}$ of the delay circuit 854. After the reset signal 856 is deactivated, the flipflops 846a-846c and 844a-844c are ready to detect a transition in the receiver outputs for the next symbol.

Figure 9:
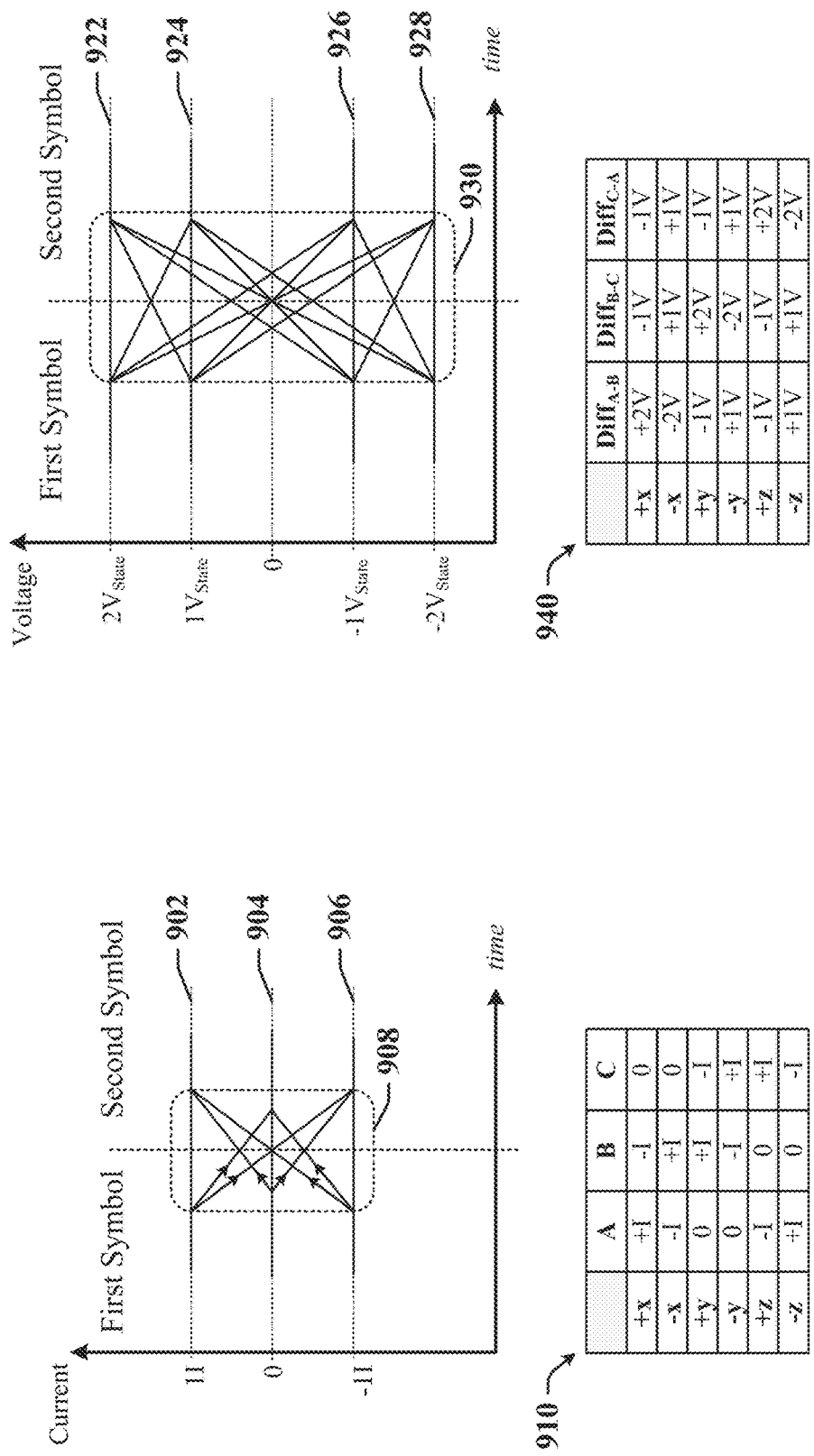
FIG. 9 illustrates certain aspects of the signaling states associated with the operation of the bus interface circuit shown in FIG. 8.

FIG. 9 illustrates certain aspects of the signaling states associated with the operation of the C-PHY bus interface 800. A first timing diagram 900 illustrates the three signaling states 902, 904, 906 defined for each of the three wires 802a, 802b, 802c in a C-PHY interface. Each signaling state 902, 904, 906 may be defined in terms of voltage level observed on a wire 802a, 802b, 802c or, as illustrated in the first timing diagram 900, in terms of a current flow through the wire 802a, 802b, 802c. The amperage of the current in each state is represented as ±I amps or 0 amps. In a first signaling state 902 a current of +I amps flows in a wire of the C-PHY bus, in a second signaling state 904 a current of 0 amps flows in the wire, and in a third signaling state 906 a current of −I amp flows in the wire. The value of I may be determined by application requirements or objectives, and/or device specifications. In one example, the value of I may be selected to produce a voltage level or voltage range at a receiver coupled to the C-PHY bus.

A table 910 is provided as an example of a mapping of symbols to current flow in the three wires 802a, 802b, 802c (identified as wires A, B and C). Each of the illustrated set of symbols {+x, −x, +y, −y, +z, −z} may correspond to a state 602, 604, 606, 612, 614 and 616 illustrated in FIG. 6. A transition interval 908 represents the duration of time between consecutive symbols during which transitions between the signaling states 902, 904, 906 can be expected to be completed. Two transitions are shown from each signaling state 902, 904, 906, and certain symbol transitions may produce no change in signaling state of one of the three wires 802a, 802b, 802c.

A second timing diagram 920 illustrates the four signaling states 922, 924, 926, 928 of the difference signals 812a-812c produced by the differential receivers 804a, 804b, 804c. Each signaling state 922, 924, 926, 928 may define a nominal voltage level or voltage range observed in a difference signal 812a, 812b, 812c. The voltage level of each state may be expressed as a multiple of a unit of voltage ($V_{State}$). A first signaling state 922 is represented by a nominal voltage level of +2$V_{State}$, a second signaling state 924 is represented by a nominal voltage level of +1$V_{State}$, a third signaling state 926 is represented by a nominal voltage level of −1$V_{State}$, and a fourth signaling state 922 is represented by a nominal voltage level of −2$V_{State}$. The nominal value of $V_{State}$ may be determined by application requirements or objectives, and/or device specifications.

The table 940 is provided as an example of a mapping of symbols to signaling state 922, 924, 926, 928 in the three difference signals 812a-812c (identified as Diff$_{A-B}$, Diff$_{B-C}$, Diff$_{C-A}$) generated for the set of symbols {+x, −x, +y, −y, +z, −z} illustrated in FIG. 6. A transition interval 930 represents the duration of time between consecutive symbols during which signaling state 922, 924, 926, 928 can be expected to be uncertain. Three possible transitions are shown from each signaling state 902, 904, 906 to a different signaling state 902, 904, 906. Certain symbol transition may produce no change in the two intermediate signaling states 924, 926.

Figure 10:
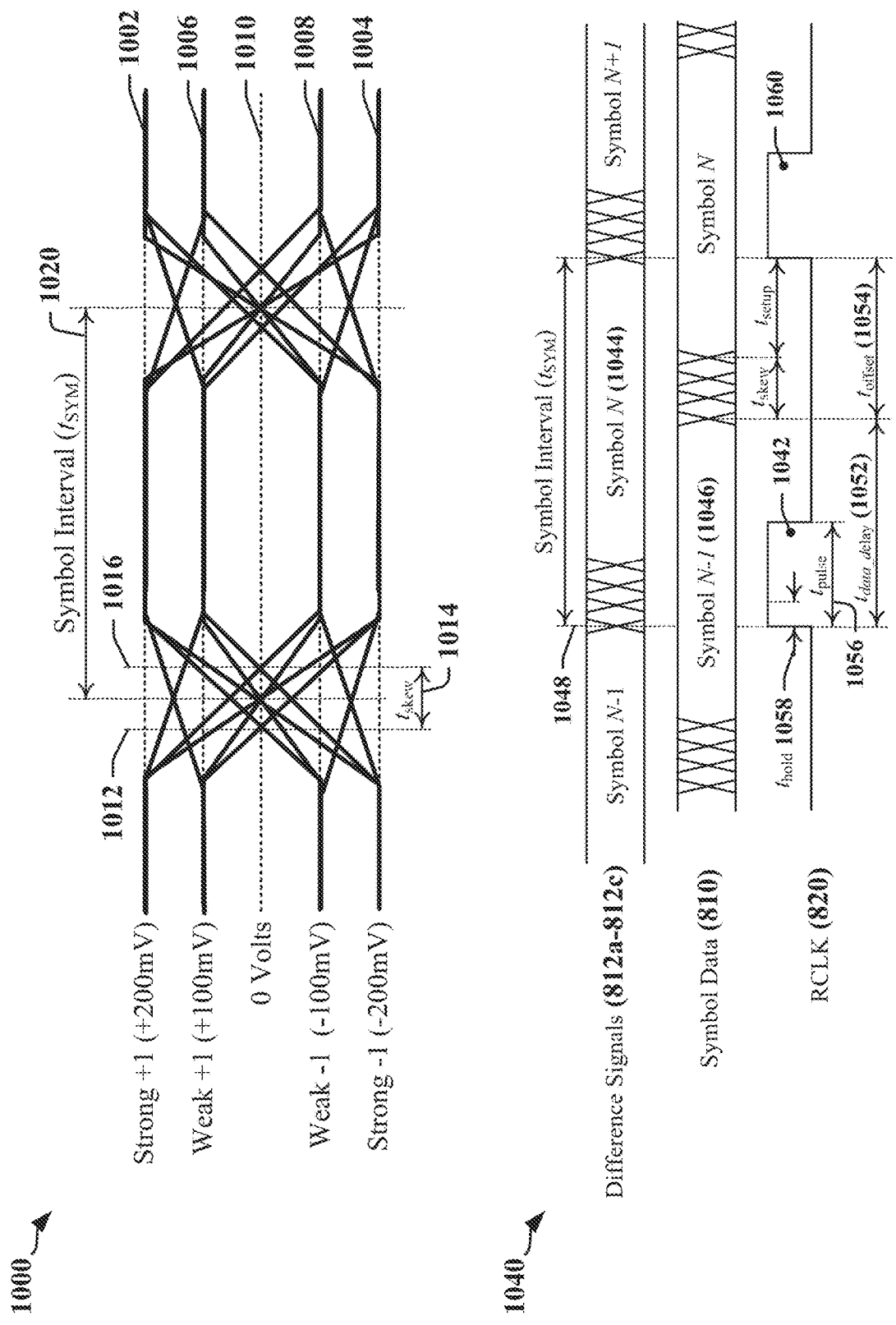
FIG. 10 illustrates certain aspects of the timing margins associated with the operation of the bus interface circuit shown in FIG. 8.

FIG. 10 illustrates certain aspects of the timing margins associated with the operation of the C-PHY bus interface 800. An eye diagram 1000 is provided that relates to a C-PHY interface that uses encoding defined by the state diagram 600 of FIG. 6 and overlays the difference signals 812a, 812b, 812c for each possible transition at the beginning and the end of a symbol interval 1020. In the illustrated example, the outputs of each of the differential receivers 804a, 804b, 804c represents the polarity of the difference in voltage between two of the three wires 802a, 802b, 802c in the C-PHY bus. For the purpose of this description, it can be assumed that the voltages on the three wires 802a, 802b, 802c can be +V, 0 or −V. In one example, V=100 millivolts. When the voltages inputs to a differential receiver 804a, 804b or 804c are at maximum voltages (±V), the differential receiver 804a, 804b or 804c measures a strong difference voltage 1002 or 1004. When one input to a differential receiver 804a, 804b or 804c is at 0, the differential receiver 804a, 804b or 804c measures a weak difference voltage 1006 or 1008. The pattern of transitions of polarity of the difference signals 812a, 812b, 812c between consecutive symbol intervals is captured to enable decoding of information. The clock recovery circuit 840 generates pulses in RCLK 820 after detecting the first transition in the difference signals 812a, 812b, 812c.

In FIG. 10, the first possible transition at the commencement of the illustrated symbol interval 1020 occurs at a time 1012 when the difference in signaling state between two wires changes from a weak difference voltage 1006 or 1008 to an opposite polarity strong difference voltage 1004 or 1002. The last possible transition occurs at a time 1016 when the difference in signaling state between two wires changes from a strong difference voltage 1002 or 1004 to an opposite polarity weak difference voltage 1008 or 1006. The difference in time between first possible transition and last possible transition symbol interval 1020 is characterized as a timing skew 1014. The clock recovery circuit 840 is configured to delay resetting the edge-detection circuits 842a-842c for at least the duration of the timing skew 1014 to avoid generating multiple pulses at the commencement of the symbol interval 1020. Data recovery relies on delay circuits 806 to ensure that the previous symbol remains stable when captured by the flipflops 808 that are clocked by an edge generated from the first crossing of the zero-volt threshold 1010 when the difference signals 812a, 812b, 812c are changing.

The timing of clock pulses relative to symbol capture is illustrated in the timing diagram 1040. Here, a pulse 1042 initiated at the first zero-crossing transition 1048 of Symbol N 1044 is used to capture delayed Symbol N−1 1046. In one example, the clock recovery circuit 840 detects the first transition in the difference signals 812a, 812b, 812c and drives RCLK 820 high until the delay ($t_{delay}$) provided by the delay circuit 854 expires, when the edge-detection circuits 842a-842c are reset and RCLK 820 is driven low. The duration of the pulse 1042 ($t_{pulse}$ 1056) corresponds closely to $t_{delay}$. The difference signals 812a, 812b, 812c are considered unstable when the pulse 1042 is generated and the pulse is used to capture a delayed version of the difference signals 812a, 812b, 812c using the flipflops 808. The delay circuits 806 may be configured to delay the difference signals 812a, 812b, 812c by a duration ($t_{data\_delay}$ 1052) such that the delayed Symbol N−1 1046 is stable at the rising edge in the pulse 1042. The delayed Symbol N−1 1046 is expected to remain stable for any necessary hold time 1058 associated with the flipflops 808. The delay circuits 806 may be configured with a value for $t_{data\_delay}$ 1052 that ensures that sampling occurs a sufficient time before the end of the delayed Symbol N−1 1046. The value of $t_{data\_delay}$ 1052 also configures the timing offset ($t_{offset}$ 1054) from the end of the delayed Symbol N−1 1046 and the rising edge of the next pulse 1060. The timing offset is expected to provide sufficient setup time ($t_{setup}$) for the flipflops 808 and accommodate the worst-case duration of the transition period ($t_{skew}$) between consecutive symbols. The captured delayed Symbol N−1 1046 is represented as the symbol 810 output by the flipflops 808.

The window available for sampling symbols may be limited by the mask, which has a duration that corresponds to the delay ($t_{delay1}$) provided by the delay circuit 854. The duration of the mask also corresponds to $t_{pulse}$ 1056. The duration of $t_{delay}$ is selected in conventional C-PHY interfaces to cover the time between all possible zero-crossings of the three difference signals 812a, 812b, 812c. In other phase-encoding schemes, the duration of the mask can limit throughput or impact reliability of decoding of signals received from a three-wire serial bus. For example, an encoding scheme that pulse amplitude modulates a C-PHY signal may require detection of crossings of multiple thresholds by difference signals 812a, 812b, 812c. Decoding difference signals 812a, 812b, 812c used in such schemes may require detection of crossings of thresholds other than or in addition to zero-crossings.

Certain aspects disclosed herein relate to encoding schemes that combine PAM with 3-phase encoding to increase the number of bits that can be encoded in each transition between transmitted symbols. PAM may be used to increase the number of voltage or current levels that can be used to define signaling states for a 3-wire link. Three voltage or current levels are used to define signaling states of a 3-wire link operated in accordance with conventional C-PHY protocols, which effectively use PAM-2 modulation. Certain aspects of this disclosure provide encoding schemes that define symbols that represent or define signaling states of the 3-wire link during a symbol transmission interval when at least 5 voltage or current levels are available for each wire. In one example, PAM-3 modulation provides 5 voltage or current levels per wire of the 3-wire link. In another example, PAM-4 modulation provides 7 voltage or current levels per wire of the 3-wire link. In another example, PAM-8 modulation provides 15 voltage or current levels per wire of the 3-wire link.

In the example of PAM-4 encoded 3-phase signals, data is encoded in transitions between symbols selected from a set of symbols that represent and/or determine the phase and voltage amplitude, or phase and current flow in a symbol transmission interval. The PAM-modulated, 3-phase signal is transmitted in a different phase on each wire of a 3-wire link during each symbol transmission interval. In the example of PAM-4 modulation, 18 symbols may be used for encoding data. In some instances, certain bits of a unit of data may be effectively encoded in transitions between symbols, and/or other bits of the unit of data may be encoded in the PAM-4 voltage levels. In some instances, the unit of data may be used to select a symbol to be transmitted based on the immediately preceding symbol and the unit of data to be encoded in the transition. In some instances, the larger units of data (e.g. bytes or words) may be used to select a sequence of symbols to be transmitted.

Table A below illustrates a sampling of examples of encoding schemes that may be implemented in accordance with certain aspects disclosed herein.

TABLE A

| PAM | States Provided | $\log_2$(States) | $\log_2$(States-1) |
|---|---|---|---|
| PAM-2 | 6 | 2.58 | 2.32 |
| PAM-3 | 12 | 3.58 | 3.46 |

TABLE A-continued

| PAM | States Provided | log₂(States) | log₂(States-1) |
|---|---|---|---|
| PAM-4 | 18 | 4.17 | 4.09 |
| PAM-8 | 42 | 5.39 | 5.36 |

Each encoding scheme employs 3-phase encoding to obtain a multi-phase signal, which is modulated using PAM. The 3-phase encoding scheme used in C-PHY interfaces may be characterized as employing PAM-2 modulation. The encoding capacity of an encoding scheme may be represented as the bits per symbol, calculated as the logarithm to the base 2 of the number of states available for encoding each symbol on the multiwire link. According to certain aspects disclosed herein, the number of available states is reduced by one when clock information is embedded in transmitted signals. In certain implementations, encoding schemes may use various other numbers of pulse amplitudes, including PAM-16, PAM-32, etc.

Figure 11:
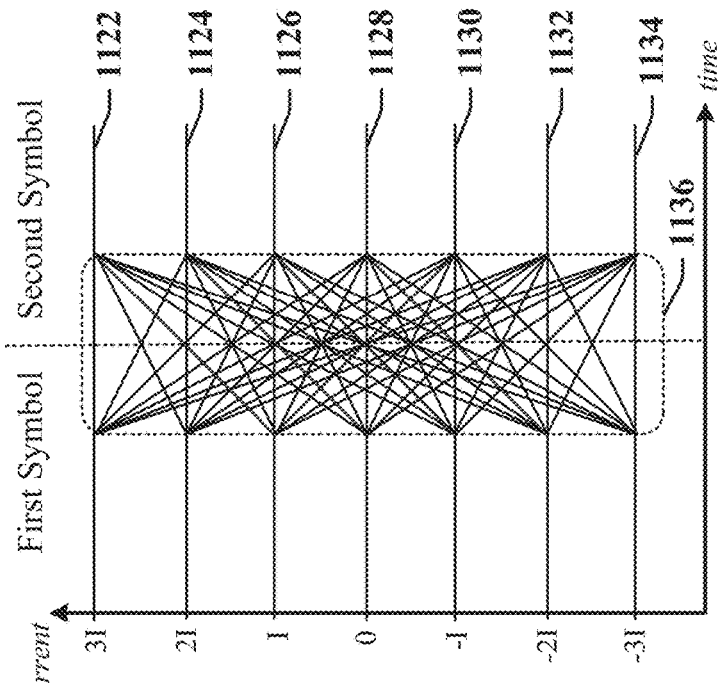
Figure 12:
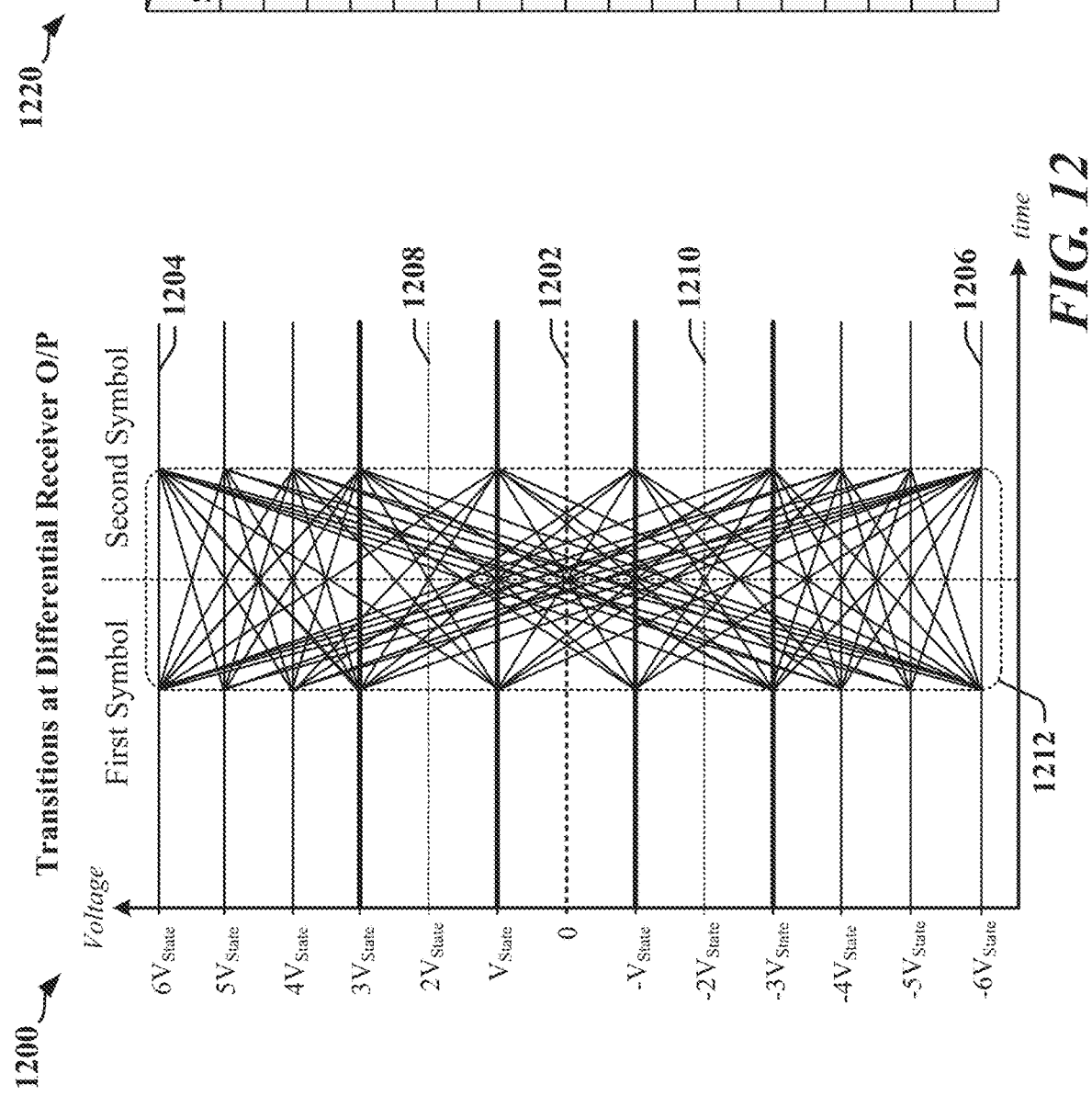

FIGS. 11-13 illustrate encoding schemes in which 3-phase encoding is combined with PAM-4 modulation in accordance with certain aspects of this disclosure. The receiver 722 of FIG. 7 and the C-PHY bus interface 800 and clock recovery circuit 840 of FIG. 8 may be adapted to support the illustrated 3-phase encoding with PAM-4 modulation scheme. The table 1100 in FIG. 11 shows 18 available symbols that are selected from the symbols provided by the combination of 3-phase encoding and PAM-4 modulation. As illustrated in the timing diagram 1120 of FIG. 11, PAM-4 modulation of a 3-phase signal can provide 4 additional signaling states over the 3 signaling states provided in a C-PHY 3-phase signal. The resultant set of 7 signaling states {3I, 2I, I, 0, −I, −2I, −3I} defines the possible current flows through a wire of the 3-wire bus, here expressed as a multiple of a nominal current flow (I). The 7 signaling states may also be expressed in terms of voltages detected at a receiver.

In the transition period 1136 between symbols, six possible transitions are shown from each signaling state 1122, 1124, 1126, 1128, 1130, 1132, 1134. In the illustrated encoding scheme, less than six transitions may be available or possible on one or more of the three wires when the transitions occurring on the other two wires are taken into consideration. In each of the 18 symbols in the table 1100, no two wires 802a, 802b, 802c in the 3-wire link are in the same signaling state. The encoding scheme illustrated in FIGS. 11 and 12 provides that two wires 802a, 802b, 802c cannot transition such that they land in the same signaling state 1122, 1124, 1126, 1128, 1130, 1132 or 1134. In one example, where a first wire 802a, 802b, 802c is transitioning to the 2I state, neither of the other wires 802a, 802b or 802c can transition to the 2I state. A change of signaling state occurs on at least one of the wires 802a, 802b, 802c during the transition period 1136 between consecutive symbols. Clock information may be derived by the receiver 722 from the transitions that occur in one or more wires between each pair of consecutively transmitted symbols.

The combination of 3-phase encoding and PAM-4 modulation enables 4 bits of data to be transmitted in each symbol transmission interval. As illustrated in the table 1100, 18 symbols representing mutually distinguishable combinations of signaling states or phases may be defined when 3-phase encoding and PAM-4 modulation are combined. The availability of 18 symbols enable up to bits to be transmitted in each symbol transmission interval. Clock information can be embedded in the transitions between consecutively transmitted symbols by prohibiting transmission of the same symbol in consecutive symbol transmission intervals in order to guarantee a change of signaling state on at least one wire 802a, 802b, 802c. When 17 of 18 symbols are available for transmission at each boundary between symbol transmission intervals, the resulting encoding rate may be calculated as bits per symbol transmission interval.

FIG. 12 includes a timing diagram 1200 that illustrates the signaling states of the difference signals 812a, 812b, 812c produced by the set of differential receivers 804a, 804b, 804c illustrated in FIG. 8 for each of the symbols defined in the table 1100 of FIG. 11. Each signaling state may define a nominal voltage level or voltage range observed in the difference signals 812a, 812b, 812c. In the illustrated encoding scheme, 18 symbols are defined and a corresponding 18 combinations of signaling states of the difference signals 812a, 812b, 812c may be detected at the receiver 722. The difference in voltage levels represented by each difference signal 812a, 812b, 812c may be a multiple of a unit of voltage ($V_{State}$), and the difference may range between the +6$V_{State}$ difference 1204 and the −6$V_{State}$ difference 1206. The zero-volt difference 1202, the +2$V_{State}$ difference 1208 and the −2$V_{State}$ difference 1210 are not expected to be produced outside the transition period 1212, absent an error in signaling or malfunction of the transmitter 702 or receiver 722. The nominal value of $V_{State}$ may be determined by application requirements or objectives, and/or device specifications. The table 1220 illustrates the signaling state of the difference signals 812a, 812b, 812c for each of the symbols defined in the table 1100 of FIG. 11.

FIG. 13 includes a table 1300 that includes symbols that do not have a wire 802a, 802b, 802c of the 3-wire link that is undriven or driven to the mid-level signaling state 1128 in accordance with an aspect of this disclosure. The table 1300 includes two groups of symbols 1302, 1304. One wire 802a, 802b or 802c of the 3-wire link is undriven or driven to the mid-level signaling state 1128 when a symbol from the first group of symbols 1302 is transmitted. An undriven wire 802a, 802b or 802c may carry no current flow and/or assume the mid-point voltage level. The sum of the currents flowing between the transmitter 702 and receiver 722 is zero when a symbol from the first group of symbols 1302 is transmitted. No wire 802a, 802b, 802c of the 3-wire link is undriven or driven to the mid-level signaling state 1128 when a symbol from the second group of symbols 1304 is transmitted. The sum of the currents flowing between the transmitter 702 and receiver 722 is zero when a symbol from the second group of symbols 1304 is transmitted. The availability of symbols that do not require that at least one wire 802a, 802b, 802c of the 3-wire link is undriven or driven to the mid-level signaling state 1128 provides added flexibility when selecting a symbol set and can simplify design of the line drivers.

Figure 14:
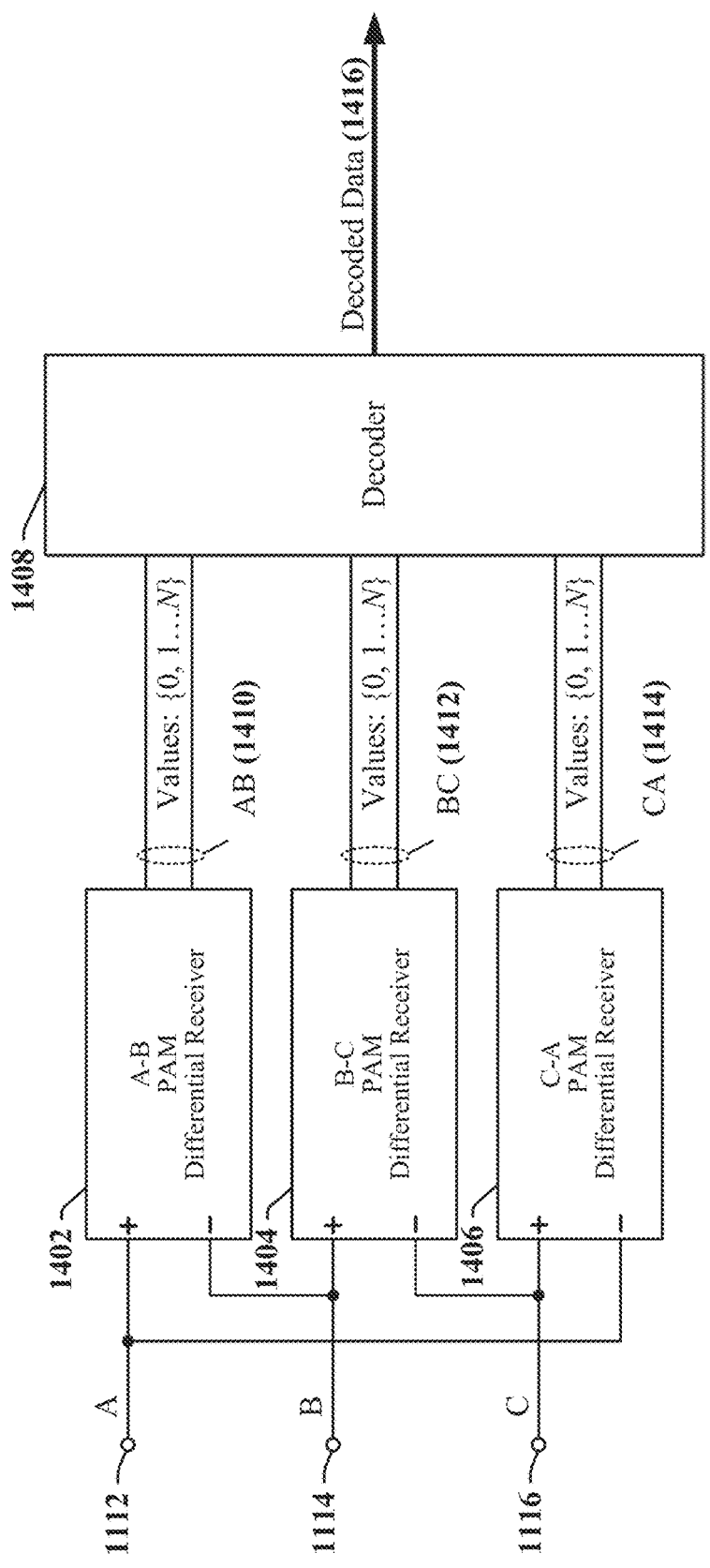
FIG. 14 illustrates a decoder architecture provided in a receiver that may be adapted in accordance with certain aspects disclosed herein.

FIG. 14 illustrates a decoder architecture 1400 provided in a receiver configured to support one or more combined 3-phase and PAM encoding schemes provided in accordance with certain aspects of this disclosure. The illustrated decoder architecture 1400 provides three PAM differential receivers 1402, 1404, 1406. The PAM differential receivers 1402, 1404, 1406 are configured to provide multibit difference values in their respective multibit output signals 1410, 1412, 1414 that represent differences in voltages between different pairs of the three wires 802a, 802b, 802c in the 3-wire link. In some implementations provided in accordance with certain aspects of this disclosure, each PAM differential receiver 1402, 1404, 1406 provides a difference value that indicates a band of difference values that includes the difference between signaling states of two of the wires 802a, 802b, 802c.

In the example of the encoding scheme illustrated in FIGS. 11-12, the PAM differential receivers 1402, 1404, 1406 are configured for decoding symbols generated using a combination of 3-phase and PAM-4 encoding. The PAM differential receivers 1402, 1404, 1406 may be adapted or configured to support encoding schemes that use other levels of PAM, including PAM-3 and PAM-8. A first PAM differential receiver 1402 compares the signaling states of the A wire 1112 and the B wire 1114 in the 3-wire link, a second PAM differential receiver 1404 compares the signaling states of the B wire 1114 and the C wire 1116 in the 3-wire link, and a third PAM differential receiver 1406 compares the signaling states of the C wire 1116 and the A wire 1112 in the 3-wire link. Each PAM differential receiver 1402, 1404, 1406 generates an output based on a comparison of the difference voltage present at its inputs. Each PAM differential receiver 1402, 1404, 1406 generates a multibit output signal 1410, 1412, 1414 representative of the band in which the difference voltage exists, based on threshold values that define the bands. In one example, the threshold values may be set at $-2.0V_{State}$, 0.0V and $+2.0V_{State}$, where $V_{State}$ corresponds to a unit of voltage that represents the minimum separation between possible voltage levels. The multibit output signals 1410, 1412, 1414 are provided to a decoder 1408 that uses the multibit digital output signals 1410, 1412, 1414 received in each symbol interval to assemble a sequence of wire states that can be decoded to extract symbol data as the output 1416 of the decoder 1408.

Figure 15:
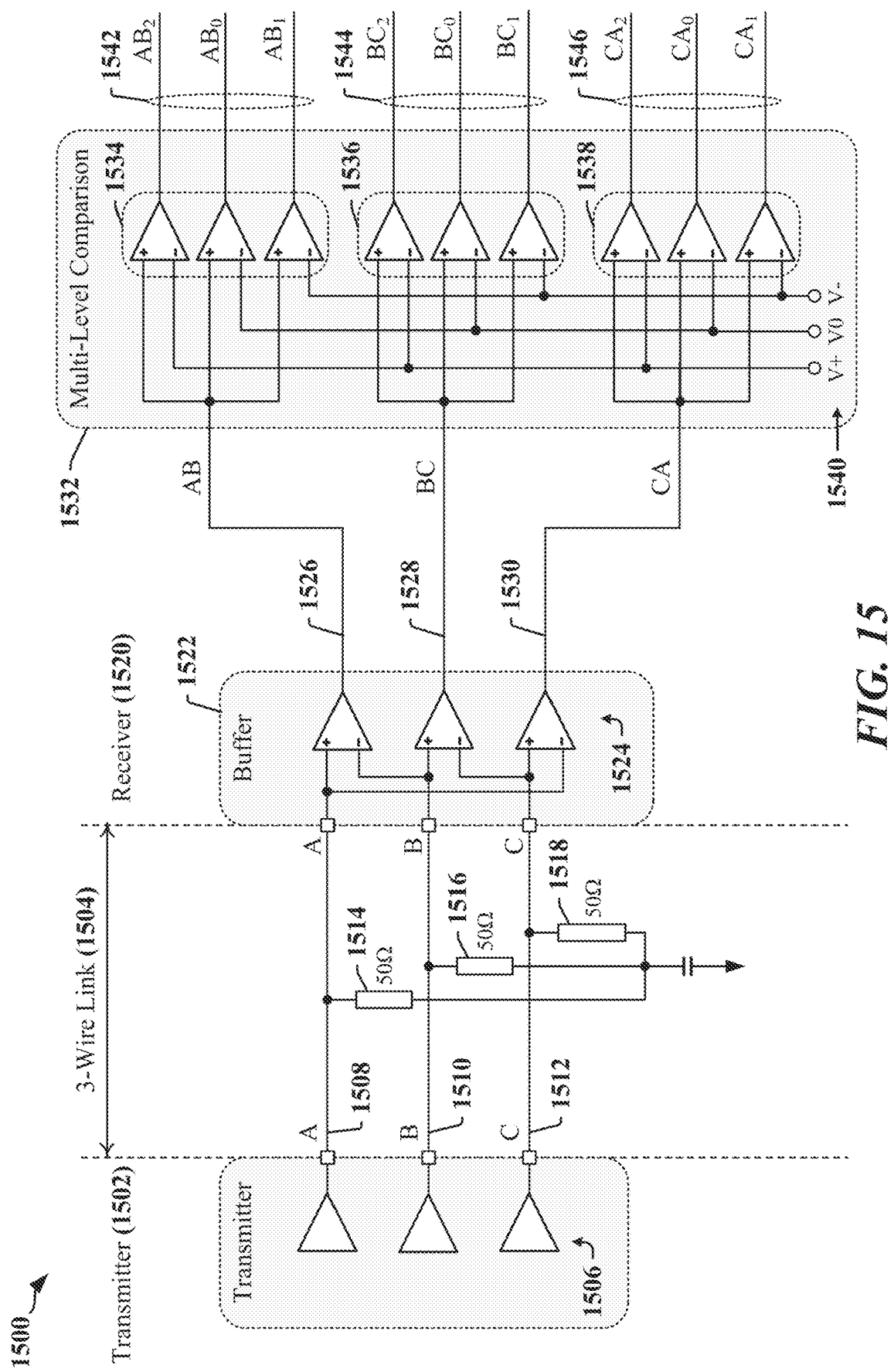
FIG. 15 illustrates an example of an interface that employs a receiver configured to distinguish between symbols transmitted using a combination of 3-phase encoding and PAM-4 modulation in accordance with certain aspects of this disclosure.

FIG. 15 illustrates an example of an interface 1500 that employs a receiver 1520 configured to distinguish between symbols transmitted using a combination of 3-phase encoding and PAM-4 modulation in accordance with certain aspects of this disclosure. In some implementations, the receiver 1520 may be adapted or configured to support encoding schemes that use other levels of PAM, including PAM-3 and PAM-8. In one example, the receiver circuits may correspond to the receiver 722 illustrated in FIG. 7, and/or may employ the decoder architecture 1400 illustrated in FIG. 14. The interface 1500 includes a transmitter 1502 coupled to a 3-wire link 1504. Each wire 1508, 1510, 1512 of the 3-wire link 1504 may be terminated at the receiver by a resistor 1514, 1516, 1518 that matches the characteristic impedance of the wires 1508, 1510, 1512. In the illustrated example, the characteristic impedance may correspond to a resistance of 50Ω. The transmitter 1502 has three line drivers 1506 configured to drive a corresponding wire 1508, 1510, 1512 using a combination of 3-phase encoding and PAM-4 modulation in accordance with certain aspects of this disclosure. The line drivers 1506 may be implemented as current drivers or voltage drivers.

In the illustrated example, the receiver 1520 includes a buffer circuit 1522 and a multi-level comparison circuit 1532. The buffer circuit 1522 may include differential receivers 1524 coupled to the 3-wire link 1504 and the buffer circuit 1522 may provide analog difference signals 1526, 1528, 1530 to the multi-level comparison circuit 1532. The multi-level comparison circuit 1532 may include analog-to-digital converter (ADC) circuits 1534, 1536, 1538 that produce multibit state indicators 1542, 1544, 1546, each representing the result of comparisons of a corresponding difference signal 1526, 1528 or 1530 with multiple threshold voltage levels 1540. In the illustrated example, the ADC circuits 1534, 1536, 1538 are implemented using a set of comparators for each difference signal 1526, 1528, 1530 where the comparators in each set compare the difference signal 1526, 1528, 1530 to three threshold voltage levels 1540 (V+, V0, and V−). With reference also to the timing diagram 1800 in FIG. 18, the multiple threshold voltage levels 1540 may include a zero voltage threshold 1806, a +2V threshold 1808 and a −2V threshold 1810.

In some implementations, the functions performed by the buffer circuit 1522 and the multi-level comparison circuit 1532 may be combined. The ADC circuits 1534, 1536, 1538 may be implemented using different types of analog and digital circuits.

Figure 16:
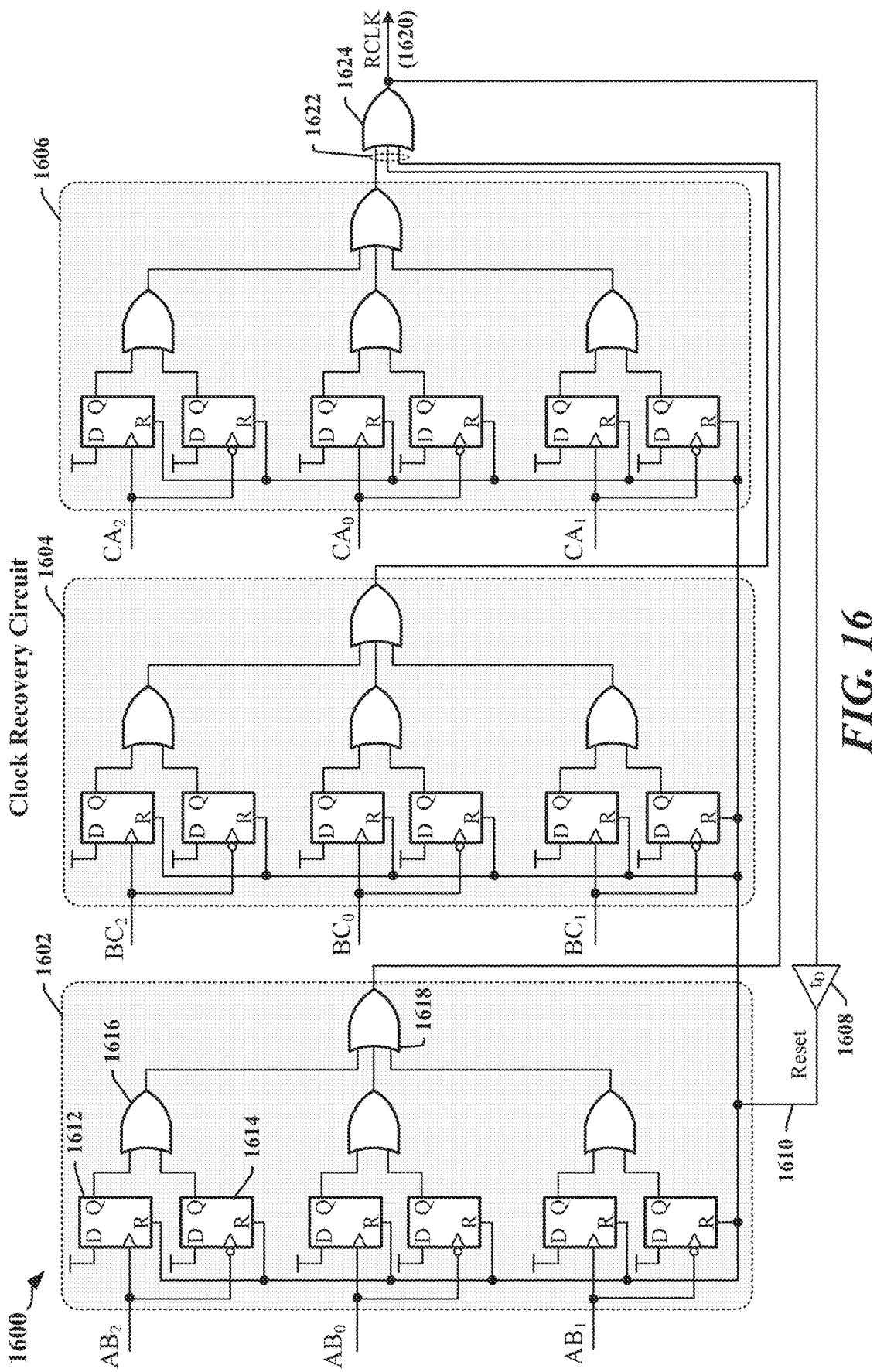
FIG. 16 illustrates a clock recovery circuit that can be used to generate timing for controlling capture symbols transmitted using a combination of 3-phase encoding and PAM-4 modulation in accordance with certain aspects of this disclosure.

FIG. 16 illustrates a clock recovery circuit 1600 that can be used to generate timing for controlling capture of symbols transmitted using a combination of 3-phase encoding and PAM-4 modulation. The clock recovery circuit 1600 is based on an adaptation of the clock recovery circuit 840 illustrated in FIG. 8 in accordance with certain aspects of this disclosure. In the illustrated clock recovery circuit 1600, each of three edge-detection circuits 1602, 1604, 1606 is configured to respond to a first transition in a multibit state indicator 1542, 1544 or 1546 for a corresponding difference signal 1526, 1528 or 1530 by driving one of the inputs 1622 of an OR gate 1624 high and further configured to maintain the high state until a reset signal 1610 is asserted. The output of the OR gate 1624 is driven high upon detection of the first transition of any difference signal 1526, 1528 or 1530 through any of the threshold voltage levels 1540. The output of the OR gate 1624 remains high until the reset signal 1610 is asserted. The reset signal 1610 resets each of the edge-detection circuits 1602, 1604, 1606 and is asserted when the high state of the output of the OR gate 1624 propagates through delay circuit 1608. The delay circuit 1608 is configured to provide a delay sufficient to mask subsequent transition detections at the boundary between two consecutively-transmitted symbols. Each detected transition can cause the output of the OR gate 1624 to be in the high state, and any transitions after the first-detected transition cause no observable difference in the state of the output of the OR gate 1624.

Detection of a transition and the operation of the reset signal 1610 produce a pulse at the output of the OR gate 1624, and the output of the OR gate 1624 may be used to provide a receive clock signal (RCLK 1620). RCLK 1620 can be used to capture the multibit state indicators 1542, 1544, 1546, which can serve as symbols used by a 3-phase, PAM-4 decoder. The duration of the delay provided by the delay circuit 1608 controls the pulse width of pulses in RCLK 1620.

In one example, a first-occurring transition occurs with respect to the AB difference signal 1526 and, more particularly, the first-occurring transition occurs when the AB difference signal 1526 crosses the +V threshold. The first edge-detection circuit 1602 receives the multibit state indicator 1542 in which first-occurring transition occurs, in the $AB_2$ indicator for the purpose of this discussion. A positive transition (low-to-high) clocks a high state through a first flipflop 1612 in the edge-detection circuit 1602, while a negative transition (high-to-low) clocks a high state through a second flipflop 1614 in the edge-detection circuit 1602. The outputs of the first flipflop 1612 and the second flipflop 1614 are provided to an OR gate 1616 and combined at OR gate 1618 with the outputs of the flipflops associated with $AB_0$ and $AB_1$. The output of the latter OR gate 1618 that drives the OR gate 1624 used to provide RCLK 1620.

Assuming that the flipflops in the edge-detection circuits 1602, 1604, 1606, including the first flipflop 1612 and the second flipflop 1614 included in the edge-detection circuit 1602, are reset before each symbol transition, the OR gate 1624 initially outputs a low logic level at the start of each symbol. When a first one of the edge-detection circuits 1602, 1604, 1606 detects a transition in any constituent of the multibit state indicators 1542, 1544 or 1546 the output of the OR gate 1624 transitions to a logic high level, initiating a clock pulse in RCLK 1620. The transition of the output of the OR gate 1624 from low to high corresponds to the rising edge of the clock pulse in RCLK 1620. There is a short time delay $t_1$ between detection of the earliest transition in the receiver outputs and the rising edge of the clock pulse due to propagation delays in the flipflops and other logic.

The output of the OR gate 1624 is fed back to the reset inputs of the flipflops in the edge-detection circuits 1602, 1604, 1606 through the delay circuit 1608. The transition in the output of the OR gate 1624 from low to high causes the delay circuit 1608 to assert the reset signal 1610 provided to the reset inputs of the flipflops after a time delay of $t_{delay}$. The reset signal 1610 clears the outputs of all of the flipflops to a low logic state 0. As a result, after a short delay $t_2$, the output of the OR gate 1624 transitions from high to low. The transition from high to low corresponds to the falling edge of the current clock pulse in RCLK 1620. Thus, the width of the clock pulse is approximately equal to the sum of $t_{delay}$ and $t_2$. The delay $t_{delay}$ provided by the delay circuit 1608 defines a masking interval during which further transitions in the multibit state indicators 1542, 1544 or 1546 have no effect on RCLK 820. The first occurring transition sets the output of the OR gate 1624 to the high logic state and subsequent transitions have no effect during the delay $t_{delay}$ provided by the delay circuit 1608.

When the output of the OR gate 1624 transitions from high to low, the delay circuit 1608 deasserts the reset signal 856 flipflops after the time delay $t_{delay}$ provided by the delay circuit 1608. After the reset signal 1610 is deasserted, the flipflops in the edge-detection circuits 1602, 1604, 1606 are ready to detect a transition associated with the next symbol.

Figure 17:
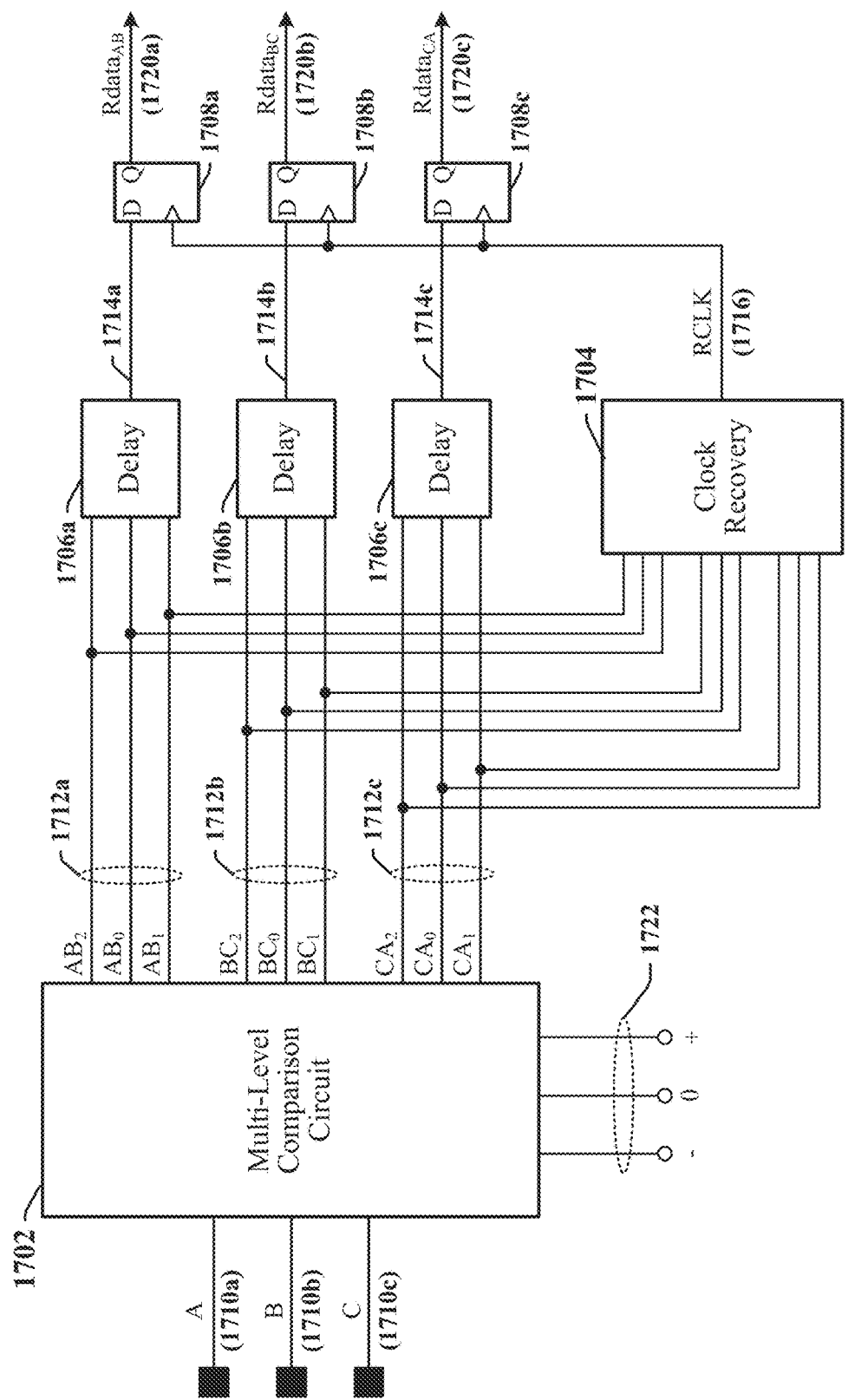
FIG. 17 illustrates a clock and data recovery circuit that may employ the clock recovery circuit illustrated in FIG. 16.

FIG. 17 illustrates a CDR circuit 1700 that may employ the clock recovery circuit 1600 illustrated in FIG. 16. A multi-level comparison circuit 1702 generates state indicators 1712a, 1712b and 1712c that represent the voltage state of three difference signals with respect to multiple threshold voltage levels 1722. The difference signals represent the difference between each pair of the three wires 1710a, 1710b, 1710c of a C-PHY serial bus. In one example, each of the state indicators 1712a, 1712b, 1712c includes a binary signal that indicates whether the corresponding difference signal is greater or less than a corresponding one of the threshold voltage levels 1722. A transition is detected when one of the binary signals switches state, indicating that a difference signal has crossed one of the threshold voltage levels 1722. A clock recovery circuit 1704 initiates a pulse in a receive clock signal (RCLK 1716) when a first transition is detected between consecutively-transmitted symbols. The clock signal is used to capture the state indicators 1712a, 1712b, 1712c using multibit flipflops 1708a-1708c. The multibit flipflops 1708a, 1708b and 1708c capture delayed versions of the state indicators 1714a, 1714b, 1714c to ensure that the state indicators 1712a, 1712b, 1712c are stable when sampled or captured to provide output symbol data 1720a, 1720b, 1720c. Delay circuits 1706a, 1706b, 1706c may be configured with delay values that effectively position the clock pulses in time to capture symbols between symbol boundaries, consistent with the timing shown in the timing diagram 1040 of FIG. 10.

The CDR circuit 1700 used to decode 3-phase, PAM-4 symbols may be consistent with the timing shown in the timing diagram 1040 of FIG. 10 in some respects but may be subject to tighter timing constraints due to the use of multiple threshold voltage levels 1722 to detect transitions in wire state. For example, the mask delay provided for C-PHY, PAM-4 decoding by the delay circuit 1608 of FIG. 16 may be greater than the mask delay provided for conventional C-PHY decoding by the delay circuit 854 of FIG. 8. An extended mask delay may be required to support the increased number of threshold crossing points when multiple threshold voltage levels 1722 are used and the use of non-zero voltage thresholds can increase the difference in time between earliest and latest transitions. In some instances, the mask delay can approach or exceed the unit interval (symbol interval) defined for an interface.

Figure 18:
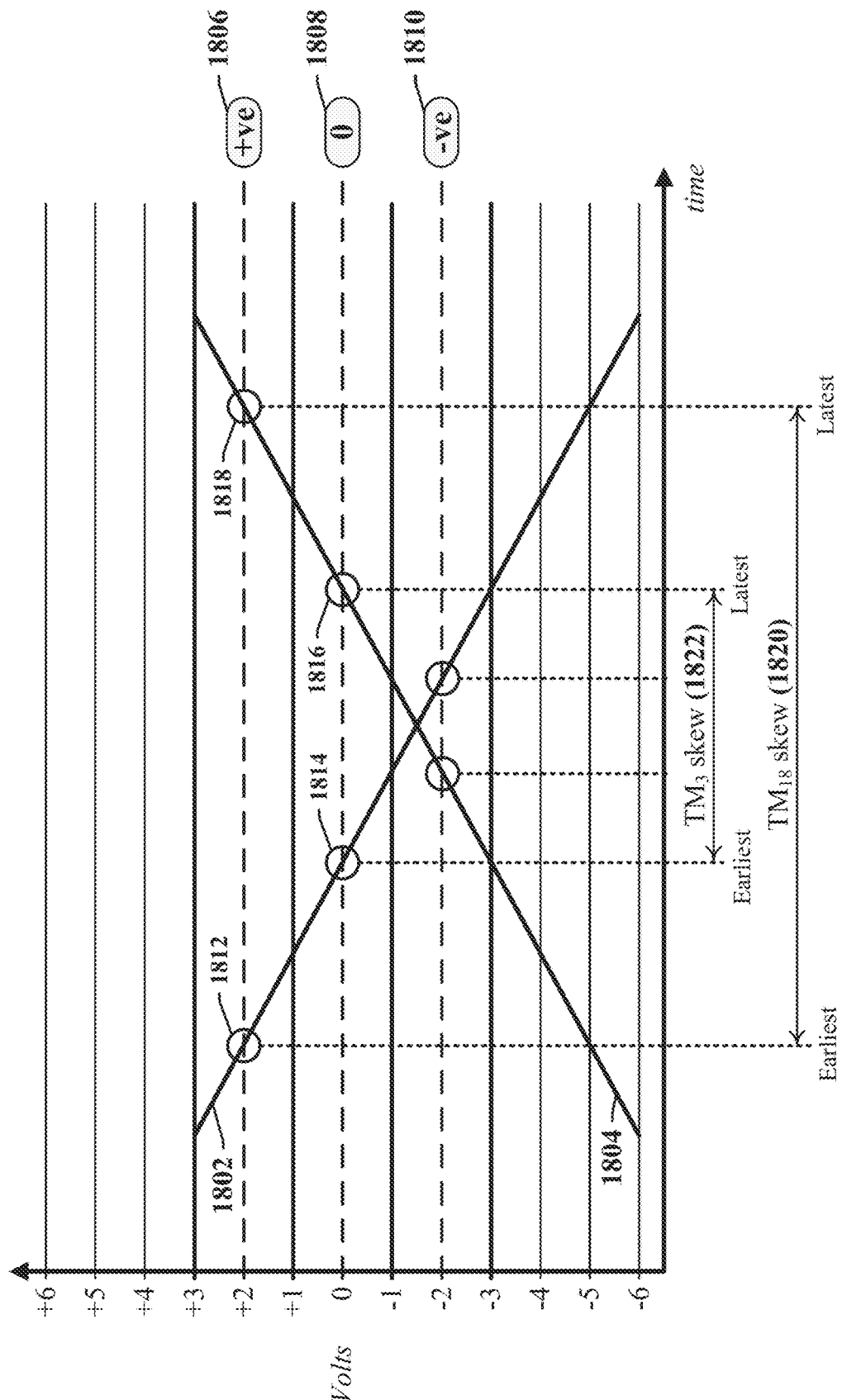
FIG. 18 is a timing diagram that illustrates certain aspects of threshold crossing detection in a C-PHY, PAM-4 interface.

FIG. 18 is a timing diagram 1800 that illustrates certain aspects of threshold crossing detection in a C-PHY, PAM-4 interface in which 18 signaling states are defined for a 3-wire serial bus. The timing diagram 1800 corresponds in some respects to the timing diagram 1200 of FIG. 12 and shows transitioning difference signals 1802, 1804. Three voltage thresholds 1806, 1808, 1810 are monitored in a C-PHY, PAM-4 interface to enable detection of transitions between one positive voltage level to another positive voltage level, transitions between one negative voltage level to another negative voltage level and transitions across the zero voltage threshold 1808 used in conventional C-PHY interfaces.

In a conventional C-PHY interface, the transitioning difference signals 1802, 1804 include a first difference signal 1802 that transitions from a weak +1 state to a strong −1 state and that results in an early transition 1814 through the zero-voltage threshold 1808, and a second difference signal 1804 that transitions from a strong −1 state to a weak +1 state and that results in a late transition 1816 through the zero-voltage threshold 1808. The transitions 1814, 1816 represent the maximum expected skew 1822 for a conventional C-PHY interface.

The same transitioning difference signals 1802, 1804 are measured differently in a C-PHY, PAM-4 interface. The first difference signal 1802 transitions through all three voltage thresholds 1806, 1808, 1810, with a first transition 1812 providing the first indication of a C-PHY, PAM-4 symbol boundary. The second difference signal 1804 transitions through all three voltage thresholds 1806, 1808, 1810, with a final transition 1818 providing the last indication of the C-PHY, PAM-4 symbol boundary. In the illustrated example, the first difference signal 1802 commences from a voltage state that has the minimum voltage difference from a threshold level while the second difference signal 1804 commences from a voltage state that has the maximum voltage difference from a threshold level. The time difference between the first transition 1812 and the final first transition 1818 constitutes the maximum expected skew 1820 for a C-PHY, PAM-4 interface. In the illustrated example, maximum expected skew 1820 for a C-PHY, PAM-4 interface is approximately 3 times greater than the maximum expected skew 1822 for a conventional C-PHY interface. The larger mask delay required for the C-PHY, PAM-4 interface may limit the data rate of the interface by requiring an increased symbol transmission time.

Certain aspects of this disclosure relate to a clock recovery circuit that can reduce the mask delay required for PAM-encoded C-PHY interfaces. A hierarchical, or multi-level, clock recovery circuit configured in accordance with certain aspects of the disclosure provides a receive clock that can be used for decoding symbol information from the difference signals generated in a C-PHY and PAM encoded interface. In some examples, the hierarchical clock recovery circuit can provide maximum mask delay used in a PAM-encoded C-PHY interface that has a duration that does not significantly exceed the duration of the maximum mask delay used in a conventional C-PHY interface.

Figure 19:
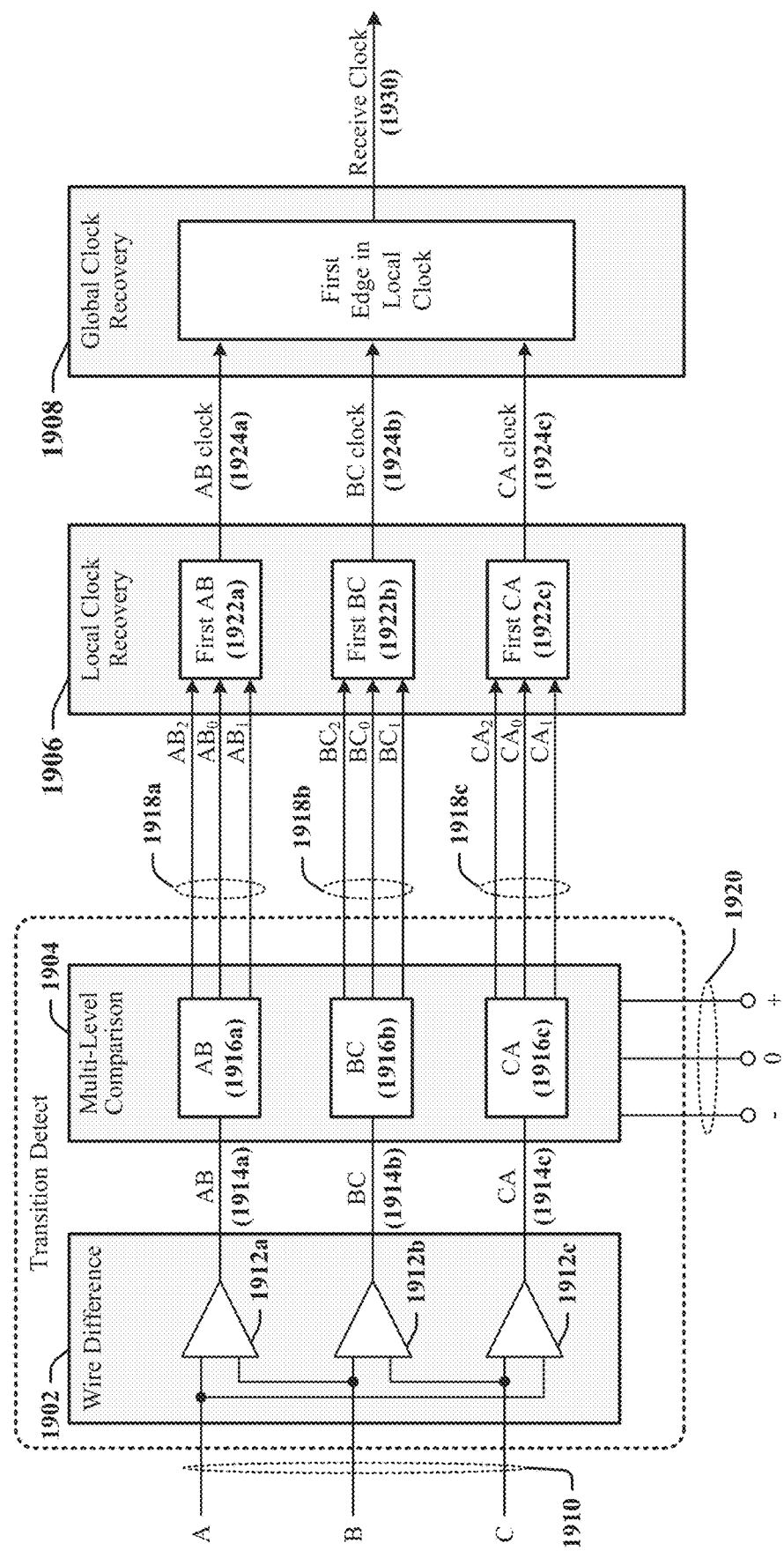
FIG. 19 illustrates a hierarchical clock recovery circuit configured for use in PAM encoded C-PHY interfaces in accordance with certain aspects disclosed herein.

FIG. 19 illustrates a hierarchical clock recovery circuit 1900 configured for use in PAM encoded C-PHY interfaces in accordance with certain aspects disclosed herein. In the illustrated hierarchical clock recovery circuit 1900, a receive clock signal 1930 is generated using two clock recovery circuits 1906, 1908. A local clock recovery circuit 1906 produces first-level clock signals, which may be referred to as local clock signals 1924a, 1924b and 1924c. The local clock signals 1924a, 1924b and 1924c are provided to a global clock recovery circuit 1908 that generates a second-level clock signal, which may be referred to as the receive clock signal 1930, based on the local clock signals 1924a-1924c. The illustrated example is configured for PAM-4 encoded C-PHY signals. In some implementations, the hierarchical clock recovery circuit 1900 may be adapted or configured to support encoding schemes that use other levels of PAM, including PAM-3 and PAM-8.

The illustrated hierarchical clock recovery circuit 1900 employs transition detect circuits that include a wire difference circuit 1902 and a multi-level comparison circuit 1904. The wire difference circuit 1902 includes differential receivers 1912a, 1912b, 1912c that generate difference signals 1914a, 1914b, 1914c representative of the difference in voltage level on each pair of wires in the trio 1910, or difference in current flow through each wire in the pairs of wires in the trio 1910. The multi-level comparison circuit 1904 corresponds to the multi-level comparison circuit 1532 in FIG. 15 and includes ADC circuits 1916a, 1916b, 1916c that may be configured to produce state indicators, each state indicator representing the result of comparison of a corresponding difference signal 1914a, 1914b and 1914c with one of three threshold voltage levels 1920. In one example, three state indicators are provided as a multibit difference signal 1918a, 1918b, 1918c by each of the ADC circuits 1916a, 1916b, 1916c. In other examples, different numbers of state indicators may be provided. Each ADC circuit 1916a, 1916b, 1916c produces a multibit difference signal 1918a, 1918b or 1918c that represents the state of each of the corresponding difference signal 1914a, 1914b or 1914c with respect to three threshold voltage levels 1920. The ADC circuits 1916a-1916c may be implemented using a set of comparators for each of the difference signals 1914a, 1914b and 1914c, where the comparators in each set compare the corresponding difference signal 1914a, 1914b or 1914c to three threshold voltage levels 1920.

The local clock recovery circuit 1906 is configured in accordance with certain aspects of the disclosure to generate local clock signals 1924a, 1924b, 1924c from threshold crossings in the difference signals 1914a, 1914b, 1914c. The state of the difference signals 1914a, 1914b, 1914c may be represented by the multibit difference signals 1918a, 1918b or 1918c. Each of the clock recovery circuits 1922a, 1922b or 1922c is configured to receive one of the multibit difference signals 1918a, 1918b or 1918c and to initiate a clock pulse in a corresponding local clock signal 1924a, 1924b or 1924c in response to a first detected transition in the received difference signal 1914a, 1914b or 1914c at each symbol boundary. Each clock recovery circuit 1922a, 1922b or 1922c is further configured to mask subsequent transitions detected in the received difference signal 1914a, 1914b or 1914c after a first transition is detected at the symbol boundary.

The local clock signals 1924a, 1924b, 1924c are provided to the global clock recovery circuit 1908, which is configured to generate a receive clock signal 1930 that can be used to sample symbol information, including delayed versions of the difference signals 1914a, 1914b, 1914c. The local clock signals 1924a, 1924b, 1924c include no more than one edge for each symbol boundary. In one example, a single pulse is generated at the symbol boundary by each of the clock recovery circuit 1922a, 1922b and/or 1922c that detects a transition in its corresponding difference signals 1914a, 1914b or 1914c at the symbol boundary. The global clock recovery circuit 1908 is configured to initiate a single pulse upon detection of a first edge in the local clock signals 1924a, 1924b, 1924c at each symbol boundary. The global clock recovery circuit 1908 is further configured to mask subsequent edges in the local clock signals 1924a, 1924b, 1924c at the symbol boundary.

The mask used by the global clock recovery circuit 1908 may be configured as a delay that corresponds to the difference in timing between a fastest possible first transition in a difference signal 1914a, 1914b or 1914c and a slowest possible first transition in the difference signal 1914a, 1914b or 1914c. The mask used by the global clock recovery circuit 1908 can significantly reduce the skew associated with signal transitions at symbol boundaries in PAM encoded C-PHY interfaces.

Figure 20:
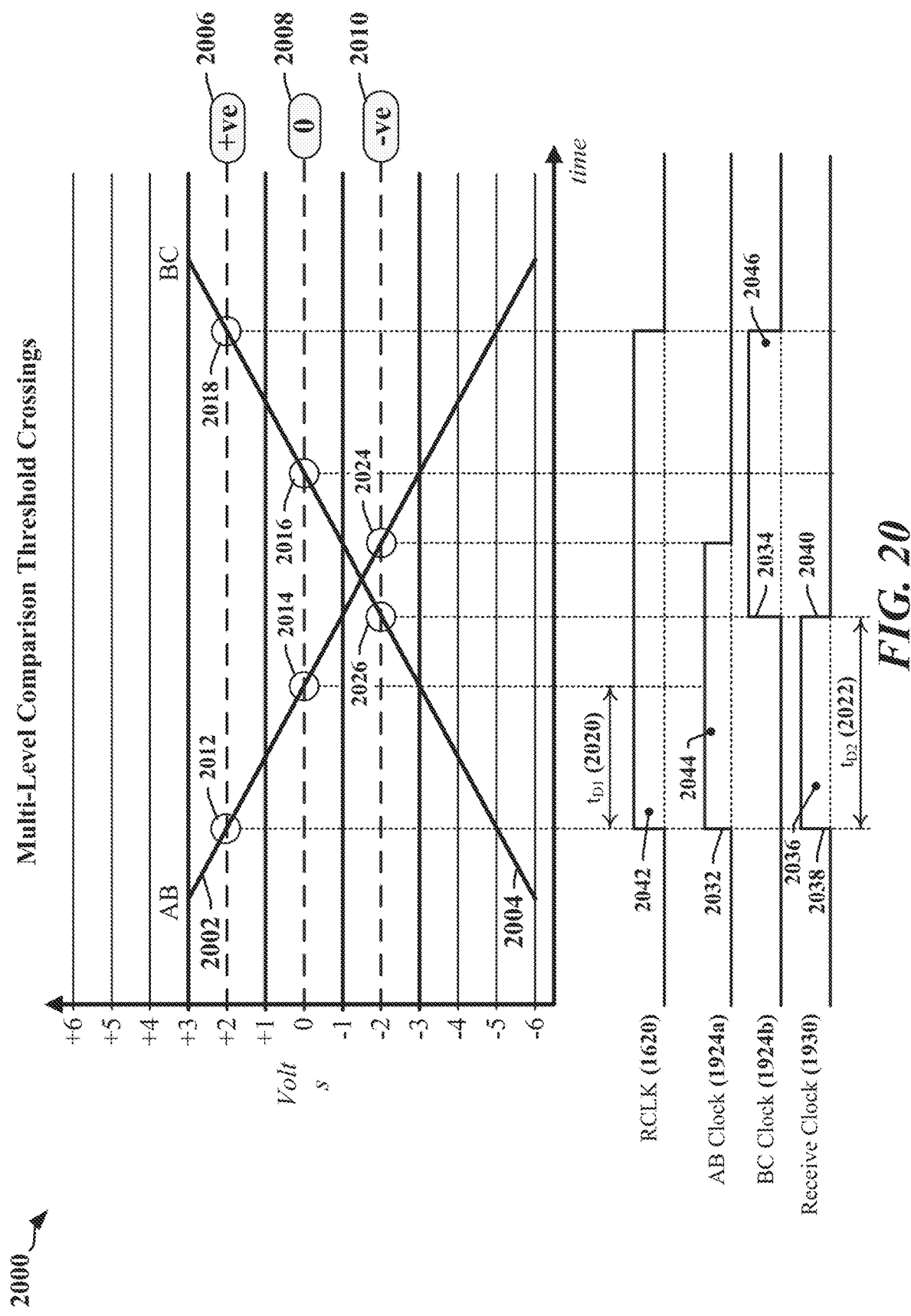
FIG. 20 is a timing diagram that illustrates certain aspects of timing associated with the hierarchical clock recovery circuit illustrated in FIG. 19.

FIG. 20 is a timing diagram 2000 that illustrates certain aspects of timing associated with the hierarchical clock recovery circuit 1900 illustrated in FIG. 19. The timing diagram 2000 corresponds to a C-PHY, PAM-4 interface in which 18 signaling states are defined for a 3-wire serial bus. The timing diagram 2000 illustrates a snapshot showing two difference signals 2002, 2004 at a boundary between two consecutively-transmitted symbols. The difference signals 2002, 2004 that represent "worst case" transition timing with respect to skew time. The difference signals 2002, 2004 are monitored to enable detection of transitions across a positive voltage threshold 2006 transitions across a negative voltage threshold 2010 and transitions across the zero voltage threshold 2008 that is used in conventional C-PHY interfaces.

The AB difference signal 2002 transitions through all three voltage thresholds 2006, 2008, 2010, with a first transition 2012 providing the first indication of a C-PHY, PAM-4 symbol boundary. The BC difference signal 2004 transitions through all three voltage thresholds 2006, 2008, 2010, with a final transition 2018 providing the last indication of the C-PHY, PAM-4 symbol boundary. In the illustrated example, the AB difference signal 2002 commences from a voltage state that has the minimum voltage difference from a threshold level while the BC difference signal 2004 commences from a voltage state that has the maximum voltage difference from a threshold level. The time difference between the first transition 2012 and the final first transition 2018 constitutes the maximum expected skew between transitions for a C-PHY, PAM-4 interface. The RCLK 1620 signaling produced by the clock recovery circuit 1600 of FIG. 16 is provided for comparison.

In the illustrated example, a first local clock signal 1924a generated from the AB difference signal 2002 includes a rising edge 2032 generated upon detection of the first transition 2012 across a threshold level in the AB difference signal 2002. A masking delay corresponding to the total of the delay between transitions 2012 and 2014 and between transitions 2014 and 2024 across threshold levels is used to prevent multiple pulses in the first local clock signal 1924a. The delay between the transitions 2012 and 2014 across threshold levels and the delay between the transitions 2014 and 2024 are nominally the same and may be referred to as a difference transition delay 2020. The masking delay may be set at $2 \times t_{D1}$.

A second local clock signal 1924b generated from the BC difference signal 2004 includes a rising edge 2034 generated upon detection of a first transition 2026 across a threshold level in the BC difference signal 2004. In the illustrated example, the difference transition delay 2020 is the same for the AB difference signal 2002 and the BC difference signal 2004, and the masking delay corresponding to the total of the delay between transitions 2026 and 2016 and between transitions 2016 and 2018 is used to prevent multiple pulses in the second local clock signal 1924b. The masking delay may be set at $2 \times t_{D1}$.

The masking delay used to generate the pulse 2044, 2046 is significantly shorter than that masking delay to generate pulse 2042 in RCLK 1620.

According to certain aspects of this disclosure, the global clock recovery circuit 1908 can provide a pulse 2036 in the receive clock signal 1930 that has a rising edge 2038 generated in response to the rising edge 2032 in the first local clock signal 1924a and a falling edge 2040 that is coincident with the rising edge 2034 in the second local clock signal 1924b. The difference in timing between the edges 2038, 2040 is controlled by a mask delay ($t_{D2}$ 2022) that is configured to mask all transitions across threshold levels in the multibit difference signals 1918a and 1918b occurring at the symbol boundary after the rising edge 2032 in the first local clock signal 1924a. The pulse 2036 in the receive clock signal 1930 terminates before all possible transitions across threshold levels in the multibit difference signals 1918a and 1918b.

In the illustrated example, the first local clock signal 1924a is generated from the AB difference signal 2002 using a mask delay that can be individually and dynamically configured or calibrated to cover the maximum elapsed time between transitions 2012, 2024 of both non-zero voltage thresholds 2006, 2010, and the second local clock signal 1924b is generated from the BC difference signal 2004 using a mask delay that can be individually and dynamically configured or calibrated to cover the maximum elapsed time between transitions 2026, 2018 of both non-zero voltage thresholds 2006, 2010.

The masking delay used to generate the pulse 2036 is significantly shorter than the masking delay to generate pulses 2042 in RCLK 1620. The global clock recovery circuit 1908 initiates pulses 2036 based on rising edges 2032, 2034 in the pulses 2044, 2046 in the local clock signals 1924a-1924c and can ignore later-occurring transitions in the difference signals 1914a-1914c, which are masked by the clock recovery circuits 1922a-1922c.

Figure 21:
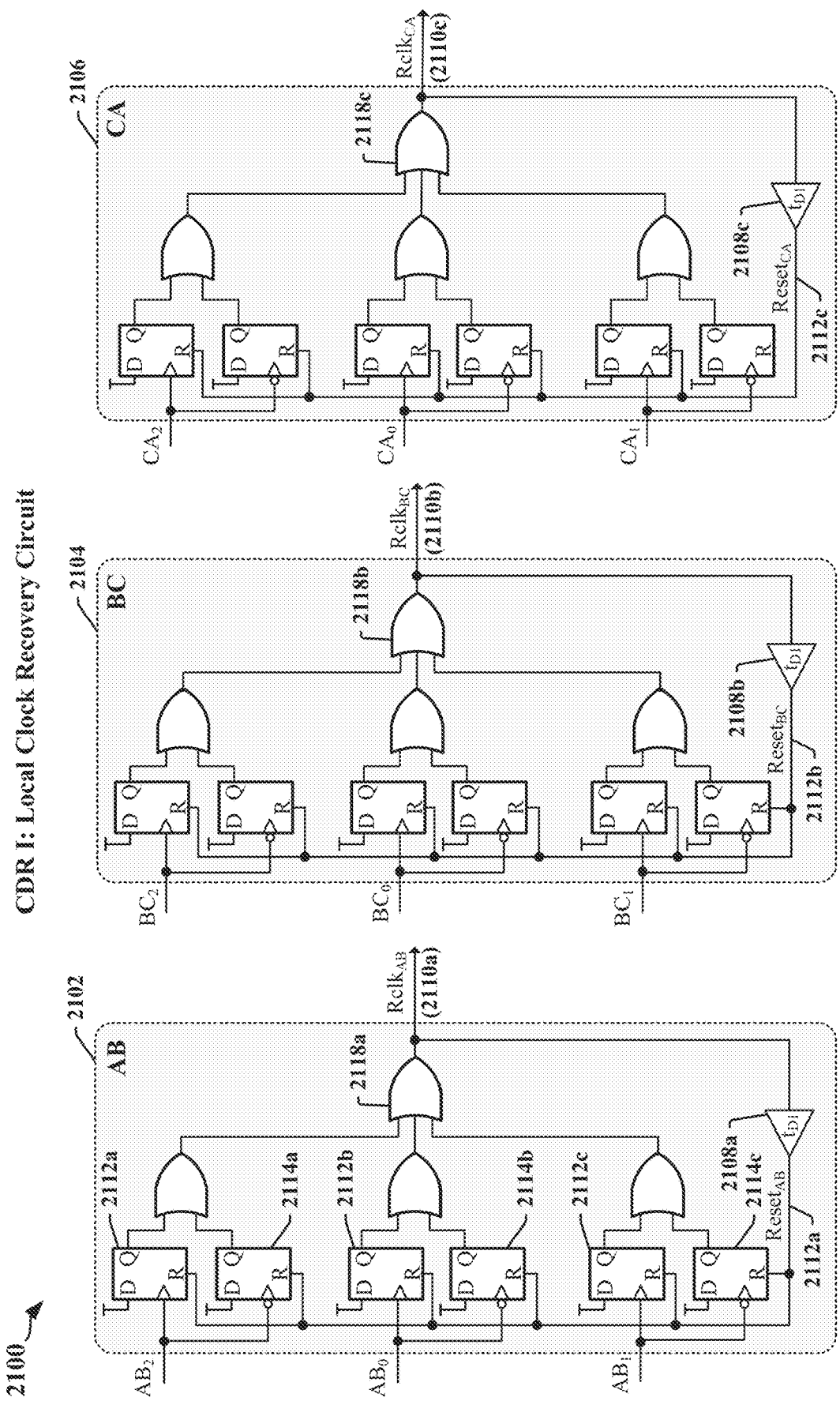
FIG. 21 illustrates a first example of a local clock recovery provided in accordance with certain aspects of the present disclosure.

FIG. 21 illustrates a local clock recovery circuit 2100 in a first example of a CDR circuit configured in accordance with certain aspects of the present disclosure. The local clock recovery circuit 2100 may correspond to the local clock recovery circuit 1906 of FIG. 19 and has a first local clock recovery circuit 2102 that receives the multibit difference signal 1918a provided by the ADC circuit 1916a, a second local clock recovery circuit 2104 that receives the multibit difference signal 1918b, provided by the ADC circuit 1916b, and a third local clock recovery circuit 2106 that receives the multibit difference signal 1918c provided by the ADC circuit 1916c.

In the illustrated example, each multibit difference signal 1918a-1918c includes three signals. A first multibit difference signal 1918a includes a first signal $AB_0$ representative of the state of the AB difference signal 1914a with respect to a zero-volt threshold, a second signal $AB_1$ representative of the state of the AB difference signal 1914a with respect to a negative voltage threshold, and a third signal $AB_2$ representative of the state of the AB difference signal 1914a with respect to a positive voltage threshold. A second multibit difference signal 1918b includes a first signal $BC_0$ representative of the state of the BC difference signal 1914b with respect to a zero-volt threshold, a second signal $BC_1$ representative of the state of the BC difference signal 1914b with respect to a negative voltage threshold, and a third signal $BC_2$ representative of the state of the BC difference signal 1914a with respect to a positive voltage threshold. A third multibit difference signal 1918c includes a first signal $CA_0$ representative of the state of the CA difference signal 1914c with respect to a zero-volt threshold, a second signal $CA_1$ representative of the state of the CA difference signal 1914c with respect to a negative voltage threshold, and a third signal $CA_2$ representative of the state of the CA difference signal 1914c with respect to a positive voltage threshold.

Each local clock recovery circuit 2102, 2104, 2106 has an OR gate 2118a, 2118b, 2118c that drives the corresponding local clock signal 2110a, 2110b, 2110c. Each local clock recovery circuit 2102, 2104, 2106 has a delay circuit 2108a, 2108b, 2108c that provides the masking delay ($2 \times t_{D1}$) used to ensure that no more than a single pulse is generated in each corresponding local clock signal 2110a, 2110b, 2110c at each symbol boundary.

Each local clock recovery circuit 2102, 2104, 2106 has a first set of flipflops 2112a-2112c and a second set of flipflops 2114a-2114c. The clock inputs of the flipflops 2112a-2112c, 2114a-2114c in each local clock recovery circuit 2102, 2104, 2106 are coupled to corresponding signals in the multibit difference signals 1918a-1918c. In the example of the AB local clock recovery circuit 2102, the $AB_2$ signal is coupled to the clock inputs of flipflops 2112a and 2114a that are triggered by opposite transitions in the $AB_2$ signal, the $AB_0$ signal is coupled to the clock inputs of flipflops 2112b and 2114b that are triggered by opposite transitions in the $AB_0$ signal and the $AB_1$ signal is coupled to the clock inputs of flipflops 2112c and 2114c that are triggered by opposite transitions in the $AB_1$ signal. A transition in the $AB_2$ signal causes a high voltage state to be clocked through one of the flipflops 2112a or 2114a and the logic circuit in the AB local clock recovery circuit 2102 responds by causing the OR gate 2118a drive local clock signal 2110a high. A transition in the $AB_0$ signal causes a high voltage state to be clocked through one of the flipflops 2112b or 2114b and the logic circuit in the AB local clock recovery circuit 2102 responds by causing the OR gate 2118a drive local clock signal 2110a high. A transition in the $AB_1$ signal causes a high voltage state to be clocked through one of the flipflops 2112c or 2114c and the logic circuit in the AB local clock recovery circuit 2102 responds by causing the OR gate 2118a drive local clock signal 2110a high.

The output of the OR gate 2118a is fed back through a delay circuit 2108a, and a high logic state at the output of the OR gate 2118a resets all of the flipflops 2112a-2112c and 2114a-2114c in the AB local clock recovery circuit 2102 after a delay provided by the delay circuit 2108a. The delay circuit 2108a may be configured to mask subsequent threshold transitions by the AB difference signal 1914a at the same symbol boundary. In the example illustrated in FIG. 20, the delay circuit 2108a may be configured or calibrated to provide a delay that is double the difference transition delay 2020 ($2 \times t_{D1}$).

The BC and CA local clock recovery circuits 2104 and 2106 operate in the same manner as the AB local clock recovery circuit 2102. At each symbol boundary, each of the local clock recovery circuits 2102, 2104, 2106 produces no pulse or a single pulse in its corresponding local clock signal 2110a, 2110b, 2110c. The single pulse may be characterized as a single rising edge followed by a single falling edge.

Figure 22:
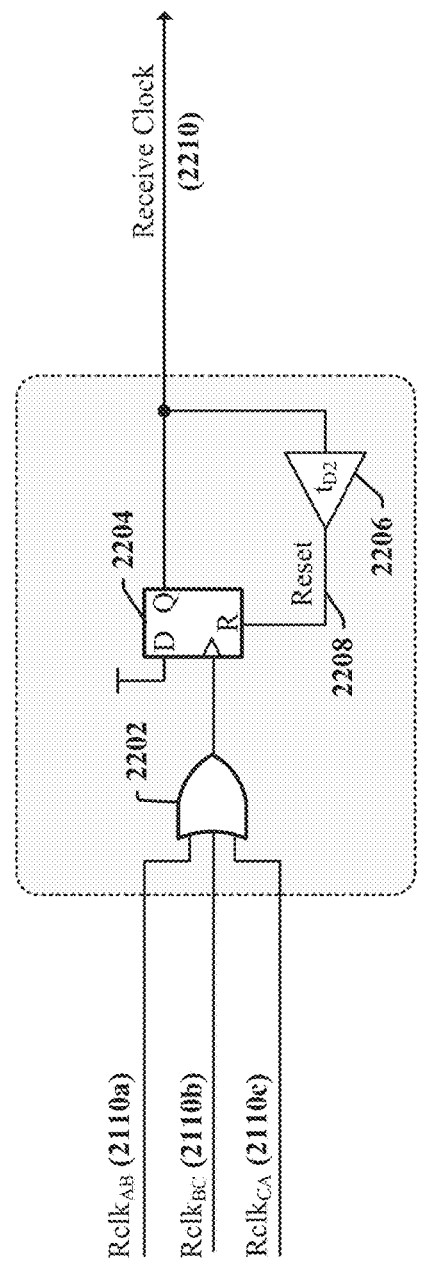
FIG. 22 illustrates a global clock recovery circuit configured in accordance with certain aspects of this disclosure.

FIG. 22 illustrates a global clock recovery circuit 2200 in a first example of a CDR circuit configured in accordance with certain aspects of this disclosure. The global clock recovery circuit 2200 responds to the local clock signals 2110a, 2110b, 2110c output by the local clock recovery circuits 2102, 2104, 2106 of FIG. 21. The local clock signals 2110a, 2110b, 2110c are OR'ed using an OR gate 2202 that drives the clock input of a flipflop 2204. Given that the local clock signals 2110a, 2110b, 2110c are in a logic 0 state between symbol boundaries, the output of the OR gate 2202 transitions from the logic 0 state to the logic 1 state when the first local clock signal 2110a, 2110b or 2110c transitions to the logic 1 state.

A rising edge in the output of OR gate 2202 causes a high voltage state to be clocked through the flipflop 2204. A clock pulse is provided in at least one of the local clock signals 2110a, 2110b, 2110c at every symbol boundary due to the requirement that symbols are not repeated in consecutive symbol transmission intervals provided by a C-PHY interface. Accordingly, the output of the flipflop 2204 transitions to a high state at each symbol boundary. The output of the flipflop 2204 is provided to a delay circuit 2206 that controls the timing of a reset signal 2208 used to clear the flipflop 2204. The delay circuit 2206 may be configured or calibrated to delay passage of the high state from the flipflop 2204 to the reset signal 2208 by a duration corresponding to $t_{D2}$ 2022 illustrated in FIG. 20. The delay is sufficient to mask any subsequent rising edges in the local clock signals 2110a, 2110b, 2110c. The reset signal 2208 causes the output of the flipflop 2204 to return to the low logic state, thereby completing a pulse. The pulse is provided in the receive clock signal 2210 output by the global clock recovery circuit 2200. The receive clock signal 2210 may be provided to the data recovery circuit 2500 illustrated in FIG. 25, the data recovery circuit 2600 illustrated in FIG. 26 or the data recovery circuit 2700 illustrated in FIG. 27.

Figure 23:
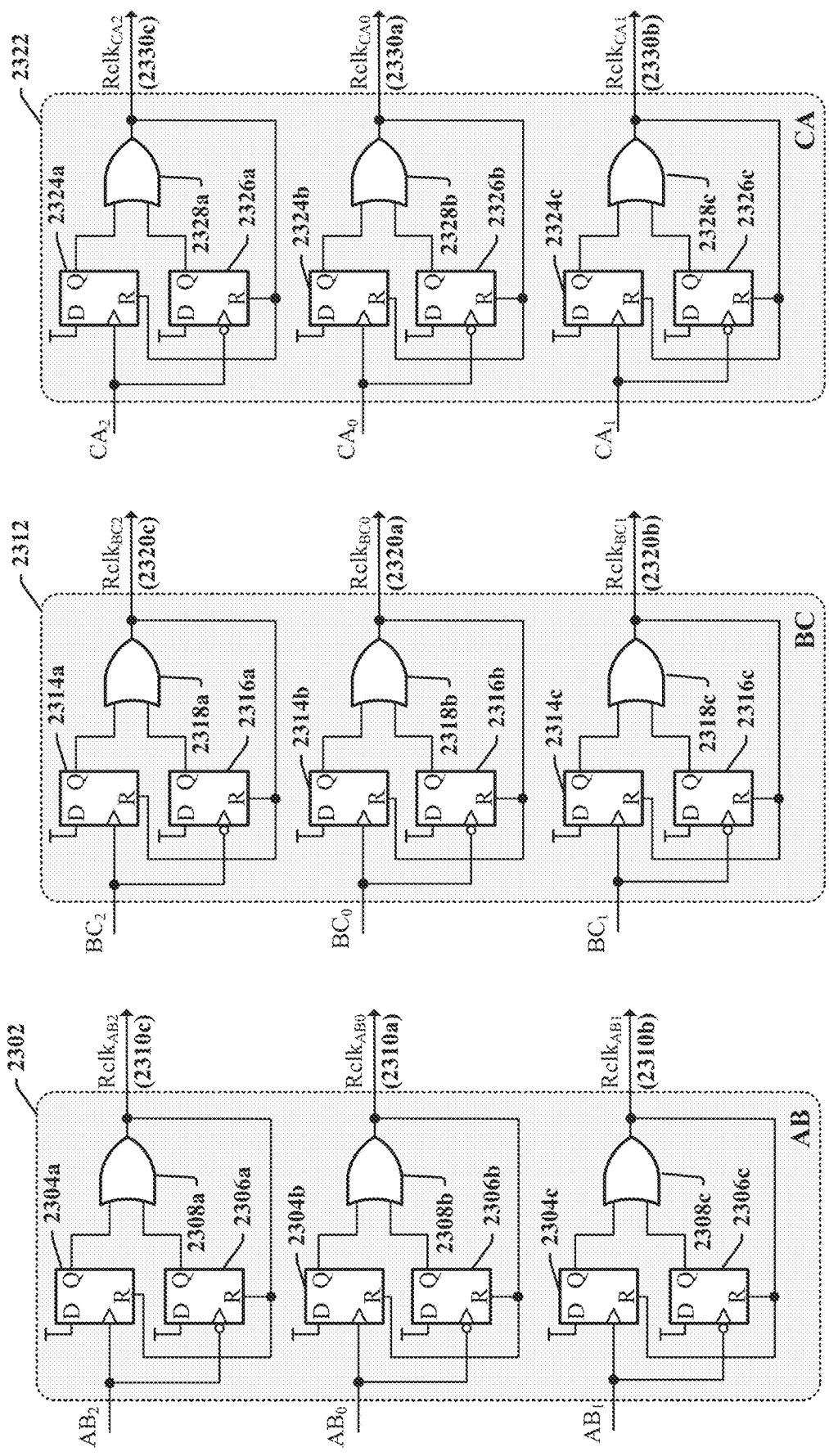
FIG. 23 illustrates a second example of a local clock recovery provided in accordance with certain aspects of the present disclosure.

FIG. 23 illustrates a first-level clock recovery circuit 2300 in a second example of a CDR circuit configured in accordance with certain aspects of the present disclosure. In this example, the first-level clock recovery circuit 2300 provides an additional level of receive clocks for use in a hierarchical clock recovery circuit. The first-level clock recovery circuit 2300 has a first first-level clock recovery circuit 2302 that receives the multibit difference signal 1918a provided by the ADC circuit 1916a, a second first-level clock recovery circuit 2312 that receives the multibit difference signal 1918b, provided by the ADC circuit 1916b, and a third first-level clock recovery circuit 2322 that receives the multibit difference signal 1918c provided by the ADC circuit 1916c.

In the illustrated example, each multibit difference signal 1918a-1918c includes three signals. A first multibit difference signal 1918a includes a first signal $AB_0$ representative of the state of the AB difference signal 1914a with respect to a zero-volt threshold, a second signal $AB_1$ representative of the state of the AB difference signal 1914a with respect to a negative voltage threshold, and a third signal $AB_2$ representative of the state of the AB difference signal 1914a with respect to a positive voltage threshold. A second multibit difference signal 1918b includes a first signal $BC_0$ representative of the state of the BC difference signal 1914b with respect to a zero-volt threshold, a second signal $BC_1$ representative of the state of the BC difference signal 1914b with respect to a negative voltage threshold, and a third signal $BC_2$ representative of the state of the BC difference signal 1914a with respect to a positive voltage threshold. A third multibit difference signal 1918c includes a first signal $CA_0$ representative of the state of the CA difference signal 1914c with respect to a zero-volt threshold, a second signal $CA_1$ representative of the state of the CA difference signal 1914c with respect to a negative voltage threshold, and a third signal $CA_2$ representative of the state of the CA difference signal 1914c with respect to a positive voltage threshold.

Each first-level clock recovery circuit 2302, 2312, 2322 generates a first-level clock signal for each input signal that is part of its corresponding multibit difference signal 1918a-1918c. In the illustrated example, an AB first-level clock recovery circuit 2302 includes a first set of flipflops 2304a-2304c and a second set of flipflops 2306a-2306c. The $AB_2$ signal is coupled to the clock inputs of flipflops 2304a and 2306a that are triggered by opposite transitions in the $AB_2$ signal, the $AB_0$ signal is coupled to the clock inputs of flipflops 2304b and 2306b that are triggered by opposite transitions in the $AB_0$ signal and the $AB_1$ signal is coupled to the clock inputs of flipflops 2304c and 2306c that are triggered by opposite transitions in the $AB_1$ signal. A transition in the $AB_2$ signal causes a high voltage state to be clocked through one of the flipflops 2304a or 2306a causing the OR gate 2308a to drive the first-level clock signal 2310c high. A transition in the $AB_0$ signal causes a high voltage state to be clocked through one of the flipflops 2304b or 2306b causing the OR gate 2308b to drive the first-level clock signal 2310a high. A transition in the $AB_1$ signal causes a high voltage state to be clocked through one of the flipflops 2304c or 2306c causing the OR gate 2308c to drive the first-level clock signal 2310b high. The output of the OR gates 2308a-2308c are fed back to the reset inputs of respective pairs of flipflops 2304a/2306a, 2304b/2306b or 2304c/2306c. The flipflops 2304a-2304c and 2306a-2306c are cleared shortly after their respective reset inputs are asserted, resulting in short pulses being provided in the first-level clock signals 2310a-2310c. The pulses have a duration that corresponds to the propagation delays associated with the flipflops 2304a, 2306a and the OR gate 2308a.

A BC first-level clock recovery circuit 2312 includes a first set of flipflops 2314a-2314c and a second set of flipflops 2316a-2316c. The $BC_2$ signal is coupled to the clock inputs of flipflops 2314a and 2316a that are triggered by opposite transitions in the $BC_2$ signal, the $BC_0$ signal is coupled to the clock inputs of flipflops 2314b and 2316b that are triggered by opposite transitions in the $BC_0$ signal and the $BC_1$ signal is coupled to the clock inputs of flipflops 2314c and 2316c that are triggered by opposite transitions in the $BC_1$ signal. A transition in the $BC_2$ signal causes a high voltage state to be clocked through one of the flipflops 2314a or 2316a causing the OR gate 2318a to drive the first-level clock signal 2320c high. A transition in the $BC_0$ signal causes a high voltage state to be clocked through one of the flipflops 2314b or 2316b causing the OR gate 2318b to drive the first-level clock signal 2320a high. A transition in the $BC_1$ signal causes a high voltage state to be clocked through one of the flipflops 2314c or 2316c causing the OR gate 2318c to drive the first-level clock signal 2320b high. The output of the OR gates 2318a-2318c are fed back to the reset inputs of respective pairs of flipflops 2314a/2316a, 2314b/2316b or 2314c/2316c. The flipflops 2314a-2314c and 2316a-2316c are cleared shortly after their respective reset inputs are asserted, resulting in short pulses being provided in the first-level clock signals 2320a-2320c. The pulses have a duration that corresponds to the propagation delays associated with the flipflops 2314a, 2316a and the OR gate 2318a.

A CA first-level clock recovery circuit 2322 includes a first set of flipflops 2324a-2324c and a second set of flipflops 2326a-2326c. The $CA_2$ signal is coupled to the clock inputs of flipflops 2324a and 2326a that are triggered by opposite transitions in the $CA_2$ signal, the $CA_0$ signal is coupled to the clock inputs of flipflops 2324b and 2326b that are triggered by opposite transitions in the $CA_0$ signal and the $CA_1$ signal is coupled to the clock inputs of flipflops 2324c and 2326c that are triggered by opposite transitions in the $CA_1$ signal. A transition in the $CA_2$ signal causes a high voltage state to be clocked through one of the flipflops 2324a or 2326a causing the OR gate 2328a to drive the first-level clock signal 2330c high. A transition in the $CA_0$ signal causes a high voltage state to be clocked through one of the flipflops 2324b or 2326b causing the OR gate 2328b to drive the first-level clock signal 2330a high. A transition in the $CA_1$ signal causes a high voltage state to be clocked through one of the flipflops 2324c or 2326c causing the OR gate 2328c to drive the first-level clock signal 2330b high. The output of the OR gates 2328a-2328c are fed back to the reset inputs of respective pairs of flipflops 2324a/2326a, 2324b/2326b or 2324c/2326c. The flipflops 2324a-2324c and 2326a-2326c are cleared shortly after their respective reset inputs are asserted, resulting in short pulses being provided in the first-level clock signals 2330a-2330c. The pulses have a duration that corresponds to the propagation delays associated with the flipflops 2324a, 2326a and the OR gate 2328a.

The first-level clock signals 2310a-2310c, 2320a-2320c and 2330a-2330c may be used to maximize the sampling windows available for capturing the individual bits in the multibit difference signals 1918a-1918c.

Figure 24:
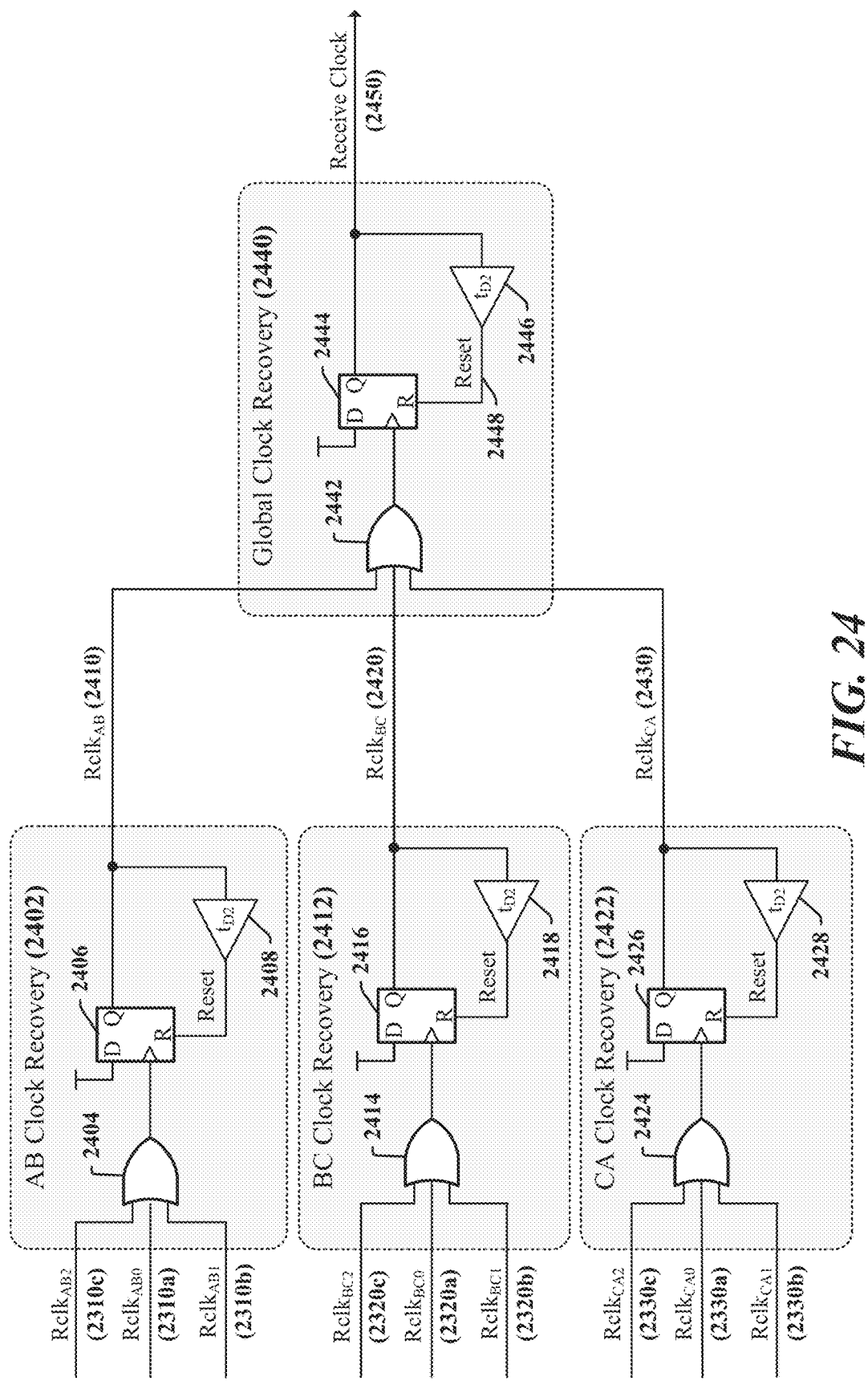
FIG. 24 illustrates a global clock recovery circuit configured in accordance with certain aspects of this disclosure.

FIG. 24 illustrates a circuit 2400 that includes second-level clock recovery circuits 2402, 2412, 2422 and a global clock recovery circuit 2440 configured in accordance with certain aspects of this disclosure provided in the second example of a CDR circuit. The second-level and global clock recovery circuits 2400 respond to the first-level clock signals 2310a-2310c, 2320a-2320c and 2330a-2330c output by the first-level clock recovery circuits 2302, 2312, 2322 illustrated in FIG. 23. The global clock recovery circuit 2440 in the second CDR circuit corresponds to the global clock recovery circuit 2200 in the first CDR circuit (see FIG. 22).

An AB clock recovery circuit 2402 has an OR gate 2404 that receives the first-level clock signals 2310a-2310c generated by the first-level clock recovery circuit 2302. The output of the OR gate 2404 is provided to the clock input of a flipflop 2406. A rising edge in the output of the OR gate 2404 causes a high voltage state to be clocked through the flipflop 2406. The output of the flipflop 2406 provides the AB second-level clock signal 2410 and is fed back to the reset input of the flipflop 2406 through a delay circuit 2408 that provides a masking delay. The masking delay is used to suppress any subsequent rising edges in the first-level clock signals 2310a-2310c at each symbol boundary.

A BC clock recovery circuit 2412 has an OR gate 2414 that receives the first-level clock signals 2320a-2320c generated by the first-level clock recovery circuit 2312. The output of the OR gate 2414 is provided to the clock input of a flipflop 2416. A rising edge in the output of the OR gate 2414 causes a high voltage state to be clocked through the flipflop 2416. The output of the flipflop 2416 provides the BC second-level clock signal 2420 and is fed back to the reset input of the flipflop 2416 through a delay circuit 2418 that provides a masking delay. The masking delay is used to suppress any subsequent rising edges in the first-level clock signals 2320a-2320c at each symbol boundary.

A CA clock recovery circuit 2422 has an OR gate 2424 that receives the first-level clock signals 2330a-2330c generated by the first-level clock recovery circuit 2322. The output of the OR gate 2424 is provided to the clock input of a flipflop 2426. A rising edge in the output of the OR gate 2424 causes a high voltage state to be clocked through the flipflop 2426. The output of the flipflop 2426 provides the CA second-level clock signal 2430 and is fed back to the reset input of the flipflop 2426 through a delay circuit 2428 that provides a masking delay. The masking delay is used to suppress any subsequent rising edges in the first-level clock signals 2330a-2330c at each symbol boundary.

The second-level clock signals 2410, 2420, 2430 are provided to the inputs of an OR gate 2442 in the global clock recovery circuit 2440. A rising edge in the output of OR gate 2442 causes a high voltage state to be clocked through a flipflop 2444. A clock pulse is provided in at least one of the second-level clock signals 2410, 2420, 2430 at every symbol boundary due to the requirement that symbols are not repeated in consecutive symbol transmission intervals provided by a C-PHY interface. Accordingly, the output of the flipflop 2444 transitions to a high state at each symbol boundary. The output of the flipflop 2444 is provided to a delay circuit 2446 that controls the timing of a reset signal 2448 used to clear the flipflop 2444. The delay circuit 2446 may be configured or calibrated to delay passage of the high state from the flipflop 2444 to the reset signal 2448 by a duration corresponding to $t_{D2}$ 2022 illustrated in FIG. 20. The delay is sufficient to mask any subsequent rising edges in the second-level clock signals 2410, 2420, 2430. The reset signal 2448 causes the output of the flipflop 2444 to return to the low logic state, thereby completing a pulse. The pulse is provided in the receive clock signal 2450 output by the global clock recovery circuit 2440. The receive clock signal 2450 may be provided to the data recovery circuit 2500 illustrated in FIG. 25, the data recovery circuit 2600 illustrated in FIG. 26 or the data recovery circuit 2700 illustrated in FIG. 27.

The clock recovery circuits illustrated in FIGS. 21-24 produce various clock signals that can be used to capture symbols representing differences in signaling state of each pair of wires in a three-wire serial bus. In one example, the receive clock signals 2210, 2450 may be used to control timing of symbol capture, wire state decoding and demapping components in a C-PHY interface. In another example, intermediate clock signals may be used to independently capture and hold state of individual difference signals in a multibit difference signal before the state of the multibit difference signal is captured for decoding.

Figure 25:
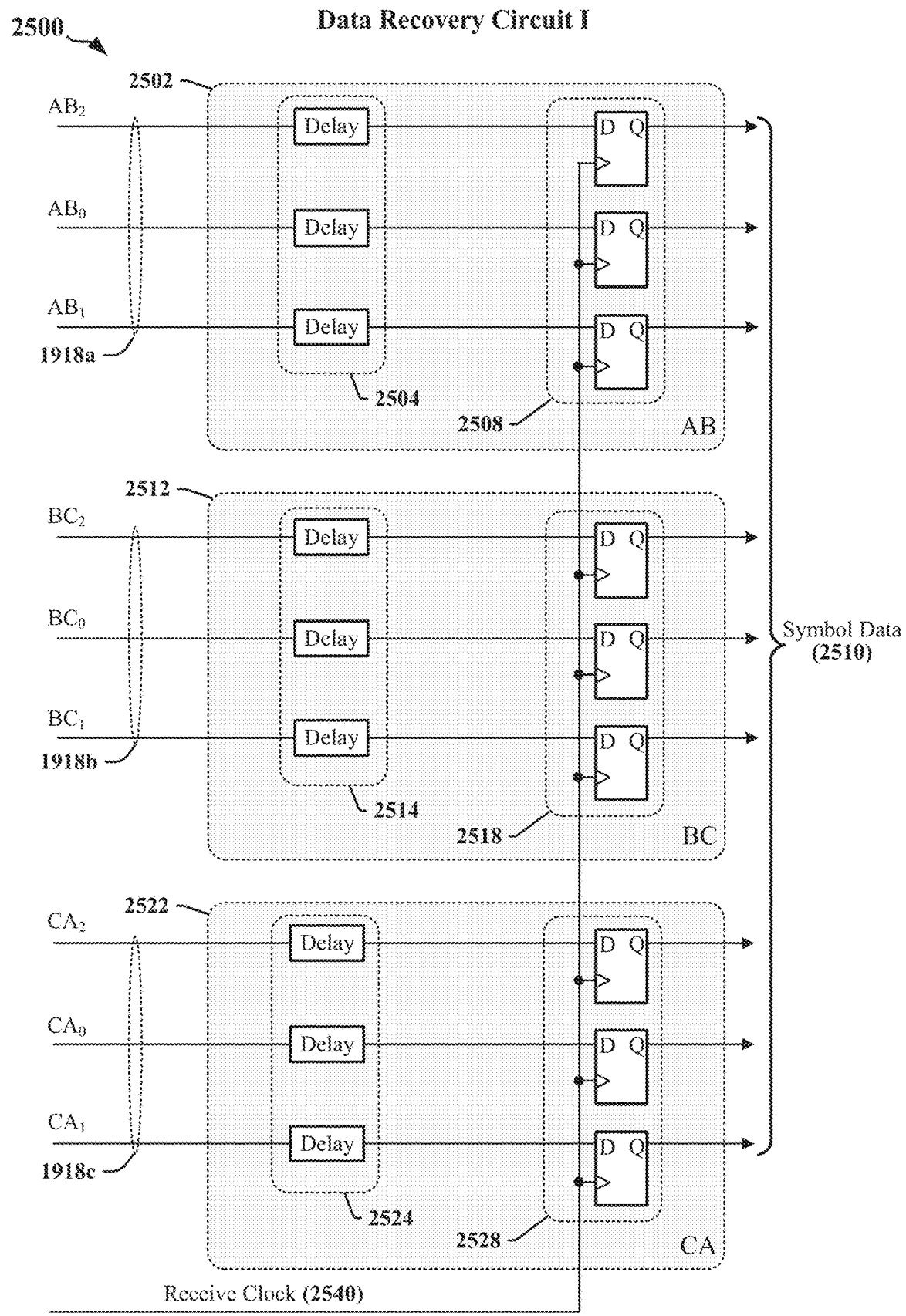
FIG. 25 illustrates a first example of a data recovery circuit that is configured in accordance with certain aspects of this disclosure.

FIG. 25 illustrates a first example of a data recovery circuit 2500 that is configured in accordance with certain aspects of this disclosure. The data recovery circuit 2500 includes circuits 2502, 2512, 2522 that may be configured to respond to the receive clock signal 2210 generated using the global clock recovery circuit 2200 of FIG. 22 or responsive to the receive clock signal 2450 generated using the global clock recovery circuit 2400 illustrated in FIG. 24. In one example, the data recovery circuit 2500 captures the three state indicators in the multibit difference signals 1918a, 1918b, 1918c provided by the ADC circuits 1916a, 1916b, 1916c in FIG. 19.

Each of the multibit difference signals 1918a, 1918b, 1918c is provided to a delay element 2504, 2514 or 2524.

The delay elements 2504, 2514, 2524 may include circuits that can be configured with delay values that effectively reposition the clock pulses to capture symbols between symbol boundaries, consistent with the timing shown in the timing diagram 1040 of FIG. 10. The delayed state indicators are captured using registers 2508, 2518 and 2528. In various examples, each register 2508, 2518 and 2528 may be implemented using three or more D-flipflops that are clocked by a common clock signal. In one example, the delayed $AB_0$, $AB_1$ and $AB_2$ state indicators are clocked through a first register 2508 in response to a rising edge in a receive clock signal 2540, the delayed $BC_0$, $BC_1$ and $BC_2$ state indicators are clocked through a second register 2518 in response to the rising edge in the receive clock signal 2540, and the delayed $CA_0$, $CA_1$ and $CA_2$ state indicators are clocked through a third register 2528 in response to the rising edge in the receive clock signal 2540. In one example, the receive clock signal 2540 may correspond to the receive clock signal 2210 provided by the global clock recovery circuit 2200 of FIG. 22. In another example, the receive clock signal 2540 may correspond to the receive clock signal 2450 provided by the global clock recovery circuit 2440 of FIG. 24.

Figure 26:
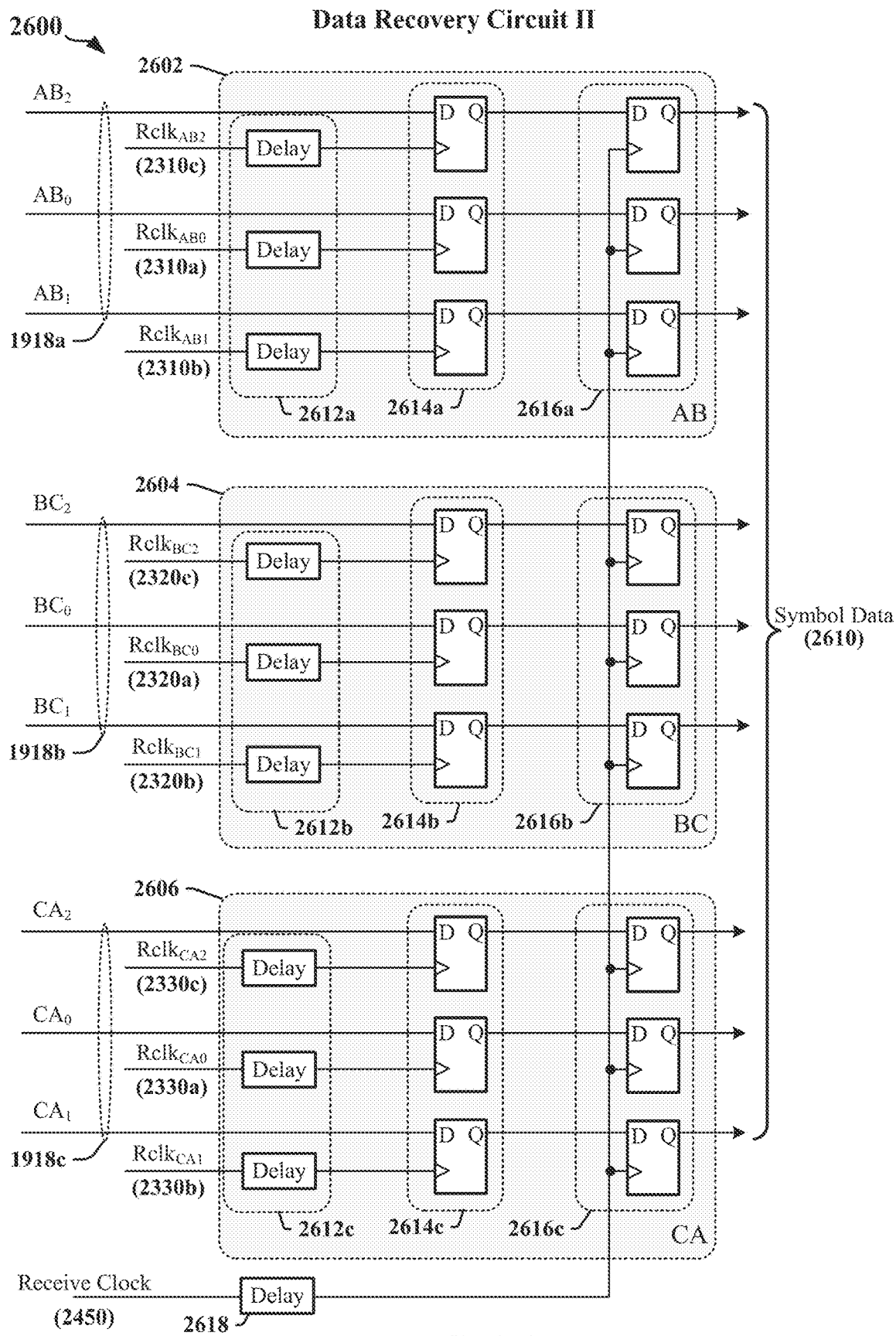
FIG. 26 illustrates a second example of a data recovery circuit that is configured in accordance with certain aspects of this disclosure.

FIG. 26 illustrates a second example of a data recovery circuit 2600 that is configured in accordance with certain aspects of this disclosure. The data recovery circuit 2600 includes data capture circuits 2602, 2604, 2606 that may be configured to respond to first-level clock signals 2310a-2310c, 2320a-2320c and 2330a-2330c provided by the first-level clock recovery circuits 2302, 2312, 2322 illustrated in FIG. 23 and the receive clock signal 2450 provided by the global clock recovery circuit 2440 illustrated in FIG. 24. In one example, the data recovery circuit 2600 uses these clock signals to capture the three state indicators in each of the multibit difference signals 1918a, 1918b, 1918c provided by the ADC circuits 1916a, 1916b, 1916c in FIG. 19.

Each of the multibit difference signals 1918a, 1918b, 1918c is provided to a corresponding one of the data capture circuits 2602, 2604, 2606. A value representing each state indicator in each multibit difference signal 1918a, 1918b, 1918c is individually captured using the first-level clock signals 2310a-2310c, 2320a-2320c and 2330a-2330c generated by the first-level clock recovery circuits 2302, 2312, 2322 illustrated in FIG. 23.

The first-level clock signals 2310a-2310c, 2320a-2320c, 2330a-2330c are provided to delay elements 2612a, 2612b or 2612c. The delay elements 2612a-2612c may include circuits that can be configured with delay values selected to individually adjust timing of the clock pulses in each first-level clock signal 2310a-2310c, 2320a-2320c, 2330a-2330c in order to ensure that symbols can be captured between symbol boundaries, consistent with the timing shown in the timing diagram 1040 of FIG. 10. In the example illustrated in FIG. 26, each state indicator may be captured using first-level registers 2614a, 2614b, 2614c according to the timing of corresponding delayed first-level clock signals 2310a-2310c, 2320a-2320c, 2330a-2330c and the outputs of the first-level registers 2614a, 2614b, 2614c are captured by the symbol registers 2616a, 2616b, 2616c according to the timing of the receive clock signal 2450 provided by the global clock recovery circuit 2440. In some examples, a delay element 2618 may be configured to adjust the timing of pulses in the receive clock signal 2450 in order to ensure adequate setup times for the symbol registers 2616a, 2616b, 2616c.

In one example, each of the $AB_0$, $AB_1$ and $AB_2$ state indicators is clocked through a corresponding flipflop in the first-level registers 2614a in response to a delayed rising edge in a corresponding first-level clock signal 2310a, 2310b, 2310c, each of the $BA_0$, $BA_1$ and $BA_2$ state indicators is clocked through a corresponding flipflop in the first-level registers 2614b in response to a delayed rising edge in a corresponding first-level clock signal 2320a, 2320b, 2320c and each of the $CA_0$, $CA_1$ and $CA_2$ state indicators is clocked through a corresponding flipflop in the first-level registers 2614c in response to a delayed rising edge in a corresponding first-level clock signal 2330a, 2330b, 2330c. The use of first-level clock signals 2310a-2310c, 2320a-2320c and 2330a-2330c can maximize the sampling windows available for capturing the individual state indicators in the multibit difference signals 1918a-1918c. In some examples, each first-level register 2614a, 2614b, 2614c may be implemented using three or more D-flipflops.

The outputs of the first-level registers 2614a-2614c may be captured using the receive clock signal 2450 or a delayed version of the receive clock signal 2450. The outputs of the first-level registers 2614a-2614c are clocked through corresponding symbol registers 2616a, 2616b, 2616c in response to a rising edge in the receive clock signal 2450 provided by the global clock recovery circuit 2440 or by a rising edge in the delayed receive clock signal provided by the delay element 2618. The outputs of the symbol registers 2616a-2616c may be provided as symbol data 2610 to a decoder.

Figure 27:
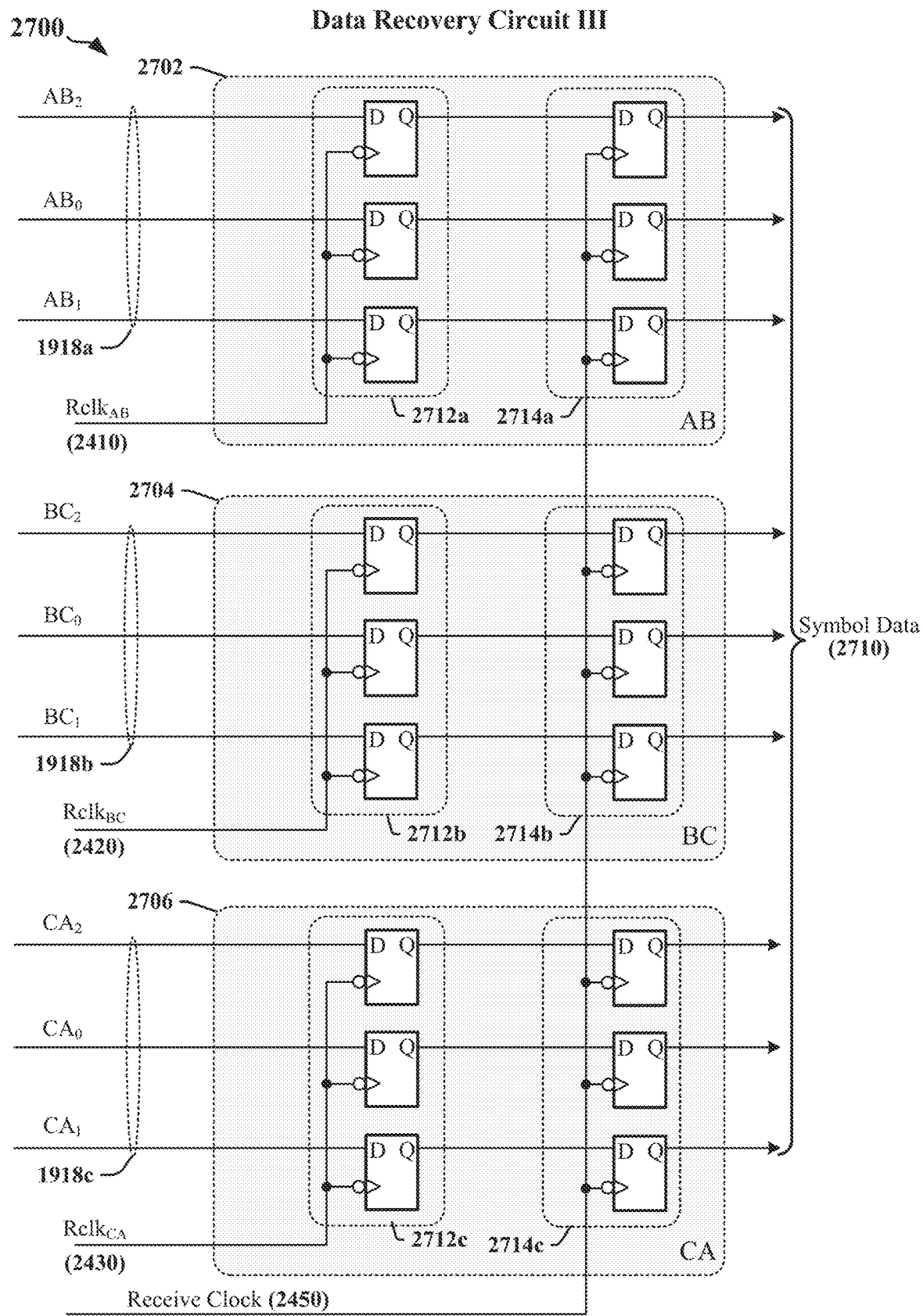
FIG. 27 illustrates a third example of a data recovery circuit that is configured in accordance with certain aspects of this disclosure.

FIG. 27 illustrates a third example of a data recovery circuit 2700 that is configured in accordance with certain aspects of this disclosure. The data recovery circuit 2700 includes data capture circuits 2702, 2704, 2706 that may be configured to respond to second-level clock signals 2410, 2420, 2430 provided by the second-level clock recovery circuits 2402, 2412, 2422 and to the receive clock signal 2450 provided by the global clock recovery circuit 2440 illustrated in FIG. 24.

Each of the multibit difference signals 1918a, 1918b, 1918c is provided to a corresponding one of the data capture circuits 2702, 2704, 2706. A value representing each multibit difference signal 1918a, 1918b, 1918c is captured by the corresponding data capture circuit 2702, 2704, 2706. In the illustrated example, each of the data capture circuits 2702, 2704, 2706 is configured to capture state of a multibit difference signal 1918a, 1918b, 1918c based on timing provided by falling edges in the corresponding second-level clock signal 2410, 2420, 2430 and a falling edge in the receive clock signal 2450.

In one example, the AB multibit difference signal 1918a is clocked through a first first-level register 2712a in response to a falling edge in the AB second-level clock signal 2410, the BC multibit difference signal 1918b is clocked through a second first-level register 2712b in response to a falling edge in the BC second-level clock signal 2420 and the CA multibit difference signal 1918a is clocked through a third first-level register 2712c in response to a falling edge in the CA second-level clock signal 2430. The use of second-level clock signals 2410, 2420, 2430 can maximize the sampling windows available for capturing the multibit difference signals 1918a-1918c. The use of falling edges can provide sufficient hold time for the first-level registers 2712a, 2712b, 2712c after transitions occurring in the multibit difference signal 1918a, 1918b, 1918c at the rising edges in the corresponding second-level clock signals 2410, 2420, 2430. In various examples, each first-level register 2712a, 2712b, 2712c may be implemented using three or more D-flipflops that are clocked by a common clock signal.

The outputs of the first-level registers 2712a, 2712b, 2712c may be captured using timing provided by the receive clock signal 2450. In the illustrated example, the outputs of the first-level registers 2712a, 2712b, 2712c are clocked through corresponding symbol registers 2714a, 2714b, 2714c in response to a falling edge in the receive clock signal 2450. The symbol registers 2714a, 2714b, 2714c may be configured to respond to falling edges at their clock inputs to provide sufficient hold time after transitions at the outputs of the first-level register 2712a, 2712b, 2712c. The outputs of the symbol registers 2714a, 2714b, 2714c may be provided as symbol data 2710 to a decoder.

Figure 28:
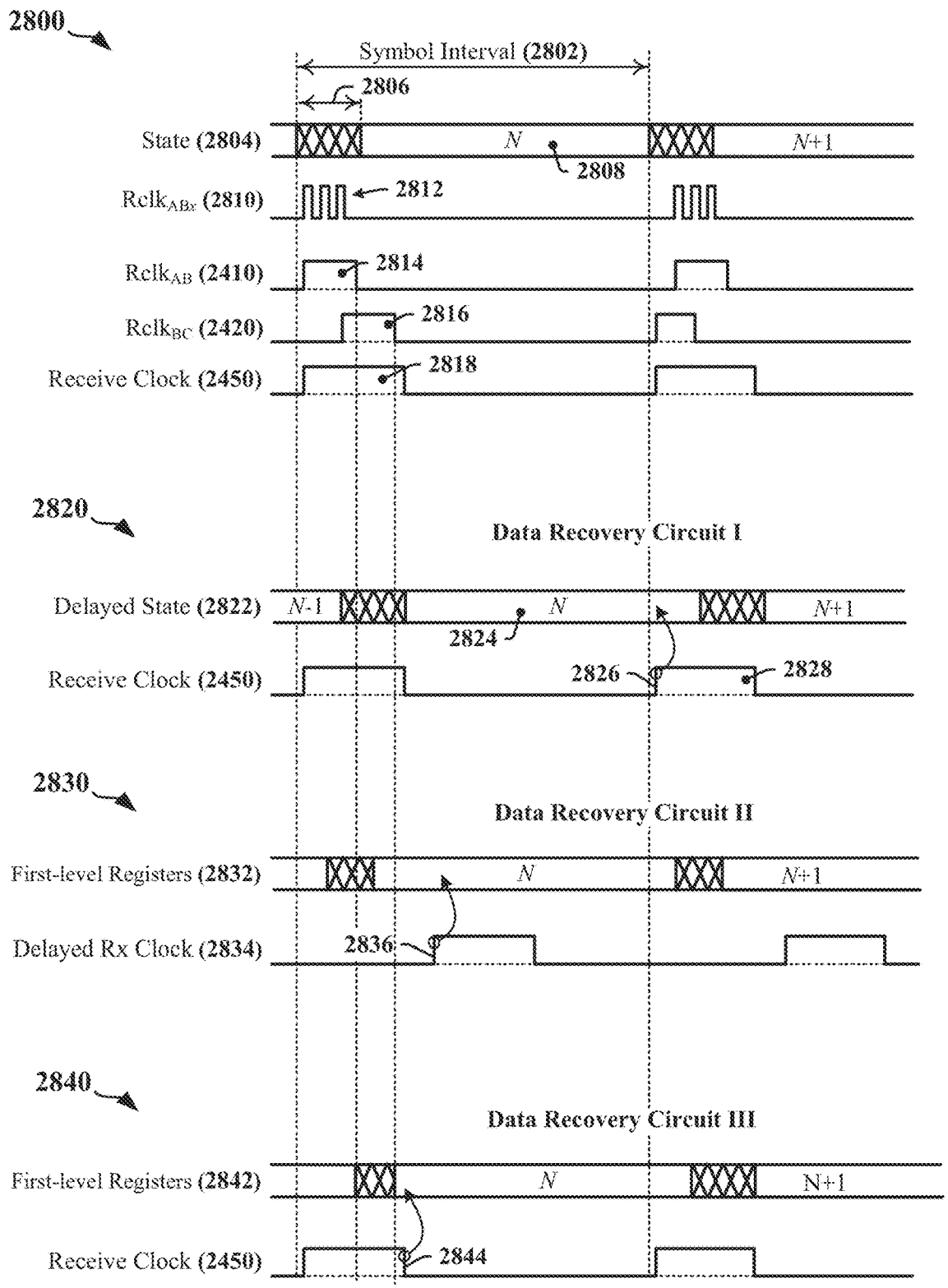
FIG. 28 includes timing that illustrate certain aspects of clock generation and data capture in accordance with certain aspects of this disclosure.

FIG. 28 includes timing diagrams 2800, 2820, 2830 and 2840 that illustrate certain aspects of clock generation and data capture in a C-PHY receiver configured in accordance with certain aspects of this disclosure. The timing diagrams 2800, 2820, 2830 and 2840 are conceptual and do not necessarily depict absolute timing. The timing diagrams 2800, 2820, 2830 and 2840 illustrate certain timing relationships without providing precise ratios or relative times.

A first timing diagram 2800 relates to the first-level clock recovery circuit 2300 illustrated in FIG. 23, and to the second-level clock recovery circuits 2402, 2412, 2422 and the global clock recovery circuit 2440 illustrated in FIG. 24. Certain aspects of the first timing diagram 2800 also relate to the first local clock recovery circuit 2100 illustrated in FIG. 21, and to the global clock recovery circuit 2200 illustrated in FIG. 22. The first timing diagram 2800 illustrates signaling state 2804 on a 3-wire C-PHY bus and certain clock signals 2810, 2410, 2420 and 2450 derived from transitions between consecutive raw symbols transmitted over the C-PHY bus. Each raw symbol represents or defines the signaling state 2804 of the 3-wire bus during a symbol interval 2802. A transition interval 2806 between symbols is characterized by a period of instability in the signaling state 2804. One or more wires of the C-PHY bus transition during the transition interval 2806 causing changes in the multibit difference signals 1918a, 1918b, 1918c (see FIG. 19).

In the illustrated example, the AB difference signal 1914a crosses three measurement thresholds 1920, causing a first-level clock recovery circuit 2302 to generate pulses at different times in the first-level clock signals 2310a-2310c. The combined pulses 2812 are output by an OR gate 2404 in the AB clock recovery circuit 2402 and the output is shown as Rclk$_{ABx}$, 2810 in the first timing diagram 2800. The AB clock recovery circuit 2402 generates a pulse 2814 in the AB second-level clock signal 2410, which causes the global clock recovery circuit 2440 to initiate a pulse 2818 in the receive clock signal 2450. A pulse 2816 in the BC second-level clock signal 2420 occurs later in the transition interval 2806 and is effectively ignored by the global clock recovery circuit 2440. A current symbol 2808 (Symbol N) can be considered stable after the transition interval 2806 has ended.

A second timing diagram 2820 relates to an example of data capture using the data recovery circuit 2500 illustrated in FIG. 25. In this example, signaling state 2804 is delayed by providing the multibit difference signals 1918a, 1918b, 1918c to delay elements 2504, 2514, 2524. Pulses in the receive clock signal 2450 are used to capture the delayed state of the multibit difference signals 1918a, 1918b, 1918c. The inclusion of delay elements 2504, 2514, 2524 in the data recovery circuit 2500 means that the pulse generated at the commencement of the current symbol 2808 captures the multibit difference signals 1918a, 1918b, 1918c when they represent the preceding symbol (N−1), and a second pulse 2828 in the receive clock signal 2450 generated by transitions associated with the next symbol is used to capture the delayed state 2822 representing the current symbol 2824. In one example, the rising edge 2826 in the second pulse 2828 initiates capture of the delayed current symbol 2824.

A third timing diagram 2830 relates to an example of data capture using the data recovery circuit 2600 illustrated in FIG. 26. In this example, signaling state 2804 is captured using timing provided by pulses in a delayed receive clock signal 2834 to capture state of the multibit difference signals 1918a, 1918b, 1918c while the current symbol 2808 is stable. Individual multibit difference signals 1918a, 1918b, 1918c are captured in associated first-level registers 2614a, 2614b, 2614c using delayed first-level clock signals 2310a-2310c, 2320a-2320c, 2330a-2330c. Delay elements 2612a-2612c in the data capture circuits 2602, 2604, 2606 can be configured to guarantee setup time for the first-level registers 2614a, 2614b, 2614c. The outputs 2832 of the first-level registers 2614a, 2614b, 2614c are captured by symbol registers 2616a, 2616b, 2616c. In one example, the symbol registers 2616a, 2616b, 2616c are clocked by the rising edge 2836 of pulses in the delayed receive clock signal 2834. The delayed receive clock signal 2834 is obtained using a delay element 2618 that can be configured to ensure adequate setup time is provided for the symbol registers 2616a, 2616b, 2616c.

A fourth timing diagram 2840 relates to an example of data capture using the data recovery circuit 2700 illustrated in FIG. 27. In this example, signaling state 2804 is captured using timing provided by pulses in the receive clock signal 2450 to capture state of the multibit difference signals 1918a, 1918b, 1918c while the current symbol 2808 is stable. Individual multibit difference signals 1918a, 1918b, 1918c are captured in associated first-level registers 2712a, 2712b, 2712c using falling edges in the second-level clock signals 2410, 2420, 2430. Delay circuits 2408, 2418, 2428 in the second-level clock recovery circuits 2402, 2412, 2422 can be configured to select pulse widths that guarantee setup time for the first-level registers 2712a, 2712b, 2712c. The outputs of the first-level registers 2712a, 2712b, 2712c are captured by symbol registers 2714a, 2714b, 2714c. In one example, the symbol registers 2714a, 2714b, 2714c are clocked by at the falling edges 2844 of pulses in the receive clock signal 2450. The use of falling edges in the receive clock signal 2450 can ensure adequate setup time is provided for the symbol registers 2714a, 2714b, 2714c.

Examples of Processing Circuits and Methods

Figure 29:
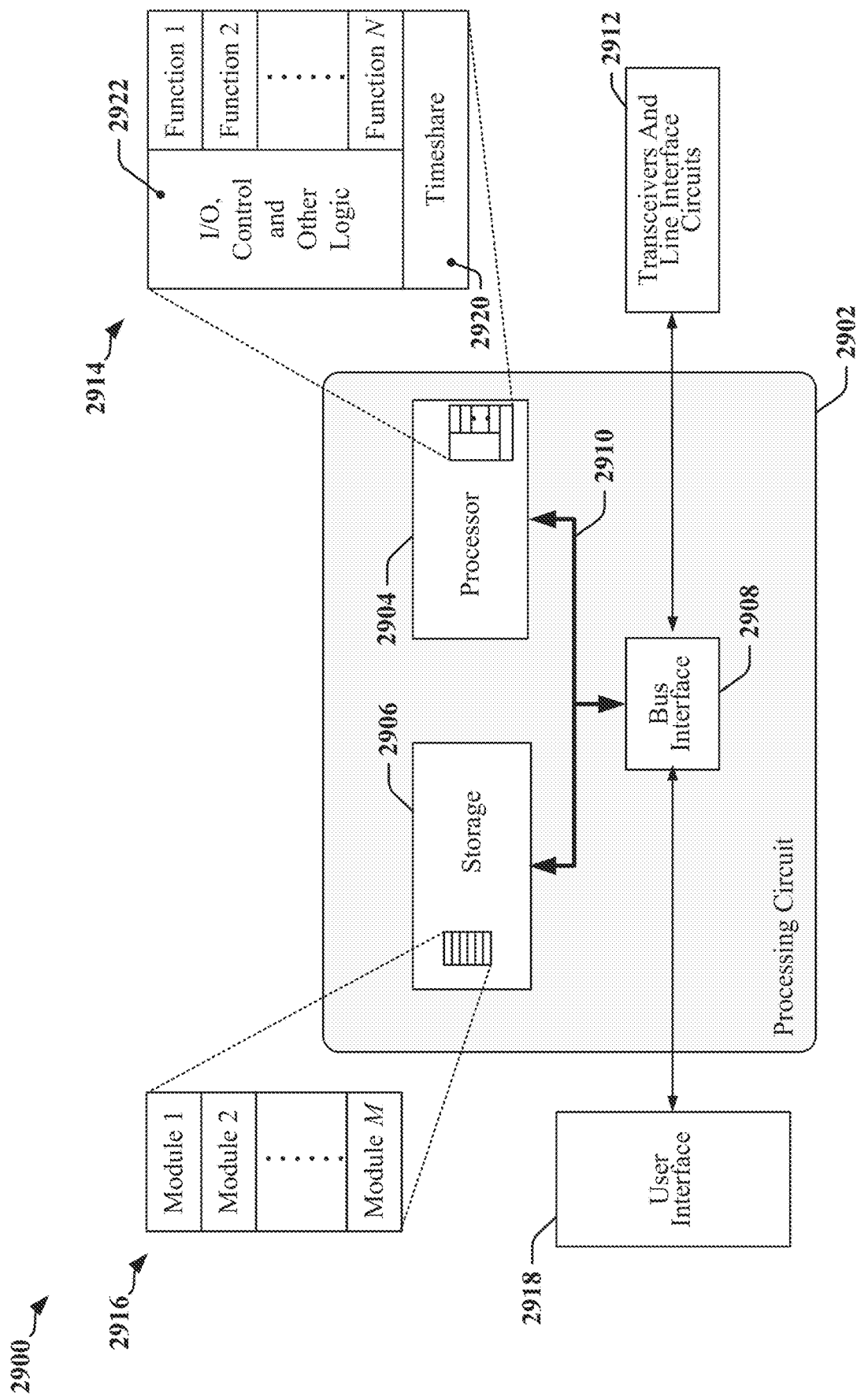
FIG. 29 illustrates an example of an apparatus employing a processing circuit that may be adapted according to certain aspects disclosed herein.

FIG. 29 is a conceptual diagram 2900 illustrating an example of a hardware implementation for an apparatus employing a processing circuit 2902 that may be configured to perform one or more functions disclosed herein. In accordance with various aspects of the disclosure, an element, or any portion of an element, or any combination of elements as disclosed herein may be implemented using the processing circuit 2902. The processing circuit 2902 may include certain devices, circuits, and/or logic that support the various encoding schemes disclosed herein. The processing circuit 2902 may include, configure and/or manage one or more of the circuits illustrated in FIGS. 19 and 21-27. In one example, the processing circuit 2902 may include some combination of circuitry and modules that facilitates the sampling and decoding of symbols that are encoded using a combination of PAM and C-PHY encoding, and which define three or more voltage levels on the wires of a serial bus. In another example, the processing circuit 2902 may include some combination of circuitry and modules that facilitates the generation of clock signals that can control efficient capture of symbols that are encoded using a combination of C-PHY and PAM in accordance with certain aspects disclosed herein. The processing circuit 2902 may include a state machine or another type of processing device that manages encoding and/or decoding processes as disclosed herein.

The processing circuit 2902 may include one or more processors 2904 that are controlled by some combination of hardware and software modules. Examples of processors 2904 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 2904 may include specialized processors that perform specific functions, and that may be configured, augmented or controlled by one of the software modules 2916. The one or more processors 2904 may be configured through a combination of software modules 2916 loaded during initialization, and further configured by loading or unloading one or more software modules 2916 during operation.

In the illustrated example, the processing circuit 2902 may be implemented with a bus architecture, represented generally by the bus 2910. The bus 2910 may include any number of interconnecting buses and bridges depending on the specific application of the processing circuit 2902 and the overall design constraints. The bus 2910 links together various circuits including the one or more processors 2904, and a processor-readable storage medium 2906. The processor-readable storage medium 2906 may include memory devices and mass storage devices, and may be referred to herein as computer-readable media and/or processor-readable media. The bus 2910 may also link various other circuits such as timing sources, timers, peripherals, voltage regulators, and power management circuits. A bus interface 2908 may provide an interface between the bus 2910 and one or more transceivers 2912. A transceiver 2912 may be provided for each networking technology supported by the processing circuit. In some instances, multiple networking technologies may share some or all of the circuitry or processing modules found in a transceiver 2912. Each transceiver 2912 provides a means for communicating with various other apparatus over a transmission medium. Depending upon the nature of the apparatus, a user interface 2918 (e.g., keypad, display, speaker, microphone, joystick) may also be provided, and may be communicatively coupled to the bus 2910 directly or through the bus interface 2908.

A processor 2904 may be responsible for managing the bus 2910 and for general processing that may include the execution of software stored in a processor-readable medium that may include the processor-readable storage medium 2906. In this respect, the processing circuit 2902, including the processor 2904, may be used to implement any of the methods, functions and techniques disclosed herein. The processor-readable storage medium 2906 may be used for storing data that is manipulated by the processor 2904 when executing software, and the software may be configured to implement any one of the methods disclosed herein.

One or more processors 2904 in the processing circuit 2902 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the processor-readable storage medium 2906 or in another, external processor-readable medium. The processor-readable storage medium 2906 may include a non-transitory processor-readable medium. A non-transitory processor-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a random access memory (RAM), a ROM, a PROM, an erasable PROM (EPROM), an EEPROM, a register, a removable disk, and any other suitable medium for storing software and/or instructions that may be accessed and read by a computer. The processor-readable storage medium 2906 may also include, by way of example, a carrier wave, a transmission line, and any other suitable medium for transmitting software and/or instructions that may be accessed and read by a computer. Processor-readable storage medium 2906 may reside in the processing circuit 2902, in the processor 2904, external to the processing circuit 2902, or be distributed across multiple entities including the processing circuit 2902. The processor-readable storage medium 2906 may be embodied in a computer program product. By way of example, a computer program product may include a processor-readable medium in packaging materials. Those skilled in the art will recognize how best to implement the described functionality presented throughout this disclosure depending on the particular application and the overall design constraints imposed on the overall system.

The processor-readable storage medium 2906 may maintain software maintained and/or organized in loadable code segments, modules, applications, programs, etc., which may be referred to herein as software modules 2916. Each of the software modules 2916 may include instructions and data that, when installed or loaded on the processing circuit 2902 and executed by the one or more processors 2904, contribute to a run-time image 2914 that controls the operation of the one or more processors 2904. When executed, certain instructions may cause the processing circuit 2902 to perform functions in accordance with certain methods, algorithms and processes described herein.

Some of the software modules 2916 may be loaded during initialization of the processing circuit 2902, and these software modules 2916 may configure the processing circuit 2902 to enable performance of the various functions disclosed herein. For example, some software modules 2916 may configure internal devices and/or logic circuits 2922 of the processor 2904, and may manage access to external devices such as the transceiver 2912, the bus interface 2908, the user interface 2918, timers, mathematical coprocessors, and so on. The software modules 2916 may include a control program and/or an operating system that interacts with interrupt handlers and device drivers, and that controls access to various resources provided by the processing circuit 2902. The resources may include memory, processing time, access to the transceiver 2912, the user interface 2918, and so on.

One or more processors 2904 of the processing circuit 2902 may be multifunctional, whereby some of the software modules 2916 are loaded and configured to perform different functions or different instances of the same function. The one or more processors 2904 may additionally be adapted to manage background tasks initiated in response to inputs from the user interface 2918, the transceiver 2912, and device drivers, for example. To support the performance of multiple functions, the one or more processors 2904 may be configured to provide a multitasking environment, whereby each of a plurality of functions is implemented as a set of tasks serviced by the one or more processors 2904 as needed or desired. In one example, the multitasking environment may be implemented using a timesharing program 2920 that passes control of a processor 2904 between different tasks, whereby each task returns control of the one or more processors 2904 to the timesharing program 2920 upon completion of any outstanding operations and/or in response to an input such as an interrupt. When a task has control of the one or more processors 2904, the processing circuit is effectively specialized for the purposes addressed by the function associated with the controlling task. The timesharing program 2920 may include an operating system, a main loop that transfers control on a round-robin basis, a function that allocates control of the one or more processors 2904 in accordance with a prioritization of the functions, and/or an interrupt driven main loop that responds to external events by providing control of the one or more processors 2904 to a handling function.

FIG. 30 is a flow chart 3000 of a method for configuring a clock recovery circuit in a receiver coupled to a multi-wire communication link according to certain aspects of this disclosure. In one example, the communication link may have three wires and data may be encoded in phase state and amplitude of a signal transmitted in different phases on each of the three wires. At block 3002, each multi-level comparison circuit in a plurality of multi-level comparison circuits may be coupled to a pair of wires in a three-wire communication link. At block 3004, a plurality of first-level flipflops in each of a plurality of first-level clock recovery circuits may be configured to be clocked by transitions in a multibit signal received from one of the plurality of multi-level comparison circuits. At block 3006, a first delay circuit in each first-level clock recovery circuit may be configured to provide a first reset signal that resets the each first-level clock recovery circuit. At block 3008, a second-level flipflop in a second-level clock recovery circuit may be configured to be clocked by transitions in outputs of the plurality of first-level clock recovery circuits. At block 3010, a second delay circuit in the second-level clock recovery circuit may be configured to delay an output of the second-level clock recovery circuit that provides a second reset signal to the second-level flipflop.

In some examples, a first plurality of multibit registers in a data recovery circuit may be configured to receive an associated multibit signal output by one of the plurality of multi-level comparison circuits. Each multibit register in the first plurality of multibit registers is clocked by an output of a corresponding first-level clock recovery circuit that also receives the associated multibit signal. Each of the plurality of multibit registers may include three flipflops that are clocked by the output of the corresponding first-level clock recovery circuit. Each of a plurality of first delay elements in the data recovery circuit may be configured to couple outputs of the first-level clock recovery circuit to the first plurality of multibit registers. Each of a second plurality of multibit registers in the data recovery circuit may be configured to receive, as an input, an output of one of the first plurality of multibit registers. In some instances, each of the second plurality of multibit registers may be clocked by an output of the second-level clock recovery circuit. In some instances, the data recovery circuit includes a second delay element configured to couple the output of the second-level clock recovery circuit to each of the second plurality of multibit registers.

In one example, the first reset signal is coupled to a reset input of each of the plurality of first-level flipflops. In some examples, an output flipflop in each first-level clock recovery circuit may be configured to be clocked by transitions in one or more outputs of the plurality of first-level flipflops in the each first-level clock recovery circuit. The first reset signal may be coupled to a reset input of the output flipflop. Each of the plurality of first-level flipflops in the each first-level clock recovery circuit may be reset by its own output.

In certain examples, the first delay circuit is configured with a delay duration that corresponds to a maximum expected time difference between a first-occurring transition and a last-occurring transition in the multibit signal. The second delay circuit may be configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

Figure 31:
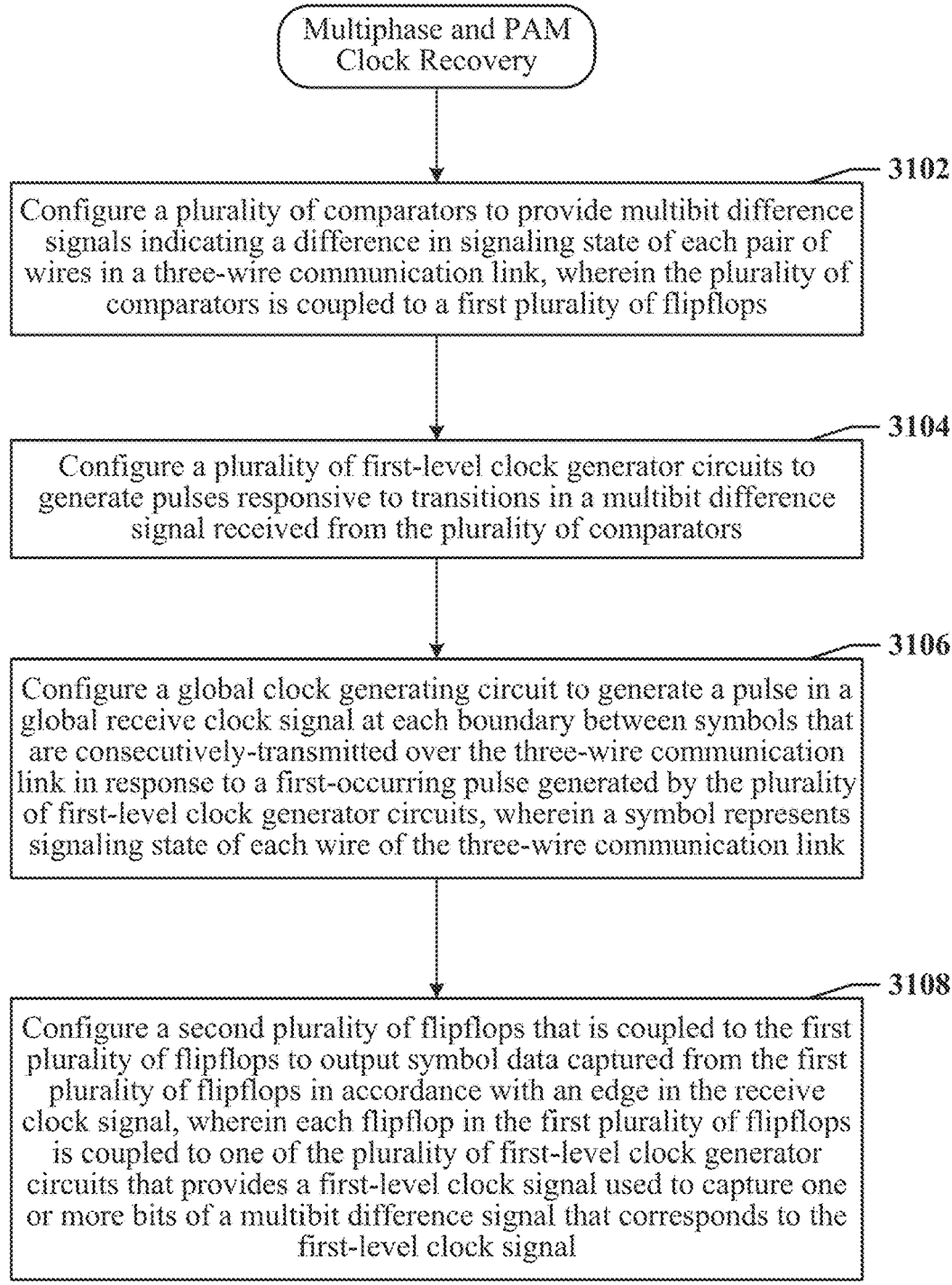
FIG. 31 is a flow chart of a method for clock recovery performed at a receiver according to certain aspects disclosed herein.

FIG. 31 is a flow chart 3100 of a clock recovery method that may be performed at a receiver coupled to a multi-wire communication link in accordance with certain aspects of this disclosure. In one example, the communication link may have three wires and data may be encoded in phase state and amplitude of a signal transmitted in different phases on each of the three wires. The method may be performed, at least in part, at the receiver 722 illustrated in FIG. 7. At block 3102, the receiver 722 may configure a plurality of comparators to provide multibit difference signals indicating a difference in signaling state of each pair of wires in a three-wire communication link. In some examples, the plurality of comparators includes one or more multi-level comparison circuits. The plurality of comparators may be coupled to a first plurality of flipflops. At block 3104, the receiver 722 may configure a plurality of first-level clock recovery circuits to generate pulses responsive to transitions in a multibit difference signal received from the plurality of comparators. At block 3106, the receiver 722 may configure a second-level clock recovery circuit to generate a pulse in a global receive clock signal at each boundary between symbols that are consecutively-transmitted over the three-wire communication link in response to a first-occurring pulse generated by the plurality of first-level clock recovery circuits. In some examples, a symbol represents signaling state of each wire of the three-wire communication link. At block 3108, the receiver 722 may configure a second plurality of flipflops that is coupled to the first plurality of flipflops to output symbol data captured from the first plurality of flipflops in accordance with an edge in the receive clock signal. Each flipflop in the first plurality of flipflops may be coupled to one of the plurality of first-level clock recovery circuits that provides a first-level clock signal used to capture one or more bits of a multibit difference signal that corresponds to the first-level clock signal.

In certain examples, each first-level clock recovery circuit generates a first-level clock signal based on transitions in one of multibit difference signals. In one example, each first-level clock recovery circuit includes three flipflops clocked by a multibit difference signal indicating a difference in signaling state of one pair of wires in the three-wire communication link.

In some examples, each first-level clock recovery circuit includes a delay circuit configured to reset the each first-level clock recovery circuit using a delayed version of a first-level clock signal generated by the each first-level clock recovery circuit. The delay circuit may be configured with a delay duration that corresponds to the time difference between a first-occurring transition and a last-occurring transition in a corresponding multibit difference signal at a boundary between a pair of consecutively-transmitted symbols.

In some examples, the receiver 722 may configure each of a plurality of second-level clock recovery circuits to initiate a pulse after detecting a first edge in first-level clock signals generated by one of the plurality of first-level clock recovery circuits at a boundary between a pair of consecutively-transmitted symbols. The second-level clock recovery circuit may generate the pulse in the global receive clock signal responsive to a first-occurring pulses in pulse generated by the plurality of second-level clock recovery circuits. The receiver 722 may configure the second plurality of flipflops to capture a version of the symbol data provided by a third plurality of flipflops. The third plurality of flipflops may be coupled between the first plurality of flipflops and the second plurality of flipflops. Each flipflop in the third plurality of flipflops may be clocked by a second-level clock signal provided by one of the plurality of second-level clock recovery circuits. The receiver 722 may configure each second-level clock recovery circuit to be reset using a delayed version of a second-level clock signal generated by the each first-level clock recovery circuit. Each second-level clock recovery circuit may include a delay circuit. The delay circuit may be configured with a delay duration that corresponds to the time difference between a first-occurring transition and a last-occurring transition in a corresponding multibit difference signal at a boundary between a pair of consecutively-transmitted symbols. In one example, each second-level clock recovery circuit includes three flipflops clocked by three first-level clock signals generated by a corresponding one of the plurality of first-level clock recovery circuits.

Figure 32:
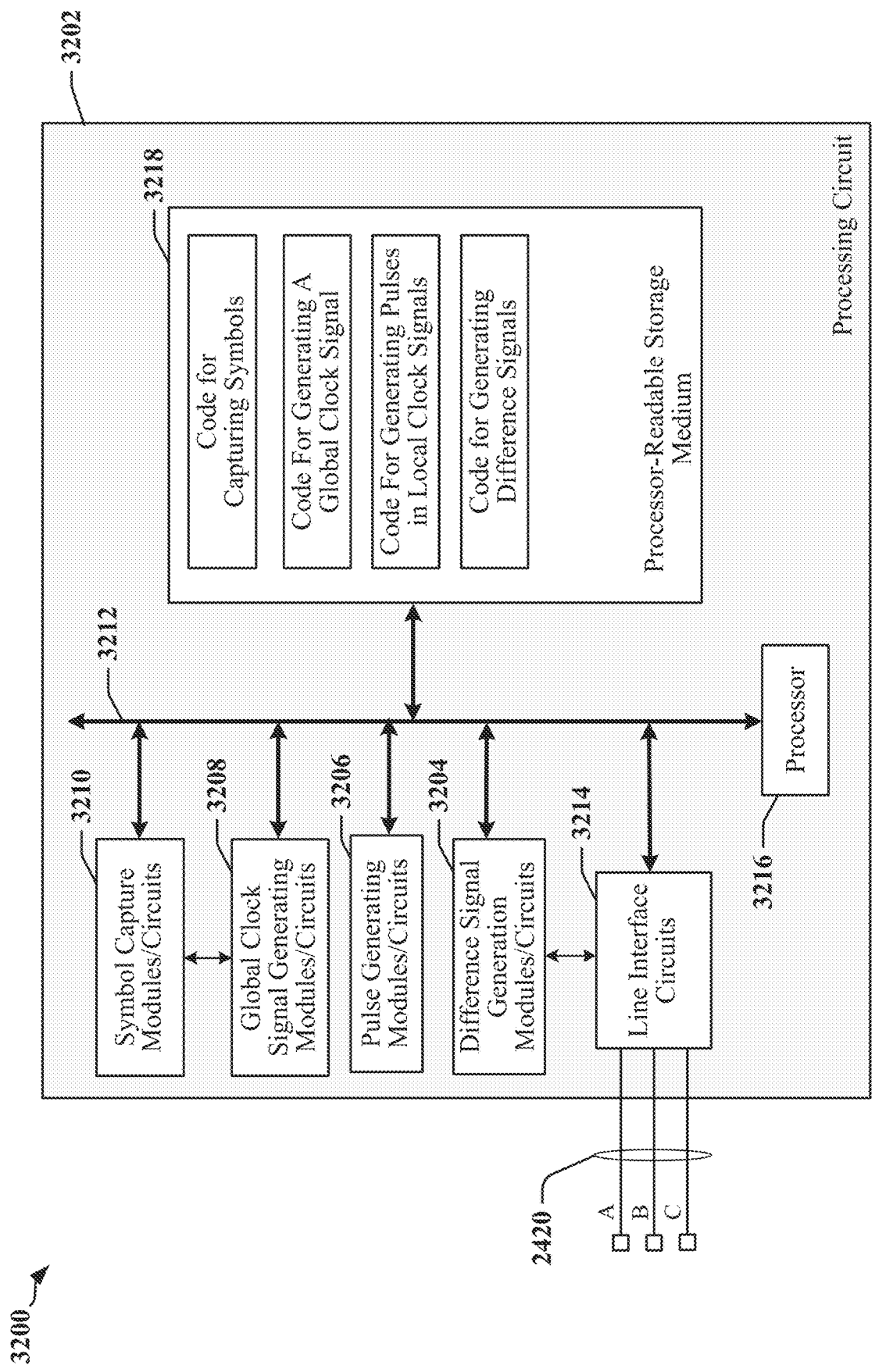
FIG. 32 is a diagram illustrating an example of a hardware implementation for a receiving apparatus in accordance with certain aspects disclosed herein.

FIG. 32 is a diagram illustrating an example of a hardware implementation for an apparatus 3200 employing a processing circuit 3202. The processing circuit typically has a processor 3216 that may include one or more microprocessors, microcontrollers, digital signal processors, sequencers and/or state machines. The processing circuit 3202 may be implemented with a bus architecture, represented generally by the bus 3212. The bus 3212 may include any number of interconnecting buses and bridges depending on the specific application of the processing circuit 3202 and the overall design constraints. The bus 3212 links together various circuits including one or more processors and/or hardware modules, represented by the processor 3216, the modules or circuits 3204, 3206, 3208 and 3210, line interface circuits 3214 that are configured to drive the wires of a 3-wire link 2320 (see FIG. 23, for example), and the processor-readable storage medium 3218. The bus 3212 may also link various other circuits such as timing sources, peripherals, voltage regulators, and power management circuits, which are well known in the art, and therefore, will not be described any further.

The processor 3216 is responsible for general processing, including the execution of software stored on the processor-readable storage medium 3218. The software, when executed by the processor 3216, causes the processing circuit 3202 to perform the various functions described supra for any particular apparatus. The processor-readable storage medium 3218 may also be used for storing data that is manipulated by the processor 3216 when executing software, including symbol table and intermediate indices used to access the symbol tables. The processing circuit 3202 further includes at least one of the modules 3204, 3206, 3208 and 3210. The modules 3204, 3206, 3208 and 3210 may be implemented as software modules running in the processor 3216, resident/stored in the processor-readable storage medium 3218, one or more hardware modules coupled to the processor 3216, or some combination thereof. The modules 3204, 3206, 3208 and 3210 may include microcontroller instructions, state machine configuration parameters, or some combination thereof.

In one configuration, the apparatus 3200 may be configured for data communication over a multi-wire interface. The apparatus 3200 may include a module and/or circuit 3204 that is configured to generate difference signals from wire state received from the line interface circuits 3214. In one example, the line interface circuits 3214 can detect 7 or more signaling states on each wire, where each wire is in a different signaling state than the other wires in the 3-wire link 3220. The apparatus 3200 may include pulse generating modules and/or circuits 3206 configured to provide pulses responsive to the detection of changes in the difference signals. The apparatus 3200 may include global clock generating modules and/or circuits 3208 configured to generate a global receive clock signal responsive to pulses generated by the pulse generating modules and/or circuits 3206. The apparatus 3200 may include symbol capture modules and/or circuits 3210 configured to capture symbol data using timing provided by the global receive clock signal.

In some implementations, the apparatus 3200 has a plurality of multi-level comparison circuits, with each multi-level comparison circuit being coupled to a pair of wires in a three-wire communication link. Each multi-level comparison circuit may be configured to provide a multibit signal as an output. The apparatus 3200 may have a plurality of first-level clock recovery circuits or other means for recovering local clock signals. In one example, each first-level clock recovery circuit includes a plurality of first-level flipflops that are clocked by transitions in a multibit signal received from one of the plurality of comparators, and a first delay circuit that delays an output of the each first-level clock recovery circuit to provide a first reset signal that resets the each first-level clock recovery circuit. The apparatus 3200 may have a second-level clock recovery circuit or other means for recovering a global clock signal. In one example, the second-level clock recovery circuit includes a second-level flipflop clocked by transitions in the outputs of the plurality of first-level clock recovery circuits, and a second delay circuit that delays an output of the second-level clock recovery circuit to provide a second reset signal to the second-level flipflop.

In some examples, the apparatus 3200 has a data recovery circuit that includes a first plurality of multibit registers. Each multibit register in the first plurality of multibit registers may be configured to receive an associated multibit signal output by one of the plurality of comparators and is clocked by an output of a corresponding first-level clock recovery circuit that also receives the associated multibit signal. Each of the plurality of multibit registers may include three flipflops that are clocked by the output of the corresponding first-level clock recovery circuit. The data recovery circuit may further include a plurality of delay circuits configured to couple the multibit signals output by the plurality of comparators to the first plurality of multibit registers. The data recovery circuit may further include a second plurality of multibit registers, each multibit register in the second plurality of multibit registers receiving, as an input, an output of one of the first plurality of multibit registers. Each of the second plurality of multibit registers may be clocked by an output of the second-level clock recovery circuit. Each multibit register in the first plurality of multibit registers may be clocked by an output of one of the plurality of first-level flipflops in the corresponding first-level clock recovery circuit.

In one example, the first reset signal is coupled to a reset input of each of the plurality of first-level flipflops.

In one example, each first-level clock recovery circuit includes an output flipflop that is clocked by transitions in one or more outputs of the plurality of first-level flipflops in the each first-level clock recovery circuit. The first reset signal may be coupled to a reset input of the output flipflop. Each of the plurality of first-level flipflops in each first-level clock recovery circuit may be reset by its own output.

In one example, the first delay circuit is configured with a delay duration that corresponds to a maximum expected time difference between a first-occurring transition and a last-occurring transition in the multibit signal received from the one multi-level comparison circuit.

In one example, the second delay circuit is configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

In some implementations, the apparatus 3200 has a plurality of line receivers configured to couple the apparatus to a 3-wire link 3220 and a clock and data recovery circuit. The clock and data recovery circuit may be configured to generate clock signals, capture symbols from the 3-wire link 3220 and decode data from each transition between two symbols that are consecutively received over the 3-wire link 3220, where each pair of consecutively-transmitted symbols includes two different symbols. In one example, each symbol defines signaling states of the 3-wire link 3220 during an associated symbol transmission interval such that each wire of the 3-wire link 3220 is in a different signaling state from the other wires of the 3-wire link 3220 during the associated symbol transmission interval.

The apparatus 3200 may include a plurality of comparators, a plurality of first-level clock recovery circuits, a second-level clock recovery circuit, a first plurality of flipflops used to capture symbol data and a second plurality of flipflops used to capture symbol data. The comparators may be configured to provide multibit difference signals indicating a difference in signaling state of each pair of wires in a 3-wire link 3220. Each of the first-level clock recovery circuits may be coupled to the plurality of comparators and configured to generate pulses responsive to transitions in a multibit difference signal received from one of the plurality of comparators, The second-level clock recovery circuit may be configured to generate a pulse in a global receive clock signal at each boundary between symbols that are consecutively-transmitted over the three-wire communication link in response to a first-occurring pulse generated by the plurality of first-level clock recovery circuits. Here, a symbol represents signaling state of each wire of the 3-wire link 3220. The first plurality of flipflops may be coupled to the plurality of comparators, and each flipflop in the first plurality of flipflops may be coupled to one of the plurality of first-level clock recovery circuits that provides a first-level clock signal used to capture one or more bits of a multibit difference signal that corresponds to the first-level clock signal. The second plurality of flipflops may be coupled to the first plurality of flipflops and configured to output symbol data captured from the first plurality of flipflops in accordance with an edge in the receive clock signal.

In certain examples, each first-level clock recovery circuit generates a first-level clock signal based on transitions in one of multibit difference signals. In one example, each first-level clock recovery circuit includes three flipflops clocked by a multibit difference signal indicating a difference in signaling state of one pair of wires in the three-wire communication link.

In some examples, each first-level clock recovery circuit has a delay circuit configured to reset the each first-level clock recovery circuit using a delayed version of a first-level clock signal generated by the each first-level clock recovery circuit. The delay circuit may be configured with a delay duration that corresponds to the time difference between a first-occurring transition and a last-occurring transition in a corresponding multibit difference signal at a boundary between a pair of consecutively-transmitted symbols.

In some examples, the apparatus 3200 has a plurality of second-level clock recovery circuits, each second-level clock recovery circuit configured to initiate a pulse after detecting a first edge in first-level clock signals generated by one of the plurality of first-level clock recovery circuits at a boundary between a pair of consecutively-transmitted symbols. The second-level clock recovery circuit may generate the pulse in the global receive clock signal responsive to a first-occurring pulses in pulse generated by the plurality of second-level clock recovery circuits. A third plurality of flipflops may be coupled between the first plurality of flipflops and the second plurality of flipflops. Each flipflop in the third plurality of flipflops may be clocked by a second-level clock signal provided by one of the plurality of second-level clock recovery circuits. The second plurality of flipflops may capture a version of the symbol data provided by the third plurality of flipflops. Each second-level clock recovery circuit may include a delay circuit configured to reset the each second-level clock recovery circuit using a delayed version of a second-level clock signal generated by the each first-level clock recovery circuit. The delay circuit may be configured with a delay duration that corresponds to the time difference between a first-occurring transition and a last-occurring transition in a corresponding multibit difference signal at a boundary between a pair of consecutively-transmitted symbols. Each second-level clock recovery circuit may include three flipflops clocked by three first-level clock signals generated by a corresponding one of the plurality of first-level clock recovery circuits.

In some implementations, the processor-readable storage medium 3218 stores instructions and other information related to the method illustrated in FIG. 30. For example, the processor-readable storage medium 3218 may include instructions that cause the processing circuit 3202 to couple each multi-level comparison circuit in a plurality of multi-level comparison circuits to a pair of wires in a three-wire communication link, configure a plurality of first-level flipflops in each of a plurality of first-level clock recovery circuits to be clocked by transitions in a multibit signal received from one multi-level comparison circuit of the plurality of multi-level comparison circuits, configure a first delay circuit in each first-level clock recovery circuit to provide a first reset signal that resets the each first-level clock recovery circuit, configure a second-level flipflop in a second-level clock recovery circuit to be clocked by transitions in outputs of the plurality of first-level clock recovery circuits, and configure a second delay circuit in the second-level clock recovery to delay an output of the second-level clock recovery circuit that provides a second reset signal to the second-level flipflop.

In some examples, a first plurality of multibit registers in a data recovery circuit may be configured to receive an associated multibit signal output by one of the plurality of multi-level comparison circuits. Each multibit register in the first plurality of multibit registers is clocked by an output of a corresponding first-level clock recovery circuit that also receives the associated multibit signal. Each of the plurality of multibit registers may include three flipflops that are clocked by the output of the corresponding first-level clock recovery circuit. A plurality of delay elements in the data recovery circuit may be configured to couple the multibit signals output by the plurality of multi-level comparison circuits to the first plurality of multibit registers. Each of a second plurality of multibit registers in the data recovery circuit may be configured to receive, as an input, an output of one of the first plurality of multibit registers. In some instances, each of the second plurality of multibit registers may be clocked by an output of the second-level clock recovery circuit. In some instances, each multibit register in the first plurality of multibit registers may be clocked by an output of one of the plurality of first-level flipflops in the corresponding first-level clock recovery circuit.

In one example, the first reset signal is coupled to a reset input of each of the plurality of first-level flipflops. In some examples, an output flipflop in each first-level clock recovery circuit may be configured to be clocked by transitions in one or more outputs of the plurality of first-level flipflops in the each first-level clock recovery circuit. The first reset signal may be coupled to a reset input of the output flipflop. Each of the plurality of first-level flipflops in the each first-level clock recovery circuit may be reset by its own output.

In certain examples, the first delay circuit is configured with a delay duration that corresponds to a maximum expected time difference between a first-occurring transition and a last-occurring transition in the multibit signal. The second delay circuit may be configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

In some implementations, the processor-readable storage medium 3218 stores instructions and other information related to the method illustrated in FIG. 31. For example, the processor-readable storage medium 3218 may include instructions that cause the processing circuit 3202 to configure a plurality of comparators to provide multibit difference signals indicating a difference in signaling state of each pair of wires in a three-wire communication link. The plurality of comparators may be coupled to a first plurality of flipflops. The processor-readable storage medium 3218 may include instructions that cause the processing circuit 3202 to configure a plurality of first-level clock recovery circuits to generate pulses responsive to transitions in a multibit difference signal received from the plurality of comparators, configure a second-level clock recovery circuit to generate a pulse in a global receive clock signal at each boundary between symbols that are consecutively-transmitted over the three-wire communication link in response to a first-occurring pulse generated by the plurality of first-level clock recovery circuits, and configure a second plurality of flipflops that is coupled to the first plurality of flipflops to output symbol data captured from the first plurality of flipflops in accordance with an edge in the receive clock signal. Each flipflop in the first plurality of flipflops may be coupled to one of the plurality of first-level clock recovery circuits that provides a first-level clock signal used to capture one or more bits of a multibit difference signal that corresponds to the first-level clock signal. In some examples, a symbol represents signaling state of each wire of the three-wire communication link.

In certain examples, each first-level clock recovery circuit generates a first-level clock signal based on transitions in one of multibit difference signals. In one example, each first-level clock recovery circuit includes three flipflops clocked by a multibit difference signal indicating a difference in signaling state of one pair of wires in the three-wire communication link.

In some examples, each first-level clock recovery circuit includes a delay circuit configured to reset the each first-level clock recovery circuit using a delayed version of a first-level clock signal generated by the each first-level clock recovery circuit. The delay circuit may be configured with a delay duration that corresponds to the time difference between a first-occurring transition and a last-occurring transition in a corresponding multibit difference signal at a boundary between a pair of consecutively-transmitted symbols.

In some examples, the processor-readable storage medium 3218 may include instructions that cause the processing circuit 3202 to configure each of a plurality of second-level clock recovery circuits to initiate a pulse after detecting a first edge in first-level clock signals generated by one of the plurality of first-level clock recovery circuits at a boundary between a pair of consecutively-transmitted symbols. The second-level clock recovery circuit may generate the pulse in the global receive clock signal responsive to a first-occurring pulses in pulse generated by the plurality of second-level clock recovery circuits. The processor-readable storage medium 3218 may include instructions that cause the processing circuit 3202 to configure the second plurality of flipflops to capture a version of the symbol data provided by a third plurality of flipflops. The third plurality of flipflops may be coupled between the first plurality of flipflops and the second plurality of flipflops. Each flipflop in the third plurality of flipflops may be clocked by a second-level clock signal provided by one of the plurality of second-level clock recovery circuits. The processor-readable storage medium 3218 may include instructions that cause the processing circuit 3202 to configure each second-level clock recovery circuit to be reset using a delayed version of a second-level clock signal generated by the each first-level clock recovery circuit. Each second-level clock recovery circuit may include a delay circuit. The delay circuit may be configured with a delay duration that corresponds to the time difference between a first-occurring transition and a last-occurring transition in a corresponding multibit difference signal at a boundary between a pair of consecutively-transmitted symbols. In one example, each second-level clock recovery circuit includes three flipflops clocked by three first-level clock signals generated by a corresponding one of the plurality of first-level clock recovery circuits.

Some implementation examples are described in the following numbered clauses:
1. An apparatus, comprising: a plurality of multi-level comparison circuits, each multi-level comparison circuit being coupled to a pair of wires in a three-wire communication link; a plurality of first-level clock recovery circuits, wherein each first-level clock recovery circuit includes a plurality of first-level flipflops that are clocked by transitions in a multibit signal output by one of the plurality of multi-level comparison circuits, and a first delay circuit that delays an output of the each first-level clock recovery circuit to provide a first reset signal that resets the each first-level clock recovery circuit; and a second-level clock recovery circuit that includes a second-level flipflop clocked by transitions in the outputs of the plurality of first-level clock recovery circuits, and a second delay circuit that delays an output of the second-level clock recovery circuit to provide a second reset signal to the second-level flipflop.

2. The apparatus as described in clause 1, further comprising: a data recovery circuit that comprises a first plurality of multibit registers, wherein each multibit register in the first plurality of multibit registers receives an associated multibit signal output by one of the plurality of multi-level comparison circuits and is clocked by an output of a corresponding first-level clock recovery circuit that also receives the associated multibit signal.

3. The apparatus as described in clause 2, wherein each of the plurality of multibit registers comprises three flipflops that are clocked by the output of the corresponding first-level clock recovery circuit.

4. The apparatus as described in clause 2 or clause 3, wherein the data recovery circuit further comprises: a plurality of first delay elements, each first delay element configured to couple outputs of the first-level clock recovery circuit to the first plurality of multibit registers.

5. The apparatus as described in any of clauses 2-4, wherein the data recovery circuit further comprises: a second plurality of multibit registers, wherein each multibit register in the second plurality of multibit registers receives, as an input, an output of one of the first plurality of multibit registers, and wherein each of the second plurality of multibit registers is clocked by an output of the second-level clock recovery circuit.

6. The apparatus as described in clause 5, further comprising: a second delay element configured to couple the output of the second-level clock recovery circuit to each of the second plurality of multibit registers.

7. The apparatus as described in any of clauses 1-6, wherein the first reset signal is coupled to a reset input of each of the plurality of first-level flipflops.

8. The apparatus as described in any of clauses 1-6, wherein each first-level clock recovery circuit further comprises: an output flipflop that is clocked by transitions in one or more outputs of the plurality of first-level flipflops in the each first-level clock recovery circuit, wherein the first reset signal is coupled to a reset input of the output flipflop, and wherein each of the plurality of first-level flipflops in the each first-level clock recovery circuit is reset by its own output.

9. The apparatus as described in any of clauses 1-8, wherein the first delay circuit is configured with a delay duration that corresponds to a maximum expected time difference between a first-occurring transition and a last-occurring transition in the multibit signal.

10. The apparatus as described in any of clauses 1-9, wherein the second delay circuit is configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

11. An electronic device, comprising: means for comparing signaling state of pairs of wires in a three-wire communication link, including a plurality of multi-level comparison circuits configured to provide multibit signals as outputs; means for recovering a first level clock signal from the three-wire communication link, including a plurality of first-level flipflops, each first-level flipflop being clocked by transitions in a multibit signal received from one multi-level comparison circuit of the plurality of multi-level comparison circuits, and further including a first delay circuit in each of a plurality of first-level clock recovery circuits configured to provide a first reset signal that resets the each first-level clock recovery circuit; and means for recovering a second-level level clock signal including a second-level clock recovery circuit that comprises a second-level flipflop clocked by transitions in outputs provided by the plurality of first-level clock recovery circuits, and that further comprises a second delay circuit configured to delay an output of the second-level clock recovery circuit that is provided as a second reset signal to the second-level flipflop.

12. The electronic device as described in clause 11, further comprising: means for capturing information transmitted over the three-wire communication link, including a data recovery circuit that comprises a first plurality of multibit registers configured to receive an associated multibit signal output by one of the plurality of multi-level comparison circuits, wherein each multibit register in the first plurality of multibit registers is clocked by an output of a corresponding first-level clock recovery circuit that also receives the associated multibit signal.

13. The electronic device as described in clause 12, wherein each of the plurality of multibit registers comprises three flipflops that are clocked by the output of the corresponding first-level clock recovery circuit.

14. The electronic device as described in clause 12 or clause 13, wherein the data recovery circuit further comprises: a plurality of first delay elements, each first delay element configured to couple outputs of the first-level clock recovery circuit to the first plurality of multibit registers.

15. The electronic device as described in any of clauses 12-14, wherein the data recovery circuit further comprises: a second plurality of multibit registers, wherein each multibit register is configured to receive, as an input, an output of one of the first plurality of multibit registers, wherein each of the second plurality of multibit registers is clocked by an output of the second-level clock recovery circuit.

16. The electronic device as described in clause 15, wherein the data recovery circuit further comprises: a second delay element configured to couple the output of the second-level clock recovery circuit to each of the second plurality of multibit registers.

17. The electronic device as described in any of clauses 11-16, wherein the first reset signal is coupled to a reset input of each of the plurality of first-level flipflops.

18. The electronic device as described in any of clauses 11-16, wherein each first-level clock recovery circuit comprises: an output flipflop configured to be clocked by transitions in one or more outputs of the plurality of first-level flipflops in the each first-level clock recovery circuit, wherein the first reset signal is coupled to a reset input of the output flipflop, and wherein each of the plurality of first-level flipflops in the each first-level clock recovery circuit is reset by its own output.

19. The electronic device as described in any of clauses 11-18, wherein the first delay circuit is configured with a delay duration that corresponds to a maximum expected time difference between a first-occurring transition and a last-occurring transition in the multibit signal.

20. The electronic device as described in any of clauses 11-19, wherein the second delay circuit is configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

21. A method for configuring a clock recovery circuit, comprising: coupling each of a plurality of multi-level comparison circuits to a pair of wires in a three-wire communication link; configuring a plurality of first-level flipflops in each of a plurality of first-level clock recovery circuits to be clocked by transitions in a multibit signal received from one of the plurality of multi-level comparison circuits; configuring a first delay circuit in each first-level clock recovery circuit to provide a first reset signal that resets the each first-level clock recovery circuit; configuring a second-level flipflop in a second-level clock recovery circuit to be clocked by transitions in outputs of the plurality of first-level clock recovery circuits; and configuring a second delay circuit in the second-level clock recovery to delay an output of the second-level clock recovery circuit that provides a second reset signal to the second-level flipflop.

22. The method as described in clause 21, further comprising: configuring a first plurality of multibit registers in a data recovery circuit to receive an associated multibit signal output by one of the plurality of multi-level comparison circuits, wherein each multibit register in the first plurality of multibit registers is clocked by an output of a corresponding first-level clock recovery circuit that also receives the associated multibit signal.

23. The method as described in clause 22, wherein each of the plurality of multibit registers comprises three flipflops that are clocked by the output of the corresponding first-level clock recovery circuit.

24. The method as described in clause 22 or clause 23, further comprising: configuring a plurality of delay elements in the data recovery circuit to couple outputs of the first-level clock recovery circuit to the first plurality of multibit registers.

25. The method as described in any of clauses 22-24, further comprising: configuring each of a second plurality of multibit registers in the data recovery circuit to receive, as an input, an output of one of the first plurality of multibit registers, wherein each of the second plurality of multibit registers is clocked by an output of the second-level clock recovery circuit.

26. The method as described in clause 25, further comprising: configuring a second delay element in the data recovery circuit to couple the output of the second-level clock recovery circuit to each of the second plurality of multibit registers.

27. The method as described in any of clauses 21-26, wherein the first reset signal is coupled to a reset input of each of the plurality of first-level flipflops.

28. The method as described in any of clauses 21-26, further comprising: configuring an output flipflop in each first-level clock recovery circuit to be clocked by transitions in one or more outputs of the plurality of first-level flipflops in the each first-level clock recovery circuit, wherein the first reset signal is coupled to a reset input of the output flipflop, and wherein each of the plurality of first-level flipflops in the each first-level clock recovery circuit is reset by its own output.

29. The method as described in any of clauses 21-28, wherein the first delay circuit is configured with a delay duration that corresponds to a maximum expected time difference between a first-occurring transition and a last-occurring transition in the multibit signal.

30. The method as described in any of clauses 21-29, wherein the second delay circuit is configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

31. An apparatus for data communication, comprising: a plurality of comparators configured to provide multibit difference signals indicating a difference in signaling state of each pair of wires in a three-wire communication link; a plurality of first-level clock recovery circuits coupled to the plurality of comparators, each first-level clock recovery circuit configured to generate pulses responsive to transitions in a multibit difference signal received from a corresponding one of the plurality of comparators; a global clock generating circuit configured to generate a pulse in a global receive clock signal at each boundary between symbols that are consecutively-transmitted over the three-wire communication link in response to a first-occurring pulse generated by the plurality of first-level clock recovery circuits, wherein a symbol represents signaling state of each wire of the three-wire communication link; a first plurality of flipflops coupled to the plurality of comparators, each flipflop in the first plurality of flipflops coupled to one of the plurality of first-level clock recovery circuits that provides a first-level clock signal used to capture one or more bits of a multibit difference signal that corresponds to the first-level clock signal; and a second plurality of flipflops coupled to the first plurality of flipflops and configured to output symbol data captured from the first plurality of flipflops in accordance with an edge in the global receive clock signal.

32. The apparatus as described in clause 31, wherein each first-level clock recovery circuit generates a first-level clock signal based on transitions in one of multibit difference signals.

33. The apparatus as described in clause 31 or clause 32, wherein each first-level clock recovery circuit comprises: three flipflops clocked by a multibit difference signal indicating a difference in signaling state of one pair of wires in the three-wire communication link.

34. The apparatus as described in any of clauses 31-33, wherein each first-level clock recovery circuit comprises: a delay circuit configured to reset the each first-level clock recovery circuit using a delayed version of a first-level clock signal generated by the each first-level clock recovery circuit.
35. The apparatus as described in clause 34, wherein the delay circuit is configured with a delay duration that corresponds to a time difference between a first-occurring transition and a last-occurring transition in a corresponding multibit difference signal at a boundary between a pair of consecutively-transmitted symbols.
36. The apparatus as described in any of clauses 31-35, further comprising: a plurality of second-level clock recovery circuits, each second-level clock recovery circuit configured to initiate a pulse after detecting a first edge in first-level clock signals generated by one of the plurality of first-level clock recovery circuits at a boundary between a pair of consecutively-transmitted symbols, wherein the global clock generating circuit generates the pulse in the global receive clock signal responsive to a first-occurring pulses in pulse generated by the plurality of second-level clock recovery circuits.
37. The apparatus as described in clause 36, further comprising: a third plurality of flipflops coupled between the first plurality of flipflops and the second plurality of flipflops, wherein each flipflop in the third plurality of flipflops is clocked by a second-level clock signal provided by one of the plurality of second-level clock recovery circuits, wherein the second plurality of flipflops captures a version of the symbol data provided by the third plurality of flipflops.
38. The apparatus as described in clause 36 or clause 37, wherein each second-level clock recovery circuit comprises: a delay circuit configured to reset the each second-level clock recovery circuit using a delayed version of a second-level clock signal generated by the each first-level clock recovery circuit.
39. The apparatus as described in clause 38, wherein the delay circuit is configured with a delay duration that corresponds to a time difference between a first-occurring transition and a last-occurring transition in a corresponding multibit difference signal at a boundary between a pair of consecutively-transmitted symbols.
40. The apparatus as described in any of clauses 36-39, wherein each second-level clock recovery circuit comprises: three flipflops clocked by three first-level clock signals generated by a corresponding one of the plurality of first-level clock recovery circuits.
41. A data communication apparatus, comprising: means for providing multibit difference signals indicating a difference in signaling state of each pair of wires in a three-wire communication link, wherein the means for providing multibit difference signals comprises a plurality of comparators coupled to a first plurality of flipflops; means for generating pulses in one or more clock signals, including pulses responsive to transitions in a multibit difference signal received from the plurality of comparators, the means for generating pulses comprising a plurality of first-level clock recovery circuits; means for generating a global receive clock signal, wherein a pulse is provided in the global receive clock signal at each boundary between symbols that are consecutively-transmitted over the three-wire communication link in response to a first-occurring pulse generated by the plurality of first-level clock recovery circuits; and means for capturing symbol data from the first plurality of flipflops in accordance with an edge in the global receive clock signal, wherein the means for capturing symbol data comprises a second plurality of flipflops coupled to the first plurality of flipflops, wherein each flipflop in the first plurality of flipflops is coupled to one of the plurality of first-level clock recovery circuits that provides a first-level clock signal used to capture one or more bits of a multibit difference signal that corresponds to the first-level clock signal, and wherein a symbol represents signaling state of each wire of the three-wire communication link.
42. The data communication apparatus as described in clause 41, wherein each first-level clock recovery circuit generates a first-level clock signal based on transitions in one of multibit difference signals.
43. The data communication apparatus as described in clause 41 or clause 42, wherein each first-level clock recovery circuit comprises three flipflops clocked by a multibit difference signal indicating a difference in signaling state of one pair of wires in the three-wire communication link.
44. The data communication apparatus as described in any of clauses 41-43, wherein the means for generating pulses comprises delay circuits, each delay circuit configured to reset one of the first-level clock recovery circuits using a delayed version of a first-level clock signal generated by the one first-level clock recovery circuit.
45. The data communication apparatus as described in clause 44, wherein the delay circuit is configured with a delay duration that corresponds to a time difference between a first-occurring transition and a last-occurring transition in a corresponding multibit difference signal at a boundary between a pair of consecutively-transmitted symbols.
46. The data communication apparatus as described in any of clauses 41-45, wherein the means for generating pulses comprising a plurality of first-level clock recovery circuits comprises: means for generating pulses in second-level clock signals, including pulses generated after a first edge is detected in first-level clock signals generated by one of the plurality of first-level clock recovery circuits at a boundary between a pair of consecutively-transmitted symbols, wherein the means for generating the global receive clock signal is configured to generate the pulse in the global receive clock signal responsive to a first-occurring pulse by a plurality of second-level clock recovery circuits.
47. The data communication apparatus as described in clause 46, wherein the second plurality of flipflops is configured to capture a version of the symbol data provided by a third plurality of flipflops that is coupled between the first plurality of flipflops and the second plurality of flipflops, and wherein each flipflop in the third plurality of flipflops is clocked by a second-level clock signal provided by one of the plurality of second-level clock recovery circuits.
48. The data communication apparatus as described in clause 46 or clause 47, wherein each second-level clock recovery circuit is configured to be reset the using a delayed version of a second-level clock signal generated by a corresponding first-level clock recovery, wherein each second-level clock recovery circuit comprises a delay circuit.
49. The data communication apparatus as described in clause 48, wherein the delay circuit is configured with a delay duration that corresponds to a time difference between a first-occurring transition and a last-occurring transition in a corresponding multibit difference signal at a boundary between a pair of consecutively-transmitted symbols.
50. The data communication apparatus as described in any of clauses 46-49, wherein each second-level clock recovery circuit comprises three flipflops clocked by three first-level clock signals generated by a corresponding one of the plurality of first-level clock recovery circuits.
51. A method for data communication, comprising: configuring a plurality of comparators to provide multibit difference signals indicating a difference in signaling state of each pair of wires in a three-wire communication link, wherein the plurality of comparators is coupled to a first plurality of flipflops; configuring a plurality of first-level clock recovery circuits to generate pulses responsive to transitions in a multibit difference signal received from the plurality of comparators; configuring a global clock generating circuit to generate a pulse in a global receive clock signal at each boundary between symbols that are consecutively-transmitted over the three-wire communication link in response to a first-occurring pulse generated by the plurality of first-level clock recovery circuits, wherein a symbol represents signaling state of each wire of the three-wire communication link; and configuring a second plurality of flipflops that is coupled to the first plurality of flipflops to output symbol data captured from the first plurality of flipflops in accordance with an edge in the global receive clock signal, wherein each flipflop in the first plurality of flipflops is coupled to one of the plurality of first-level clock recovery circuits that provides a first-level clock signal used to capture one or more bits of a multibit difference signal that corresponds to the first-level clock signal.
52. The method as described in clause 51, wherein each first-level clock recovery circuit generates a first-level clock signal based on transitions in one of multibit difference signals.
53. The method as described in clause 51 or clause 52, wherein each first-level clock recovery circuit comprises three flipflops clocked by a multibit difference signal indicating a difference in signaling state of one pair of wires in the three-wire communication link.
54. The method as described in any of clauses 51-53, wherein each first-level clock recovery circuit comprises a delay circuit configured to reset the each first-level clock recovery circuit using a delayed version of a first-level clock signal generated by the each first-level clock recovery circuit.
55. The method as described in clause 54, wherein the delay circuit is configured with a delay duration that corresponds to a time difference between a first-occurring transition and a last-occurring transition in a corresponding multibit difference signal at a boundary between a pair of consecutively-transmitted symbols.
56. The method as described in any of clauses 51-55, further comprising: configuring each of a plurality of second-level clock recovery circuits to initiate a pulse after detecting a first edge in first-level clock signals generated by one of the plurality of first-level clock recovery circuits at a boundary between a pair of consecutively-transmitted symbols, wherein the global clock generating circuit generates the pulse in the global receive clock signal responsive to a first-occurring pulses in pulse generated by the plurality of second-level clock recovery circuits.
57. The method as described in clause 57, further comprising: configuring the second plurality of flipflops to capture a version of the symbol data provided by a third plurality of flipflops, wherein the third plurality of flipflops is coupled between the first plurality of flipflops and the second plurality of flipflops, and wherein each flipflop in the third plurality of flipflops is clocked by a second-level clock signal provided by one of the plurality of second-level clock recovery circuits.
58. The method as described in clause 56 or clause 57, further comprising: configuring each second-level clock recovery circuit to be reset using a delayed version of a second-level clock signal generated by the each first-level clock recovery, wherein each second-level clock recovery circuit comprises a delay circuit.
59. The method as described in clause 58, wherein the delay circuit is configured with a delay duration that corresponds to a time difference between a first-occurring transition and a last-occurring transition in a corresponding multibit difference signal at a boundary between a pair of consecutively-transmitted symbols.
60. The method as described in any of clauses 56-59, wherein each second-level clock recovery circuit comprises three flipflops clocked by three first-level clock signals generated by a corresponding one of the plurality of first-level clock recovery circuits.
61. An apparatus, comprising: a plurality of multi-level comparison circuits, each multi-level comparison circuit being coupled to a pair of wires in a three-wire communication link; a plurality of first-level clock recovery circuits, wherein each first-level clock recovery circuit includes a plurality of first-level flipflops that are clocked by transitions in a multibit difference signal output by one of the plurality of multi-level comparison circuits, and a first delay circuit that delays an output of the each first-level clock recovery circuit to provide a first reset signal that resets the each first-level clock recovery circuit; and a second-level clock recovery circuit that includes a second-level flipflop clocked by transitions in the outputs of the plurality of first-level clock recovery circuits, and a second delay circuit that delays an output of the second-level clock recovery circuit to provide a second reset signal to the second-level flipflop.
62. The apparatus as described in clause 61, further comprising: a data recovery circuit that comprises a first plurality of multibit registers, wherein each multibit register in the first plurality of multibit registers receives an associated multibit difference signal output by one of the plurality of multi-level comparison circuits and is clocked by an output of a corresponding first-level clock recovery circuit that also receives the associated multibit difference signal.
63. The apparatus as described in clause 62, wherein each of the plurality of multibit registers comprises three flipflops that are clocked by the output of the corresponding first-level clock recovery circuit.
64. The apparatus as described in clause 62 or clause 63, wherein the data recovery circuit further comprises: a plurality of first delay elements, each first delay element configured to couple outputs of the first-level clock recovery circuit to the first plurality of multibit registers.
65. The apparatus as described in any of clauses 62-64, wherein the data recovery circuit further comprises: a second plurality of multibit registers, wherein each multibit register in the second plurality of multibit registers receives, as an input, an output of one of the first plurality of multibit registers, and wherein each of the second plurality of multibit registers is clocked by an output of the second-level clock recovery circuit.

66. The apparatus as described in clause 65, further comprising: a second delay element configured to couple the output of the second-level clock recovery circuit to each of the second plurality of multibit registers.

67. The apparatus as described in any of clauses 61-66, wherein the first reset signal is coupled to a reset input of each of the plurality of first-level flipflops.

68. The apparatus as described in any of clauses 61-66, wherein each first-level clock recovery circuit further comprises: an output flipflop that is clocked by transitions in one or more outputs of the plurality of first-level flipflops in the each first-level clock recovery circuit, wherein the first reset signal is coupled to a reset input of the output flipflop, and wherein each of the plurality of first-level flipflops in the each first-level clock recovery circuit is reset by its own output.

69. The apparatus as described in any of clauses 61-68, wherein the first delay circuit is configured with a delay duration that corresponds to a maximum expected time difference between a first-occurring transition and a last-occurring transition in the multibit difference signal.

70. The apparatus as described in any of clauses 61-69, wherein the second delay circuit is configured with a delay duration that corresponds to a maximum expected time difference between a first-occurring transition in a first transitioning multibit difference signal output by the plurality of multi-level comparison circuits and a first-occurring transition in a last transitioning multibit difference signal output by the plurality of multi-level comparison circuits.

71. An electronic device, comprising: means for comparing signaling state of pairs of wires in a three-wire communication link, including a plurality of multi-level comparison circuits configured to provide multibit difference signals as outputs; means for recovering a first level clock signal from the three-wire communication link, including a plurality of first-level flipflops, each first-level flipflop being clocked by transitions in a multibit difference signal received from one multi-level comparison circuit of the plurality of multi-level comparison circuits, and further including a first delay circuit in each of a plurality of first-level clock recovery circuits configured to provide a first reset signal that resets the each first-level clock recovery circuit; and means for recovering a second-level level clock signal including a second-level clock recovery circuit that comprises a second-level flipflop clocked by transitions in outputs provided by the plurality of first-level clock recovery circuits, and that further comprises a second delay circuit configured to delay an output of the second-level clock recovery circuit that is provided as a second reset signal to the second-level flipflop.

72. The electronic device as described in clause 71, further comprising: means for capturing information transmitted over the three-wire communication link, including a data recovery circuit that comprises a first plurality of multibit registers configured to receive an associated multibit difference signal output by one of the plurality of multi-level comparison circuits, wherein each multibit register in the first plurality of multibit registers is clocked by an output of a corresponding first-level clock recovery circuit that also receives the associated multibit difference signal.

73. The electronic device as described in clause 72, wherein each of the plurality of multibit registers comprises three flipflops that are clocked by the output of the corresponding first-level clock recovery circuit.

74. The electronic device as described in clause 72 or clause 73, wherein the data recovery circuit further comprises: a plurality of first delay elements, each first delay element configured to couple outputs of the first-level clock recovery circuit to the first plurality of multibit registers.

75. The electronic device as described in any of clauses 72-74, wherein the data recovery circuit further comprises: a second plurality of multibit registers, wherein each multibit register is configured to receive, as an input, an output of one of the first plurality of multibit registers, wherein each of the second plurality of multibit registers is clocked by an output of the second-level clock recovery circuit.

76. The electronic device as described in clause 75, wherein the data recovery circuit further comprises: a second delay element configured to couple the output of the second-level clock recovery circuit to each of the second plurality of multibit registers.

77. The electronic device as described in any of clauses 71-76, wherein the first reset signal is coupled to a reset input of each of the plurality of first-level flipflops.

78. The electronic device as described in any of clauses 71-76, wherein each first-level clock recovery circuit comprises: an output flipflop configured to be clocked by transitions in one or more outputs of the plurality of first-level flipflops in the each first-level clock recovery circuit, wherein the first reset signal is coupled to a reset input of the output flipflop, and wherein each of the plurality of first-level flipflops in the each first-level clock recovery circuit is reset by its own output.

79. The electronic device as described in any of clauses 71-78, wherein the first delay circuit is configured with a delay duration that corresponds to a maximum expected time difference between a first-occurring transition and a last-occurring transition in the multibit difference signal.

80. The electronic device as described in any of clauses 71-79, wherein the second delay circuit is configured with a delay duration that corresponds to a maximum expected time difference between a first-occurring transition in a first transitioning multibit difference signal output by the plurality of multi-level comparison circuits and a first-occurring transition in a last transitioning multibit difference signal output by the plurality of multi-level comparison circuits.

81. A method for configuring a clock recovery circuit, comprising: coupling each of a plurality of multi-level comparison circuits to a pair of wires in a three-wire communication link; configuring a plurality of first-level flipflops in each of a plurality of first-level clock recovery circuits to be clocked by transitions in a multibit difference signal received from one of the plurality of multi-level comparison circuits; configuring a first delay circuit in each first-level clock recovery circuit to provide a first reset signal that resets the each first-level clock recovery circuit; configuring a second-level flipflop in a second-level clock recovery circuit to be clocked by transitions in outputs of the plurality of first-level clock recovery circuits; and configuring a second delay circuit in the second-level clock recovery to delay an output of the second-level clock recovery circuit that provides a second reset signal to the second-level flipflop.

82. The method as described in clause 81, further comprising: configuring a first plurality of multibit registers in a data recovery circuit to receive an associated multibit difference signal output by one of the plurality of multi-level comparison circuits, wherein each multibit register in the first plurality of multibit registers is clocked by an output of a corresponding first-level clock recovery circuit that also receives the associated multibit difference signal.

83. The method as described in clause 82, wherein each of the plurality of multibit registers comprises three flipflops that are clocked by the output of the corresponding first-level clock recovery circuit.

84. The method as described in clause 82 or clause 83, further comprising: configuring a plurality of delay elements in the data recovery circuit to couple outputs of the first-level clock recovery circuit to the first plurality of multibit registers.

85. The method as described in any of clauses 82-84, further comprising: configuring each of a second plurality of multibit registers in the data recovery circuit to receive, as an input, an output of one of the first plurality of multibit registers, wherein each of the second plurality of multibit registers is clocked by an output of the second-level clock recovery circuit.

86. The method as described in clause 85, further comprising: configuring a second delay element in the data recovery circuit to couple the output of the second-level clock recovery circuit to each of the second plurality of multibit registers.

87. The method as described in any of clauses 81-86, wherein the first reset signal is coupled to a reset input of each of the plurality of first-level flipflops.

88. The method as described in any of clauses 81-86, further comprising: configuring an output flipflop in each first-level clock recovery circuit to be clocked by transitions in one or more outputs of the plurality of first-level flipflops in the each first-level clock recovery circuit, wherein the first reset signal is coupled to a reset input of the output flipflop, and wherein each of the plurality of first-level flipflops in the each first-level clock recovery circuit is reset by its own output.

89. The method as described in any of clauses 81-88, wherein the first delay circuit is configured with a delay duration that corresponds to a maximum expected time difference between a first-occurring transition and a last-occurring transition in the multibit difference signal.

90. The method as described in any of clauses 81-89, wherein the second delay circuit is configured with a delay duration that corresponds to a maximum expected time difference between a first-occurring transition in a first transitioning multibit difference signal output by the plurality of multi-level comparison circuits and a first-occurring transition in a last transitioning multibit difference signal output by the plurality of multi-level comparison circuits.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A clock recovery apparatus, comprising:
    a plurality of multi-level comparison circuits, each multi-level comparison circuit being coupled to a pair of wires in a three-wire communication link;
    a plurality of first-level clock recovery circuits, wherein each first-level clock recovery circuit includes
        a plurality of first-level flipflops that are clocked by transitions in a multibit signal output by one of the plurality of multi-level comparison circuits, and
        a first delay circuit that delays an output of the each first-level clock recovery circuit to provide a first reset signal that resets the each first-level clock recovery circuit; and
    a second-level clock recovery circuit that includes
        a second-level flipflop clocked by transitions in the outputs of the plurality of first-level clock recovery circuits, and
        a second delay circuit that delays an output of the second-level clock recovery circuit to provide a second reset signal to the second-level flipflop.

2. The apparatus of claim 1, further comprising:
    a data recovery circuit that comprises a first plurality of multibit registers, wherein each multibit register in the first plurality of multibit registers receives an associated multibit signal output by one of the plurality of multi-level comparison circuits and is clocked by an output of a corresponding first-level clock recovery circuit that also receives the associated multibit signal.

3. The apparatus of claim 2, wherein each of the plurality of multibit registers comprises three flipflops that are clocked by the output of the corresponding first-level clock recovery circuit.

4. The apparatus of claim 2, wherein the data recovery circuit further comprises:
    a plurality of first delay elements, each first delay element configured to couple outputs of the first-level clock recovery circuit to the first plurality of multibit registers.

5. The apparatus of claim 2, wherein the data recovery circuit further comprises:

a second plurality of multibit registers, wherein each multibit register in the second plurality of multibit registers receives, as an input, an output of one of the first plurality of multibit registers, and wherein each of the second plurality of multibit registers is clocked by an output of the second-level clock recovery circuit.

6. The apparatus of claim 5, further comprising:
a second delay element configured to couple the output of the second-level clock recovery circuit to each of the second plurality of multibit registers.

7. The apparatus of claim 1, wherein the first reset signal is coupled to a reset input of each of the plurality of first-level flipflops.

8. The apparatus of claim 1, wherein each first-level clock recovery circuit further comprises:
an output flipflop that is clocked by transitions in one or more outputs of the plurality of first-level flipflops in the each first-level clock recovery circuit,
wherein the first reset signal is coupled to a reset input of the output flipflop, and
wherein each of the plurality of first-level flipflops in the each first-level clock recovery circuit is reset by its own output.

9. The apparatus of claim 1, wherein the first delay circuit is configured with a delay duration that corresponds to a maximum expected time difference between a first-occurring transition and a last-occurring transition in the multibit signal.

10. The apparatus of claim 1, wherein the second delay circuit is configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

11. An apparatus, comprising:
means for comparing signaling state of pairs of wires in a three-wire communication link, including a plurality of multi-level comparison circuits configured to provide multibit signals as outputs;
means for recovering a first level clock signal from the three-wire communication link, including a plurality of first-level flipflops, each first-level flipflop being clocked by transitions in a multibit signal received from one multi-level comparison circuit of the plurality of multi-level comparison circuits, and further including a first delay circuit in each of a plurality of first-level clock recovery circuits configured to provide a first reset signal that resets the each first-level clock recovery circuit; and
means for recovering a second-level level clock signal including a second-level clock recovery circuit that comprises a second-level flipflop clocked by transitions in outputs provided by the plurality of first-level clock recovery circuits, and that further comprises a second delay circuit configured to delay an output of the second-level clock recovery circuit that is provided as a second reset signal to the second-level flipflop.

12. The apparatus of claim 11, further comprising:
means for capturing information transmitted over the three-wire communication link, including a data recovery circuit that comprises a first plurality of multibit registers configured to receive an associated multibit signal output by one of the plurality of multi-level comparison circuits, wherein each multibit register in the first plurality of multibit registers is clocked by an output of a corresponding first-level clock recovery circuit that also receives the associated multibit signal.

13. The apparatus of claim 12, wherein each of the plurality of multibit registers comprises three flipflops that are clocked by the output of the corresponding first-level clock recovery circuit.

14. The apparatus of claim 12, wherein the data recovery circuit further comprises:
a plurality of first delay elements, each first delay element configured to couple outputs of the first-level clock recovery circuit to the first plurality of multibit registers.

15. The apparatus of claim 12, wherein the data recovery circuit further comprises:
a second plurality of multibit registers, wherein each multibit register is configured to receive, as an input, an output of one of the first plurality of multibit registers, wherein each of the second plurality of multibit registers is clocked by an output of the second-level clock recovery circuit.

16. The apparatus of claim 15, wherein the data recovery circuit further comprises:
a second delay element configured to couple the output of the second-level clock recovery circuit to each of the second plurality of multibit registers.

17. The apparatus of claim 11, wherein the first reset signal is coupled to a reset input of each of the plurality of first-level flipflops.

18. The apparatus of claim 11, wherein each first-level clock recovery circuit comprises:
an output flipflop configured to be clocked by transitions in one or more outputs of the plurality of first-level flipflops in the each first-level clock recovery circuit,
wherein the first reset signal is coupled to a reset input of the output flipflop, and
wherein each of the plurality of first-level flipflops in the each first-level clock recovery circuit is reset by its own output.

19. The apparatus of claim 11, wherein the first delay circuit is configured with a delay duration that corresponds to a maximum expected time difference between a first-occurring transition and a last-occurring transition in the multibit signal.

20. The apparatus of claim 11, wherein the second delay circuit is configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

21. A method for configuring a clock recovery circuit, comprising:
coupling each of a plurality of multi-level comparison circuits to a pair of wires in a three-wire communication link;
configuring a plurality of first-level flipflops in each of a plurality of first-level clock recovery circuits to be clocked by transitions in a multibit signal received from one of the plurality of multi-level comparison circuits;
configuring a first delay circuit in each first-level clock recovery circuit to provide a first reset signal that resets the each first-level clock recovery circuit;
configuring a second-level flipflop in a second-level clock recovery circuit to be clocked by transitions in outputs of the plurality of first-level clock recovery circuits; and configuring a second delay circuit in the second-level clock recovery to delay an output of the second-level clock recovery circuit that provides a second reset signal to the second-level flipflop.

22. The method of claim 21, further comprising:

configuring a first plurality of multibit registers in a data recovery circuit to receive an associated multibit signal output by one of the plurality of multi-level comparison circuits, wherein each multibit register in the first plurality of multibit registers is clocked by an output of a corresponding first-level clock recovery circuit that also receives the associated multibit signal.

23. The method of claim 22, wherein each of the plurality of multibit registers comprises three flipflops that are clocked by the output of the corresponding first-level clock recovery circuit.

24. The method of claim 22, further comprising:

configuring a plurality of delay elements in the data recovery circuit to couple outputs of the first-level clock recovery circuit to the first plurality of multibit registers.

25. The method of claim 22, further comprising:

configuring each of a second plurality of multibit registers in the data recovery circuit to receive, as an input, an output of one of the first plurality of multibit registers, wherein each of the second plurality of multibit registers is clocked by an output of the second-level clock recovery circuit.

26. The method of claim 25, further comprising:

configuring a second delay element in the data recovery circuit to couple the output of the second-level clock recovery circuit to each of the second plurality of multibit registers.

27. The method of claim 21, wherein the first reset signal is coupled to a reset input of each of the plurality of first-level flipflops.

28. The method of claim 21, further comprising:

configuring an output flipflop in each first-level clock recovery circuit to be clocked by transitions in one or more outputs of the plurality of first-level flipflops in the each first-level clock recovery circuit, wherein the first reset signal is coupled to a reset input of the output flipflop, and wherein each of the plurality of first-level flipflops in the each first-level clock recovery circuit is reset by its own output.

29. The method of claim 21, wherein the first delay circuit is configured with a delay duration that corresponds to a maximum expected time difference between a first-occurring transition and a last-occurring transition in the multibit signal.

30. The method of claim 21, wherein the second delay circuit is configured with a delay duration that corresponds to a maximum expected time difference between a first-occurring transition in a first transitioning multibit signal output by the plurality of multi-level comparison circuits and a first-occurring transition in a last transitioning multibit signal output by the plurality of multi-level comparison circuits.

\* \* \* \* \*